US012707747B2

(12) United States Patent
Cheng et al.

(10) Patent No.: US 12,707,747 B2
(45) Date of Patent: Aug. 11, 2026

(54) IMAGE SENSOR WITH EPITAXIAL SEALING LAYER FOR FRONT-SIDE DEEP TRENCH ISOLATION AND MANUFACTURING METHOD THEREOF

(71) Applicant: TAIWAN SEMICONDUCTOR MANUFACTURING COMPANY, LTD., Hsinchu (TW)

(72) Inventors: Yu-Hung Cheng, Tainan City (TW); Szu-Yu Wang, Hsinchu City (TW); Ching I Li, Tainan City (TW); Yong-Sheng Huang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 353 days.

(21) Appl. No.: 18/591,557

(22) Filed: Feb. 29, 2024

(65) Prior Publication Data

US 2025/0280617 A1 Sep. 4, 2025

(51) Int. Cl.
*H10F 39/00* (2025.01)

(52) U.S. Cl.
CPC ......... *H10F 39/807* (2025.01); *H10F 39/014* (2025.01); *H10F 39/8063* (2025.01)

(58) Field of Classification Search
CPC ... H10F 39/807; H10F 39/014; H10F 39/8063
See application file for complete search history.

(56) References Cited

U.S. PATENT DOCUMENTS

2024/0266375 A1* 8/2024 Liu ....................... H10F 39/014

* cited by examiner

*Primary Examiner* — John P. Dulka
(74) *Attorney, Agent, or Firm* — Birch, Stewart, Kolasch & Birch, LLP

(57) ABSTRACT

A method includes forming a doped region in a substrate; forming a doped well vertically extending from a front side of the substrate into the doped region; forming a transfer gate over the front side of the substrate and laterally between a first portion of the doped well and a second portion of the doped well; forming a trench vertically extending form the front side of the substrate through the doped well toward a back side of the substrate; depositing an dielectric material over the front side of the substrate and in the trench; recessing the dielectric material; performing a selective epitaxial growth process to form a sealing layer in the trench and over the recessed dielectric material from the front side of the substrate; forming an electrode in the trench and over the sealing layer from the front side of the substrate.

20 Claims, 40 Drawing Sheets

100

100

IMAGE SENSOR WITH EPITAXIAL SEALING LAYER FOR FRONT-SIDE DEEP TRENCH ISOLATION AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-10A, 11A, 12A, 13-15A, 16-25A, and 26-28A illustrate the cross-sectional views of intermediate stages in the formation of an image sensor in accordance with some embodiments.

DETAILED DESCRIPTION

Figure 1A:
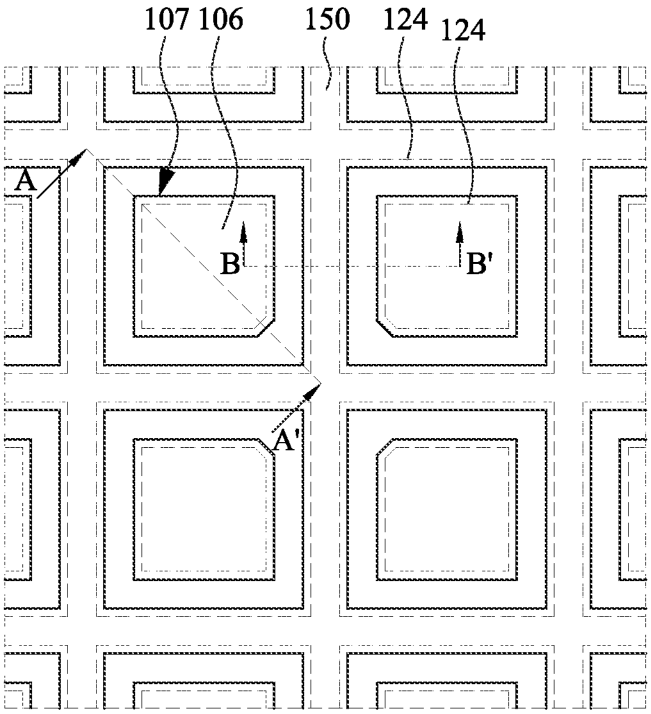
FIG. 1A illustrates a top schematic view of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The evolution of CMOS Image Sensors (CIS) has led to the advent of the small-pixel floating diffusion trench isolation (FDTI)-CIS. One of the objectives in the development of small-pixel FDTI-CIS is achieving pixel shrinkage while maintaining high image quality and sensor performance, and thus the floating diffusion (FD) region can be positioned at the crossroads of the pixel architecture. Polysilicon (poly-Si) has been employed as the sealing layer in FDTI-CIS configuration. However, this approach has shown limitations in the small-pixel FDTI-CIS (e.g., the infiltration of poly-Si into the seams of the FDTI's oxide layer), which in turn adversely affects the image sensor's performance, leading to potential defects and inconsistency in the sensor output.

Therefore, the present disclosure in various embodiments provides a FDTI-CIS using selective silicon epitaxial growth (SEG) for the sealing layer to prevent polysilicon deposition in the oxide seam of FDTI structure. The SEG can be utilized for control of the sealing layer's profile over the FDTI structure, ensuring accurate layer formation. The sealing layer can be in a crystalline state to have a higher etching resistance to prevent the etchant from damaging the dielectric layer over the sealing layer. In addition, before forming the sealing layer over the oxide of the FDTI structure, a dry etch process (e.g., capacitively coupled plasma) can create a thin oxide layer on the FDTI sidewall. Subsequently, a pre-clean process (e.g., SiCoNi) followed by cyclic deposition and annealing can be incorporated to scale down the thin oxide layer. Therefore, the sealing layer can form a flat Si-EPI merged-plane over the thin oxide layer, which in turn allowing for yielding a high-quality sealing layer, and thus the performance of the image sensor can be enhanced.

Figure 1B:
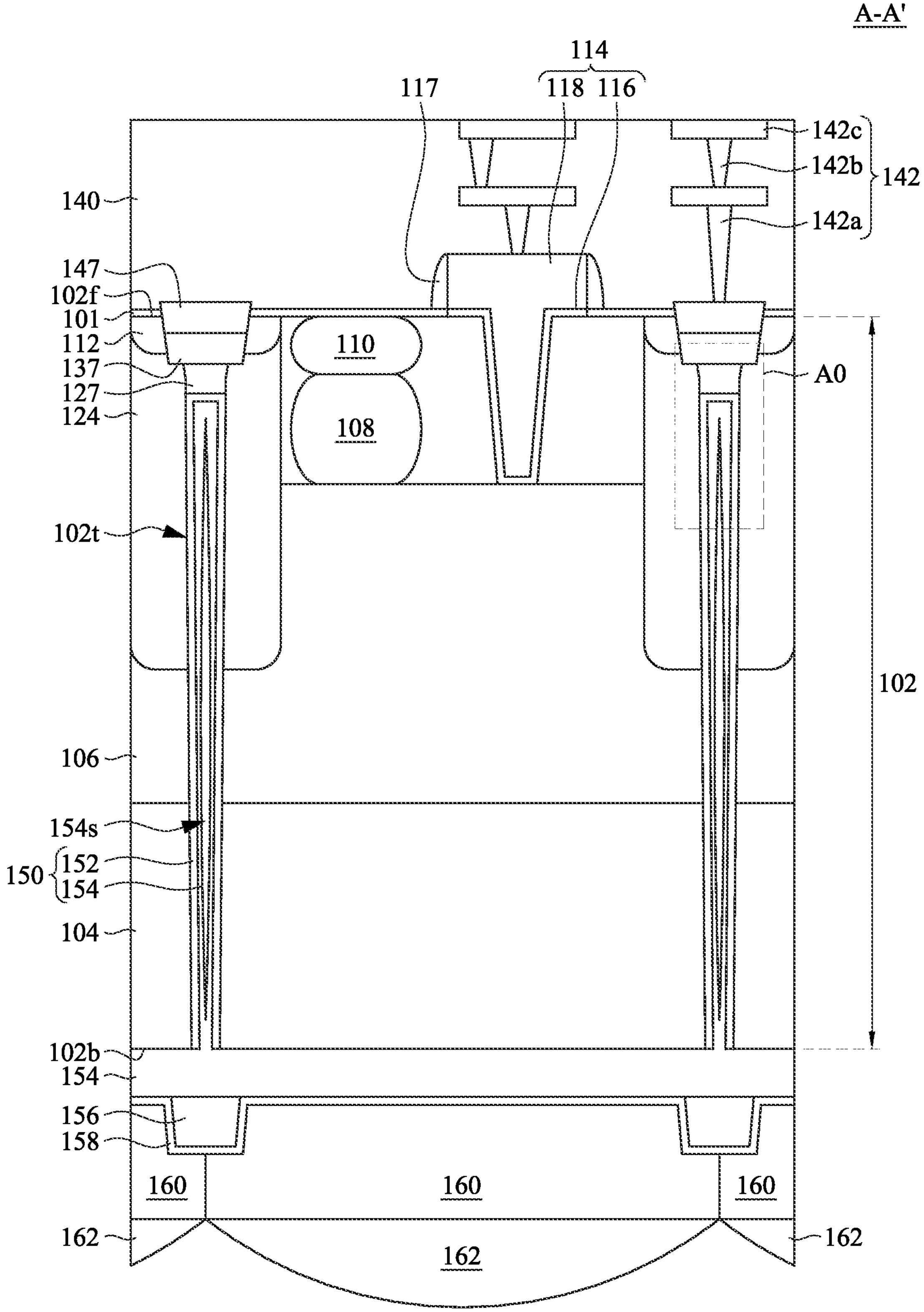
FIG. 1B illustrates a cross-sectional view taken along line A-A' as shown in FIG. 1A.
Figure 1C:
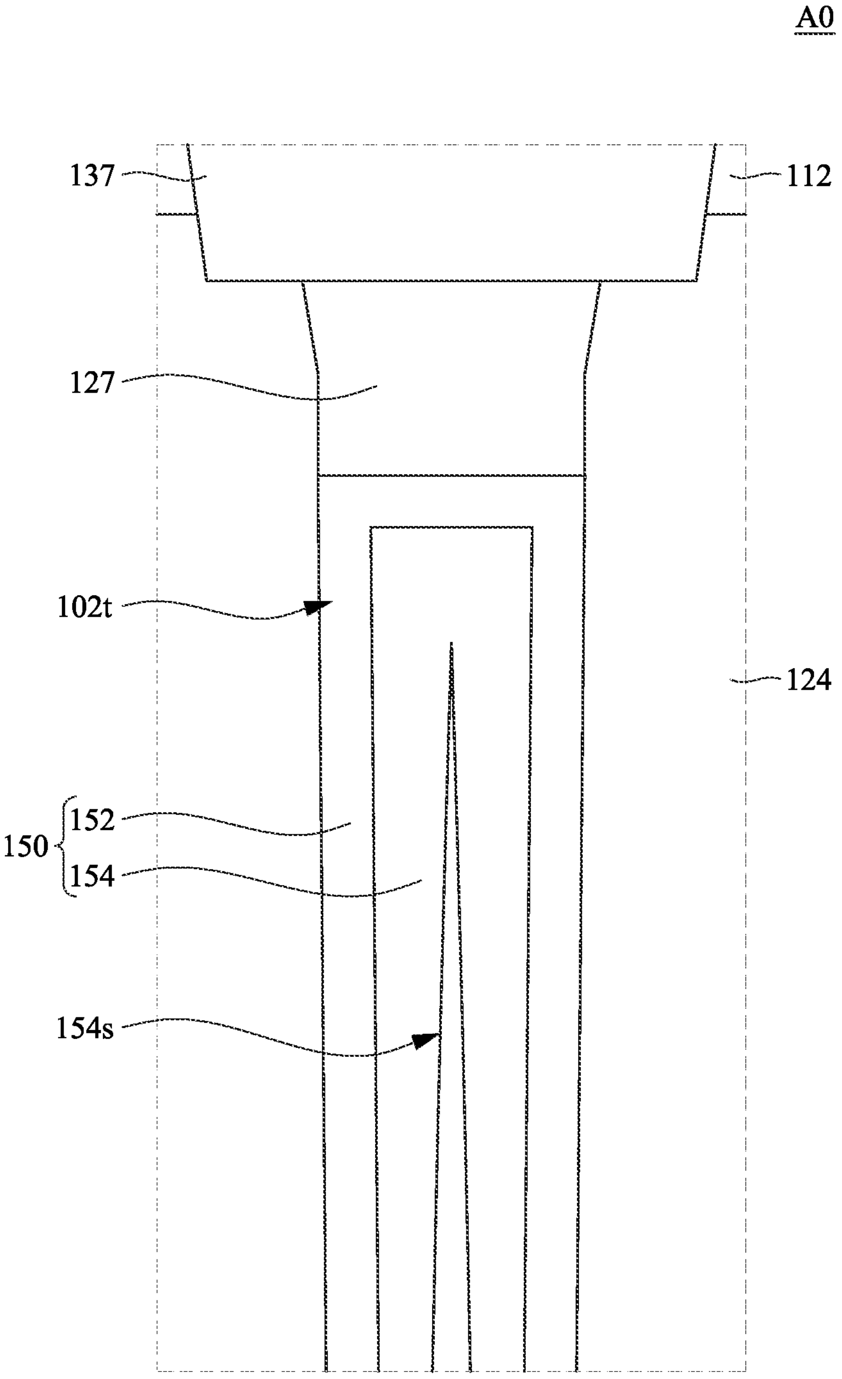
FIG. 1C is a local enlarged view of a region A0 in FIG. 1B.

Reference is made to FIGS. 1A-1C. FIG. 1A illustrates a top schematic view of an image sensor in accordance with some embodiments of the present disclosure. FIG. 1B illustrates a cross-sectional view taken along line A-A' as shown in FIG. 1A. FIG. 1C is a local enlarged view of a region A0 in FIG. 1B.

The image sensor 100 can include a substrate 102. The substrate 102 has a front side 102*f* and a back side 102*b* opposite the front-side 102*f*. In some embodiments, the front side 102*f* of the substrate 102 is defined by a first surface (e.g., a front-side surface), and the back side 102*b* of the substrate 102 is defined by a second surface (e.g., a back-side surface) that is opposite the first surface. The substrate 102 comprises a pixel region 103. The pixel region 103 is a portion of the substrate 102 in which features (e.g., structural features that are described in more detail below) of an individual pixel (e.g., pixel sensor) of the image sensor are disposed. In some embodiments, the substrate 102 can include a plurality of pixel regions 103 that are disposed in an array, and the pixel region 103 is an individual pixel region of the plurality of pixel regions 103. The substrate 102 may have a first doping type (e.g., p-type/n-type), or may be intrinsic. A pad layer 101 can be formed over the substrate 102. By way of example and not limitation, forming of the pad layer 101 can be performed prior to forming the first and second doped regions 104 and 106. In some embodiments, the pad layer 101 can be an oxide layer, such as silicon oxide ($SiO_2$).

A first doped region 104 is formed in the substrate 102. The first doped region 104 is also disposed in the pixel region 103. The first doped region 104 is a region of the substrate 102 having a second doping type (e.g., n-type/p-type). The second doping type is opposite the first doping type (e.g., the second doping type is n-type and the first doping type is p-type, or vice versa). In some embodiments, the first doped region 104 is implanted with second doping type dopants (e.g., n-type dopants (such as phosphorus (P), arsenic (As), antimony (Sb), etc.) or p-type dopants (such as boron (B), aluminum (Al), gallium (Ga), etc.)).

A second doped region 106 is formed in a substrate 102. The second doped region 106 is formed over the first doped region 104. The second doped region 106 is also formed in the plurality of pixel regions 103. The second doped region 106 is a region of the substrate 102 having the second doping type. In some embodiments, the first doped region 104 has a greater concentration of the second doping type dopants than the second doped region 106. In some embodiments, the first doped region 104 has a lower concentration of the second doping type dopants than the second doped region 106.

A doped well 124 is formed in the substrate 102. The doped well 124 can be a portion of the substrate 102 having the first doping type (e.g., p-type dopants). The doped well 124 can be formed extending vertically into the substrate 102. The doped well 124 can be formed extending vertically into the second doped region 106. The doped well 124 can be formed extending laterally through the substrate 102, such that the doped well laterally surrounds the plurality of pixel regions 103. In some embodiments, the doped well 124 can be formed extending partially through the substrate 102. In some embodiments, the doped well 124 can be formed extending vertically into the second doped region 106 from the front side 102*f* of the substrate 102 and formed vertically spaced from the back side 102*b* of the substrate 102.

A third doped region 108 can be formed in the pixel region 103. The third doped regions 108 can be formed over the second doped region 106. The third doped region 108 can be the region of the substrate 102 having the second doping type. In some embodiments, the third doped regions may have a greater concentration of the second doping type dopants than the second doped region 106. In some embodiments, the third doped region 108 can have a lower concentration of the second doping type dopants than the second doped region 106. A fourth doped regions 110 can be formed in the pixel region 103. The fourth doped region 110 can be formed over the third doped region 108. The fourth doped region 110 can be the region of the substrate 102 having the first doping type.

Nodes 112 can be formed in the doped well 124. The nodes 112 can be a part of the pixel architecture in the image sensor 100. The node 112 having the second doping type can act as a charge-to-voltage conversion site, where the electrons generated by the photodiode are transferred and converted into a voltage signal. The nodes 112 may also be disposed, at least partially, in the pixel region 103. The nodes 112 may be laterally spaced from the third doped region 108 and/or the fourth doped region 110. The node 112 having the second doping type can be referred to as a common floating diffusion node, and the other node 112 at a side of the transfer gate 114 opposite to the node 112 having the first doping type can be referred to as a grounding node. In some embodiments, the node 112 can has a greater concentration of the first/second doping type dopants than the first doped region 104, the second doped region 106, and/or the third doped region 108. In some embodiments, the node 112 having the second doping type may be a common floating diffusion node that is shared by two or more pixel sensor unit.

A transfer gate 114 is over/on the front side 102*f* of the substrate 102. In some embodiments, the transfer gate 104 can be formed between two portions of the doped well 124. The transfer gate 114 can include a gate dielectric structure 116 and a gate electrode structure 118. In some embodiments, the gate dielectric structure 116 can be made of, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. The gate electrode structure 118 can be made of, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

A semiconductor layer 147 is formed in the node 112 and near to the front side 102*f* of the substrate 102. The semiconductor layer 147 can serve as an electrode of the node 112. The semiconductor layer 147 can be made of polycrystalline silicon and have ability to conformally coat irregular surfaces (e.g., the inside of the trench 102*t*), and its electrical properties, which can be suitable for sensor applications. In some embodiments, the semiconductor layer 147 can have a top surface higher than the front-side surface of the pad layer 101 and the front-side surface of the substrate 102. The sealing layer 127 can have a footprint that is disposed within a footprint of a dielectric layer 137 and/or a footprint of the semiconductor layer 147.

The sealing layer 127 is formed in the substrate 102 and between the semiconductor layer 147 and the deep trench isolation structure 150. The sealing layer 127 can be used as an etch stop layer when etching the dielectric structure 125 (see FIG. 23) from the back side 102*b* of the substrate 102 to prevent the etchant from damaging the dielectric layer 137 (see FIG. 23). In some embodiments, the sealing layer 127 is to be crystallized (e.g., by using a thermal crystallization process), and thus the sealing layer 127 can be in a crystalline state to have a higher etching resistance. By way of example and not limitation, the sealing layer 127 can be made of monocrystalline silicon, which is a single, continuous crystal lattice. As shown in FIGS. 1C, the sealing layer 127 can have a flat bottom surface 127*b*. The flat bottom surface 127 of the sealing layer 127 can enhance its ability to act as an effective barrier against etchants during the etching of the dielectric structure 125 (see FIG. 23) from the back side 102*b* of the substrate 102. In some embodiments, the sealing layer 127 may have a top surface level with a front-side surface of the pad layer 101 or a front-side surface of the substrate 102. In some embodiments, the sealing layer 127 may be a grid structure.

A dielectric layer 137 is sandwiched between the sealing layer 127 and the semiconductor layer 147. The dielectric layer 137 can acts as an insulator, preventing electrical crosstalk and leakage between the semiconductor layer 147 and the sealing layer 127. The dielectric layer 137 can have a top surface lower than the front-side surface of the substrate 102. In some embodiments, the dielectric layer 137 can have a top surface in a position between a lower boundary of the node 112 and an upper boundary of the node 112. In some embodiments, the dielectric layer 137 can have a level back-side surface conformal to the front-side surface of the sealing layer 127. In some embodiments, the dielectric layer 137 can have a level top surface in parallel with the level bottom surface thereof. By way of example and not limitation, the dielectric layer 137 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like. In some embodiments, the dielectric layer 137 may be a grid structure.

An ILD structure 140 is formed over the front side 102*f* of the substrate 102 and over the transfer gate 114. An interconnect structure 142 is formed in the ILD structure 140 and over the front side 102*f* of the substrate 102. In some embodiments, the interconnect structure 142 can include a plurality of conductive contacts 142*a*, a plurality of conductive vias 142*b*, and a plurality of conductive wires 142*c*.

A deep trench isolation (DTI) structure 150 is in the substrate 102 and can be used to provide electrical insulation and/or structural integrity to the image senor 100. The deep trench isolation structure 150 can be a grid structure when viewed from the top and include the dielectric filler 154 and the dielectric liner 152 wrapping around the dielectric filler 154. In the cross-sectional view, the deep trench isolation structure 150 can be characterized by the positioning of the node 112/doped well 124 directly above the deep trench isolation structure 150. The deep trench isolation structure 150 can be a deeply etched trench structure in the substrate 102 to isolate the components of the sensor from each other, thereby reducing electronic noise and crosstalk between pixels. When viewed from the top, the deep trench isolation structure 150 can reveal that the node 112 is located at the intersection (or cross-road) of the isolation grid 156.

The deep trench isolation structure 150 can vertical sidewalls, which indicate the sidewalls of the deep trench isolation structure 150 formed in the substrate 102 can be perpendicular to the front-side surface of the substrate 102 and/or the back-side surface of the substrate 102. This vertical alignment can be sued to create well-defined, isolated regions for each pixel in the sensor array. The deep trench isolation structure 150 can have a flat front-side surface perpendicular to the sidewalls thereof, and thus the deep trench isolation structure 150 can have a square front-side profile. This square profile is in direct contact with the sealing layer 127. In some embodiments, the sidewall of the deep trench isolation structure 150 is coterminous to the sidewall of the sealing layer 127.

In some embodiments, the deep trench isolation structure 150 can be interchangeably referred to a floating diffusion trench isolation (FDTI), and thus the image sensor 100 can be interchangeably referred to a FDTI-CMOS image sensor (FDTI-CIS). The deep trench isolation structure 150 is formed with a footprint that is disposed within the footprint of the doped well 124, which in turn reduces the size of the pixel region 103. As shown in FIGS. 25B and 25C, the sealing layer 127 is positioned between the node 112 and the deep trench isolation structure 150.

An isolation grid 156 is formed over the back-side 102*b* of the substrate 102. In further embodiments, the isolation grid 156 can be formed overlying the deep trench isolation structure 150. The isolation grid 156 may be or include, for example, a metal (e.g., tungsten (W), aluminum (Al), cobalt (Co), copper (Cu), silver (Ag), gold (Au), some other metal, or a combination of the foregoing), an oxide (e.g., $SiO_2$), a nitride (e.g., SiN), a carbide (e.g., SiC), a high-k dielectric material (e.g., HfO, TaO, etc.), a low-k dielectric material, some other isolation material, or a combination of the foregoing. A dielectric layer 158 is formed over the over the back-side surface of the dielectric filler 154 and over the isolation grid 156. In other embodiments, the dielectric layer 158 may be formed along the back side 102*b* of the substrate 102 and over the isolation grid 156.

A plurality of electromagnetic radiation (EMR) filters 160 are formed on/over the dielectric layer 158 and within the isolation grid 156. In some embodiments, the EMR filters 160 may include one or more light filtering materials that allow for the transmission of radiation (e.g., light) having a specific wavelength range, while blocking light of wavelengths outside of the specified range. A plurality of micro-lenses 162 are formed on/over the plurality of EMR filters 160. The micro-lenses 162 may include a micro-lens material. The micro-lens 162 can have a curved upper surface. In some embodiments, the micro-lens 162 may comprise a photoresist material exposed using a distributing exposing light dose (e.g., for a negative photoresist more light is exposed at a bottom of the curvature and less light is exposed at a top of the curvature), developed, and baked to form a rounding shape. In some embodiments, after the plurality of micro-lenses 162 are formed, formation of a plurality of pixel sensor units 107 (see FIG. 1D) is complete. In further embodiments, after the plurality of micro-lenses 162 are formed, formation of the image sensor 100 can be complete. In some embodiments, the image sensor 100 can be interchangeably referred to as a back-side illumination configuration.

Figure 1D:
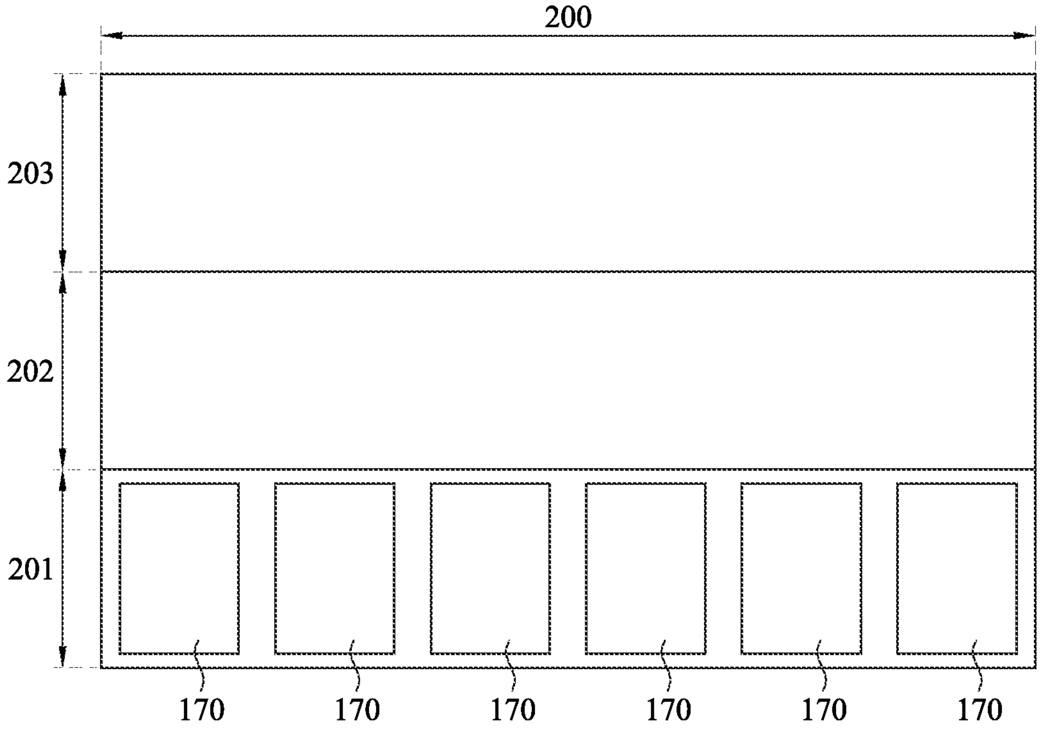
FIG. 1D illustrates a block diagram of an integrated chip (IC) including the image sensor of FIGS. 1A-1C in accordance with some embodiments of the present disclosure.

Reference is made to FIG. 1D. FIG. 1D illustrates a block diagram of an integrated chip (IC) 200 including the image sensor 100 of FIGS. 1A-1C in accordance with some embodiments of the present disclosure. The IC 200 can include a first chip 201, a second chip 202, and a third chip 203. In some embodiments, the first chip 201 comprises the image sensor of the present disclosure. For example, in some embodiments, the first chip 201 can include the plurality of pixel sensor units 170. The first chip 201, the second chip 202, and the third chip 203 can be bonded together (e.g., via one or more bonding structures). The first chip 201, the second chip 202, and the third chip 203 can be vertically stacked and electrically coupled together (e.g., via one or more conductive pads). In such embodiments, the image sensor 100 may be referred to as a three chip image sensor (e.g., 3-chip CIS). While the block diagram of FIG. 1D illustrates the IC 200 comprising three chips that are bonded together, it will be appreciated that the IC 200 may comprise any number of chips bonded together (e.g., 2 chips, 3 chips, 4 chips, 5 chips, etc.). It will also be appreciated that, in some embodiments, the IC 200 may only include the first chip 201 (e.g., 1-chip CIS).

Reference is made to FIGS. 2-28B. FIGS. 2-10A, 11A, 12A, 13-15A, 16-25A, and 26-28A illustrate the cross-sectional views of intermediate stages in the formation of an image sensor 100 in accordance with some embodiments. FIGS. 10B, 11B, 12B, 15B, and 25B are local enlarged views of regions A1, A2, A3, A4, A5, and A6 in FIGS. 10A, 11A, 12A, 15A, 25A, and 28A, respectively. It is understood that additional operations can be provided before, during, and after the processes shown by FIGS. 2-28B, and some of the operations described below can be replaced or eliminated, for additional embodiments of the method. The order of the operations/processes may be interchangeable.

Figure 2:
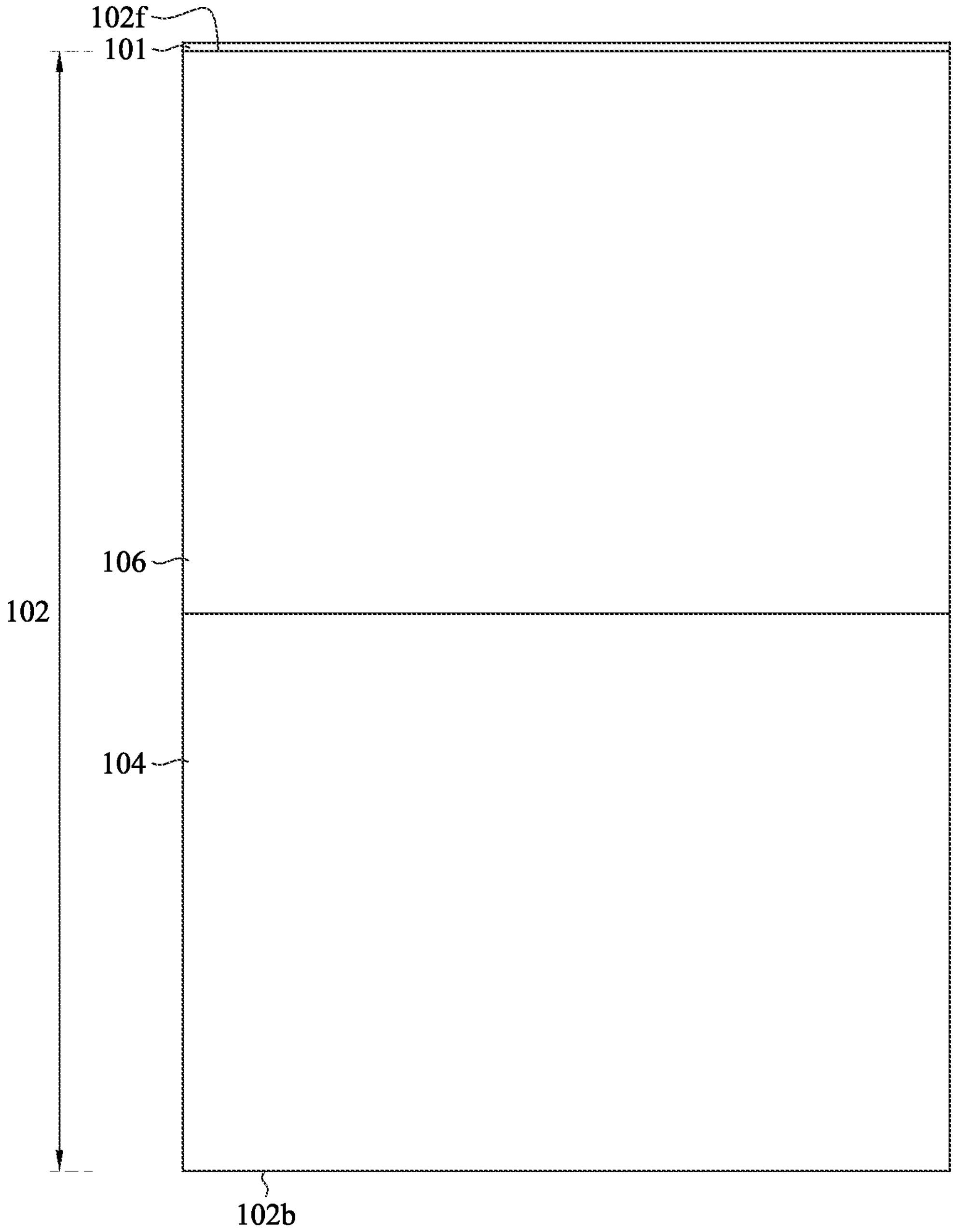

Reference is made to FIG. 2. The image sensor 100 can include a substrate 102. The substrate 102 has a front side **102*f* and a back side 102*b* opposite the front-side 102*f*. In some embodiments, the front side 102*f* of the substrate 102 is defined by a first surface (e.g., a front-side surface), and the back side 102*b* of the substrate 102 is defined by a second surface (e.g., a back-side surface) that is opposite the first surface. The substrate 102 comprises a pixel region 103. The pixel region 103 is a portion of the substrate 102 in which features (e.g., structural features that are described in more detail below) of an individual pixel (e.g., pixel sensor) of the image sensor are disposed. In some embodiments, the substrate 102 can include a plurality of pixel regions 103 that are disposed in an array, and the pixel region 103 is an individual pixel region of the plurality of pixel regions 103**.

The substrate 102 may include any type of semiconductor body (e.g., monocrystalline silicon/complementary metal-oxide-semiconductor (CMOS) bulk, germanium (Ge), a group III-V semiconductor material, silicon-germanium (SiGe), silicon on insulator (SOI), etc.). In some embodiments, the image sensor (e.g., back-side illumination image sensor) 100 can be configured to record incident radiation (e.g., photons) that passes through the back side **102*b* of the substrate 102. In some embodiments, the image sensor (e.g., front-side illumination image sensor) is configured to record incident radiation (e.g., photons) that passes through the front side 102*f* of the substrate 102. The substrate 102 may have a first doping type (e.g., p-type/n-type), or may be intrinsic. A pad layer 101 can be formed over the substrate 102. By way of example and not limitation, forming of the pad layer 101 can be performed prior to forming the first and second doped regions 104 and 106. In some embodiments, the pad layer 101** can be an oxide layer, such as silicon oxide ($SiO_2$).

A first doped region 104 is formed in the substrate 102. The first doped region 104 is also disposed in the pixel region 103. The first doped region 104 is a region of the substrate 102 having a second doping type (e.g., n-type/p-type). The second doping type is opposite the first doping type (e.g., the second doping type is n-type and the first doping type is p-type, or vice versa). In some embodiments, the first doped region 104 is formed via a blanket doping process that implants second doping type dopants (e.g., n-type dopants (such as phosphorus (P), arsenic (As), antimony (Sb), etc.) or p-type dopants (such as boron (B), aluminum (Al), gallium (Ga), etc.)) into the substrate 102. The blanket doping process does not utilize a masking layer (e.g., positive/negative photoresists, hardmask, etc.) to implant the second doping type dopants into the plurality of pixel regions 103 of the substrate 102. In some embodiments, the blanket doping process can be or include, for example, a blanket ion implantation process, a blanket diffusion process, some other blanket doping process, or a combination of the foregoing. It will be appreciated that a blanket doping process is different than a doping process that utilizes a masking layer to selectively implant the second doping type dopants into the plurality of pixel regions 103 of the substrate 102. It will also be appreciated that, in other embodiments, the first doped region 104 may be formed by a doping process that utilizes a masking layer to selectively implant the second doping type dopants into the plurality of pixel regions 103 of the substrate 102.

A second doped region 106 is formed in a substrate 102. The second doped region 106 is formed over the first doped region 104. The second doped region 106 is also formed in the plurality of pixel regions 103. The second doped region 106 is a region of the substrate 102 having the second doping type. In some embodiments, the first doped region 104 has a greater concentration of the second doping type dopants than the second doped region 106. In some embodiments, the first doped region 104 has a lower concentration of the second doping type dopants than the second doped region 106. In some embodiments, the second doped region 106 is formed via a blanket doping process that implants second doping type dopants into the substrate 102. The blanket doping process does not utilize a masking layer (e.g., positive/negative photoresists, hardmask, etc.) to implant the second doping type dopant into the plurality of pixel regions 103 of the substrate 102. In some embodiments, the blanket doping process can be or include, for example, a blanket ion implantation process, a blanket diffusion process, some other blanket doping process, or a combination of the foregoing. It will be appreciated that a blanket doping process is different than a doping process that utilizes a masking layer to selectively implant the second doping type dopants into the plurality of pixel regions 103 of the substrate 102. It will also be appreciated that, in other embodiments, the second doped region 106 may be formed by a doping process that utilizes a masking layer to selectively implant the second doping type dopants into the plurality of pixel regions 103 of the substrate 102.

Figure 3:
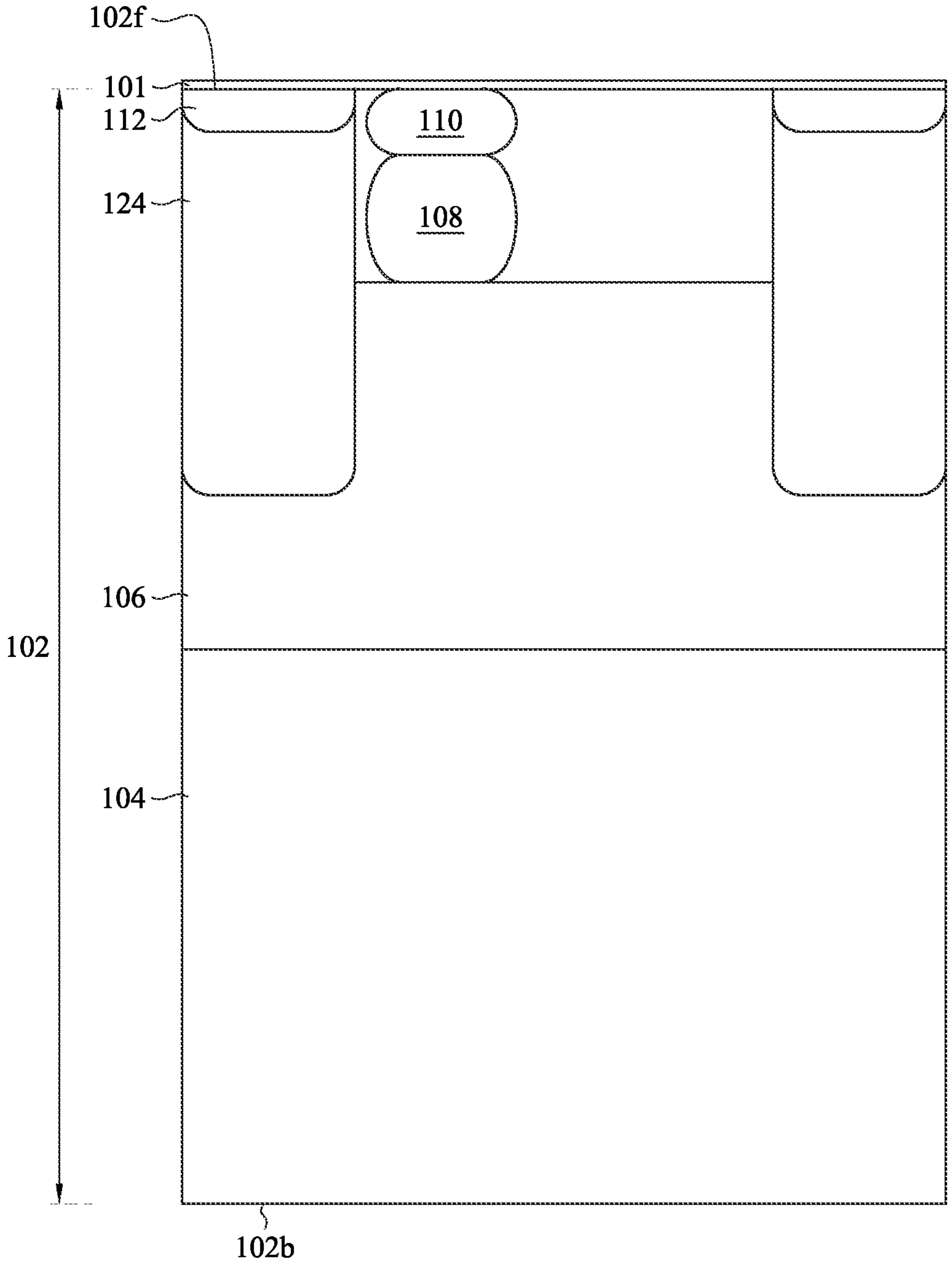

Reference is made to FIG. 3. A doped well 124 is formed in the substrate 102. The doped well 124 can be a portion of the substrate 102 having the first doping type. The doped well 124 can be formed extending vertically into the substrate 102. The doped well 124 can be formed extending vertically into the second doped region 106. The doped well 124 can be formed extending laterally through the substrate 102, such that the doped well laterally surrounds the plurality of pixel regions 103. In some embodiments, the doped well 124 can be formed extending partially through the substrate 102. In some embodiments, the doped well 124 can be formed extending vertically into the second doped region 106 from the front side 102*f* of the substrate 102 and formed vertically spaced from the back side 102*b* of the substrate 102.

In some embodiments, the doped well 124 may be formed by a doping process (e.g., via ion implantation, diffusion, etc.) that utilizes a patterned masking layer (not shown) (e.g., positive/negative photoresist, a hardmask, etc.) on the front side 102*f* of the substrate 102 to selectively implant first doping type dopants (e.g., p-type dopants) into the substrate 102. In some embodiments, a process for forming the patterned masking layer can include depositing a masking layer (not shown) on the front side 102*f* of the substrate 102. The masking layer may be deposited by, for example, chemical vapor deposition (CVD), physical vapor deposition (PVD), atomic layer deposition (ALD), a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer over the front side 102*f* of the substrate 102. With the patterned masking layer in place over the front side 102*f* of the substrate 102, the doping process is performed on the substrate 102, thereby forming the doped well 124.

In some embodiments, the doping process may be, for example, an ion implantation process, a diffusion process, some other doping process, or a combination of the foregoing. Subsequently, in some embodiments, the patterned masking layer 1402 is stripped away. Because the second doped region 106 can be formed via a blanket doping process, rather than a doping process that utilized a lithography process, the doped well 124 may be formed in contact with the second doped region 106.

A third doped region 108 can be formed in the pixel region 103. The third doped regions 108 can be formed over the second doped region 106. The third doped region 108 can be the region of the substrate 102 having the second doping type. In some embodiments, the third doped regions may have a greater concentration of the second doping type dopants than the second doped region 106. In some embodiments, the third doped region 108 can have a lower concentration of the second doping type dopants than the second doped region 106. In some embodiments, a process for forming the plurality of third doped region 108 can include forming a patterned masking layer (not shown) (e.g., negative/positive photoresist, a hardmask, etc.) over the front side 102*f* of the substrate 102. Thereafter, with the patterned masking layer in place, a doping process (e.g., an ion implantation process, a diffusion process, etc.) is performed on the substrate to selectively implant second doping type dopants into the substrate 102 according to the patterned masking layer, thereby forming the plurality of third doped regions. Subsequently, in some embodiments, the patterned masking layer is stripped away.

A fourth doped regions 110 can be formed in the pixel region 103. The fourth doped region 110 can be formed over the third doped region 108. The fourth doped region 110 can be the region of the substrate 102 having the first doping type. In some embodiments, the plurality of fourth doped regions may be formed by a doping process (e.g., via (angled) ion implantation, diffusion, etc.) that utilizes a patterned masking layer (not shown) (e.g., positive/negative photoresist, a hardmask, etc.) over the front side 102*f* of the substrate 102 (and over the plurality of transfer gates) to selectively implant first doping type dopants into the substrate 102.

Nodes 112 can be formed in the doped well 124. The nodes 112 can be a part of the pixel architecture in the image sensor 100. The node 112 having the second doping type can act as a charge-to-voltage conversion site, where the electrons generated by the photodiode are transferred and converted into a voltage signal. The node 112 may also be disposed, at least partially, in the pixel region 103. The node 112 may be laterally spaced from the third doped region 108 and/or the fourth doped region 110. The node 112 having the second doping type can be referred to as a floating diffusion node, and the other node 112 at a side of the transfer gate 114 opposite to the node 112 having the first doping type can be referred to as a grounding node. In some embodiments, the node 112 has a greater concentration of the first/second doping type dopants than the first doped region 104, the second doped region 106, and/or the third doped region 108. In some embodiments, the node 112 having the second doping type may be a common floating diffusion node that is shared by two or more pixel sensor unit. In some embodiments, the node 112 may be formed by a doping process (e.g., via ion implantation, diffusion, etc.) that utilizes a patterned masking layer (not shown) (e.g., positive/negative photoresist, a hardmask, etc.) over the front side 102*f* of the substrate 102 (and over the plurality of transfer gates) to selectively implant second doping type dopants into the substrate 102. In some embodiments, the plurality of transfer gates are utilized, at least partially, as the patterned masking layer. Subsequently, in some embodiments, the patterned masking layer is stripped away.

Figure 4:
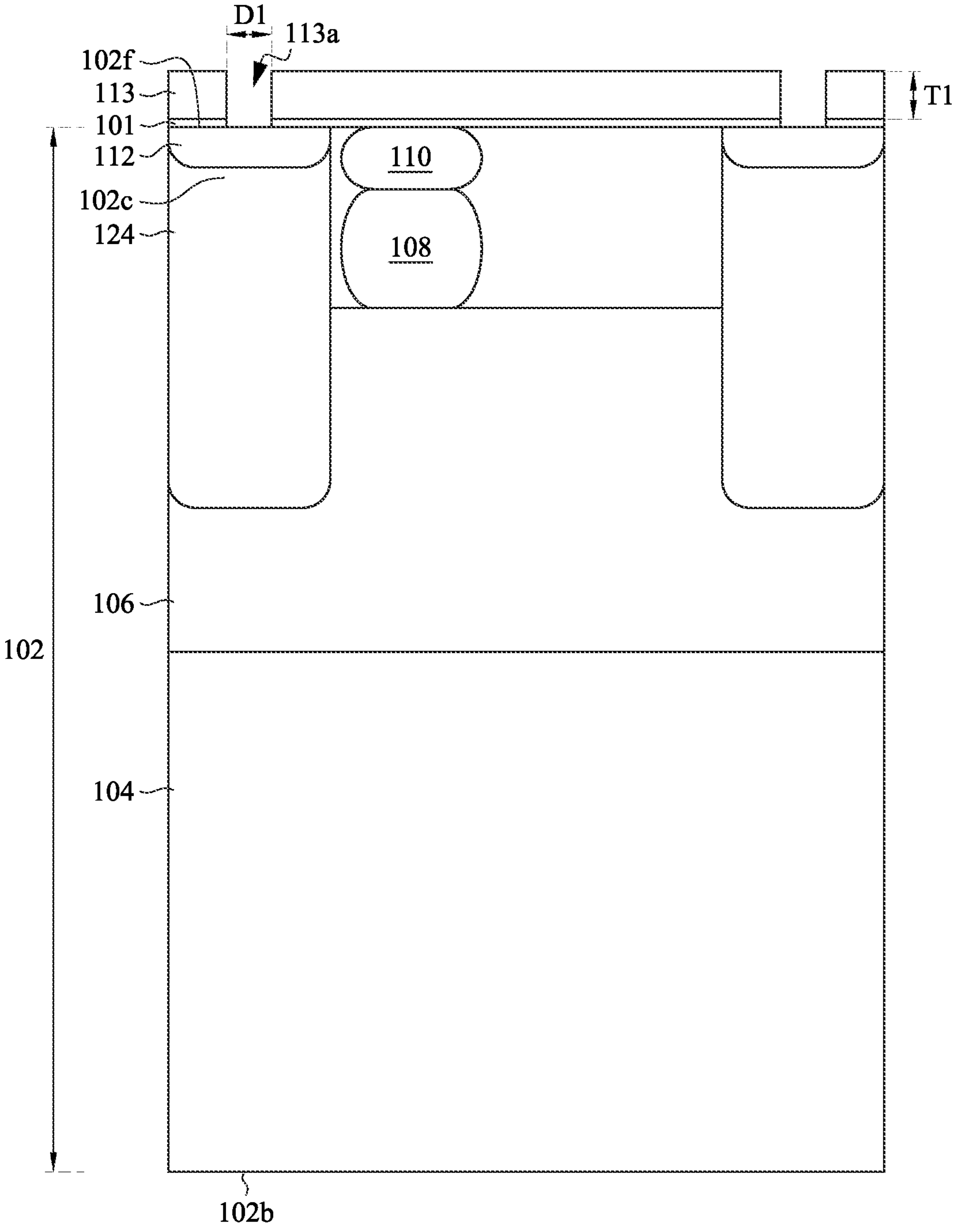

Reference is made to FIG. 4. A process for forming the deep trench isolation (DTI) structure 150 (see FIGS. 25A-25C) may include forming a patterned mask layer 113 (e.g., negative/positive photoresist, a hardmask, etc.) with openings 113*a* over the front side 102*f* of the substrate 102. The opening 113*a* may be formed with a footprint that is disposed within a footprint of the node 112. In other words, the node 112 can be exposed from the opening 113*a*. In some embodiments, the mask layer 113 can be made of nitride, such as silicon nitride. In some embodiments, the mask layer 113 can have a thickness T1. In some embodiments, the opening 113*a* can have a lateral dimension D1.

Figure 5:
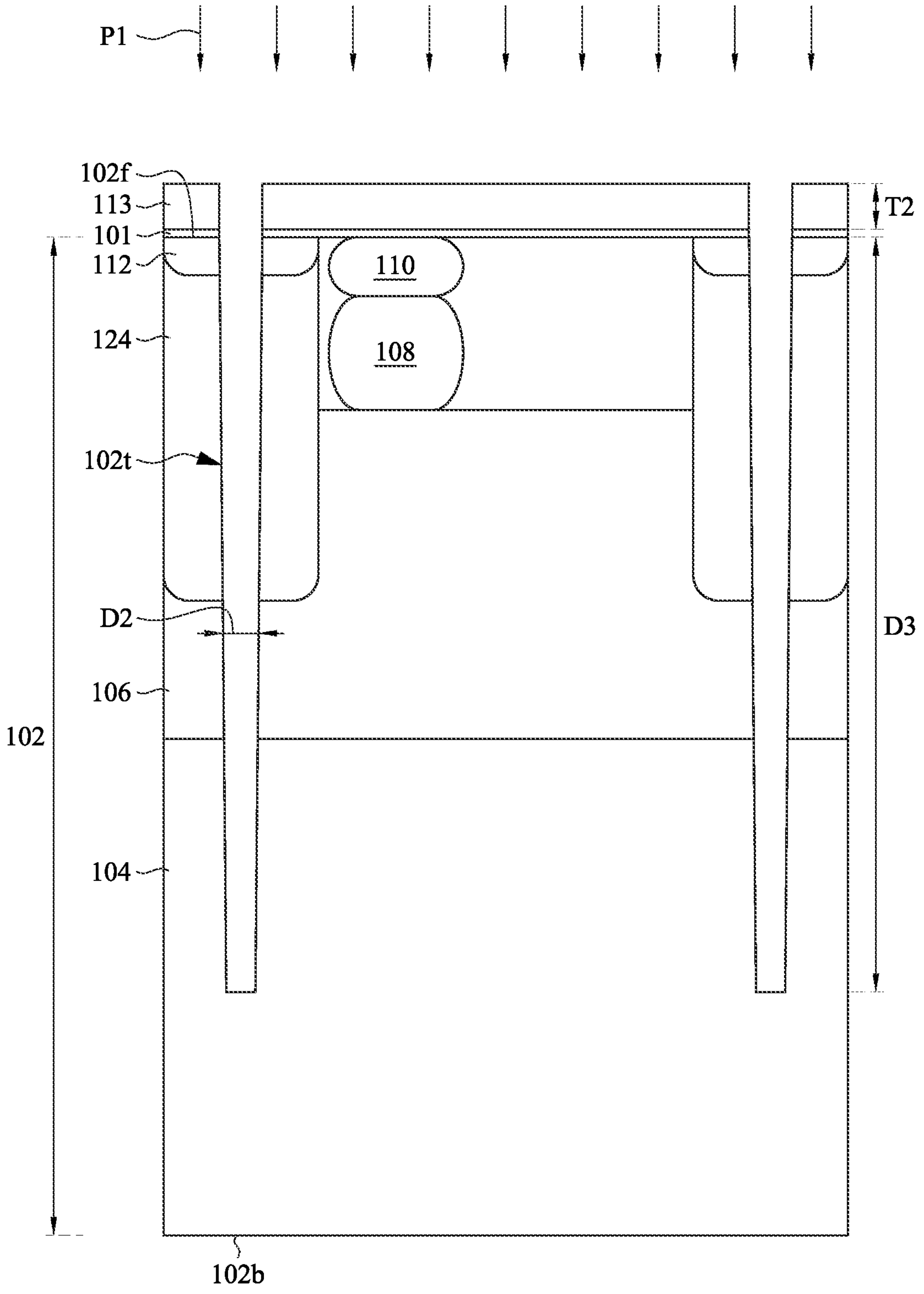

Reference is made to FIG. 5. With the patterned mask layer 113 in place over the front side 102*f* of the substrate 102, an etching process P1 is then performed on the substrate 102. The etching process P1 can remove unmasked portions of the substrate 102, thereby forming a trench 102*t* in the substrate 102. The trench 102*t* extends partially through the substrate 102 (e.g., not fully through the substrate 102) from the front side 102*f* of the substrate 102, thereby extending vertically through doped well 124 and the second doped region 106 and vertically into the first doped region 104. In such embodiments, the trench 102*t* can expose portions of the first doped region 104 and portions of the second doped region 106. In further such embodiments, the portions of the first doped region 104 and the portions of the second doped region 106 at least partially define surfaces (e.g., sidewalls) of the trench 102*t*. In some embodiments, the trench 102*t* may have angled sidewalls. In other embodiments, the sidewalls of the trench 102*t* may be substantially straight (e.g., vertical).

The trench 102*t* is formed extending laterally through the substrate 102, such that the trench 102*t* laterally surrounds the plurality of pixel regions 103. The trench 102*t* is formed with a footprint that is disposed within the footprint of the doped well 124. In some embodiments, the second doped region 106 continuously extends laterally between opposite inner sidewalls of the trench 102*t*. In some embodiments, the second doped region 106 continuously extends laterally between the opposite inner sides of the doped well 124 and continuously extends laterally between the opposite inner sidewalls of the trench 102*t*. In some embodiments, the first doped region 104 continuously extends laterally between the opposite inner sidewalls of the trench 102*t*. In some embodiments, a layout of the trench 102*t* has a grid-like shape. As such, the footprint of the trench 102*t* has the grid-like shape. In such embodiments, the grid-like shaped footprint of the trench 102*t* is disposed within a grid-like shaped footprint of the doped well 124.

The etching process P1 may be or comprise, for example, a wet etching process, a dry etching process, a reactive ion etching (RIE) process, some other etching process, or a combination of the foregoing. In some embodiments, the trench 102*t* can have a lateral dimension (or width) D2 and a vertical dimension (or depth) D3, and a ratio of the vertical dimension D3 to the lateral dimension D2 can be in a range from about 10 to 50, such as about 10, 15, 20, 25, 30, 35, 40, 45, or 50. By way of example and not limitation, the lateral dimension D2 can be in a range from about 1.5 to 6 nm, such as about 1, 5, 2, 2.5, 3, 3.2, 3.5, 4, 4.5, 5, 5.5, or 6 nm. The vertical dimension D3 can be in a range from about 50 to 150 nm, such as about 50, 60, 70, 80, 90, 100, 110, 120, 130, 140, or 150 nm. In some embodiments, the etching process would consume the mask layer 113, and thus after the etching process P1 is complete, the mask layer 113 may have a thickness T2 thinner than the thickness T1 of the mask layer 113 as shown in FIG. 4.

Figure 6:
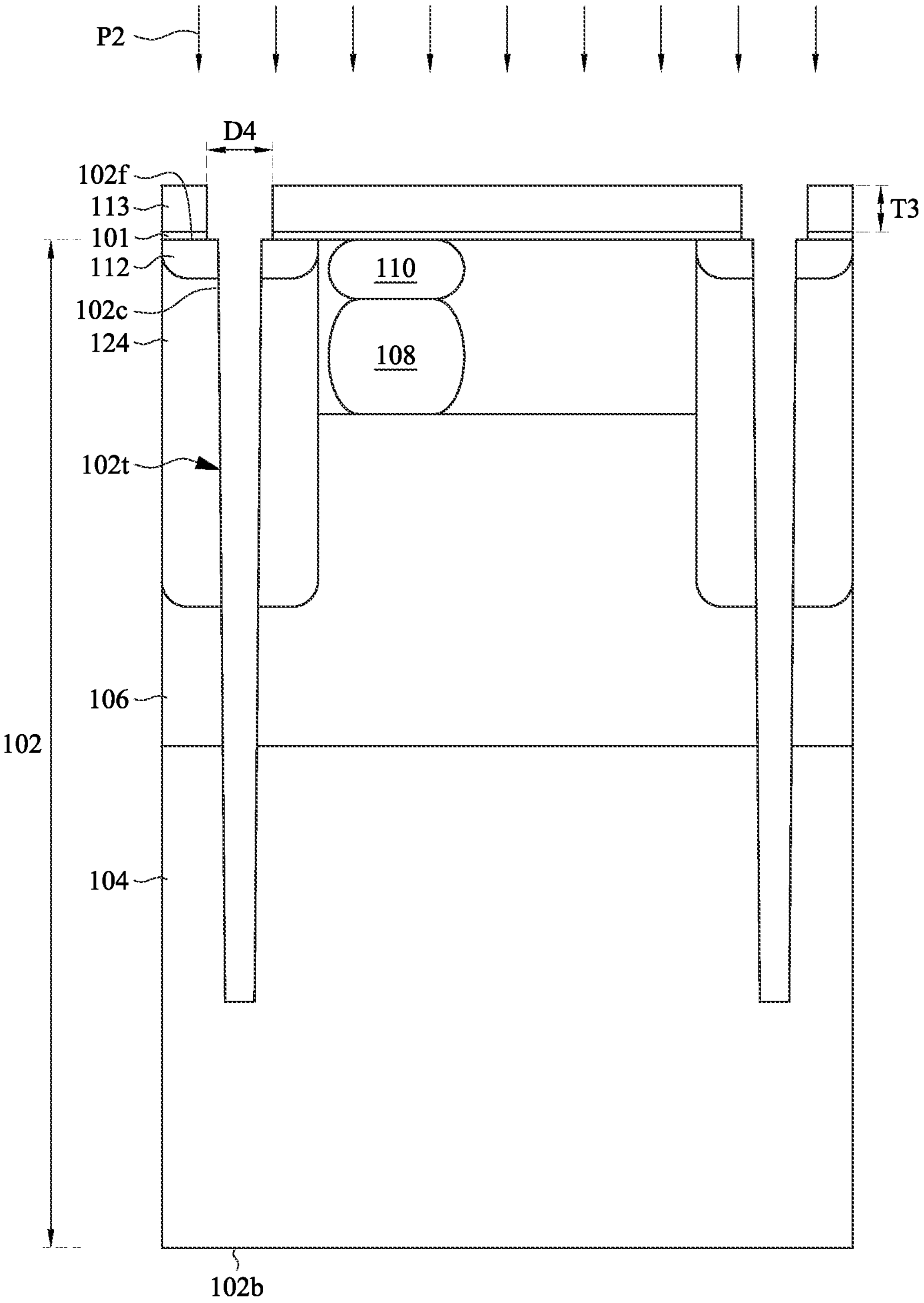

Reference is made to FIG. 6. The openings 113*a* in the mask layer 113 can be laterally expanded through an etching process P2, such that a lateral dimension D4 (see FIG. 6) of the opening 113*a* can be enlarged to be greater than the lateral dimension D2 of the trench 102*t* as shown in FIG. 5 and the lateral dimension D1 of the opening 113*a* (see FIG. 4). In some embodiments, the etching process P2 would consume the mask layer 113, and thus after the etching process P2 is complete, the mask layer 113 may have a thickness T3 thinner than the thickness T2 of the mask layer 113 as shown in FIG. 5.

Figure 7:
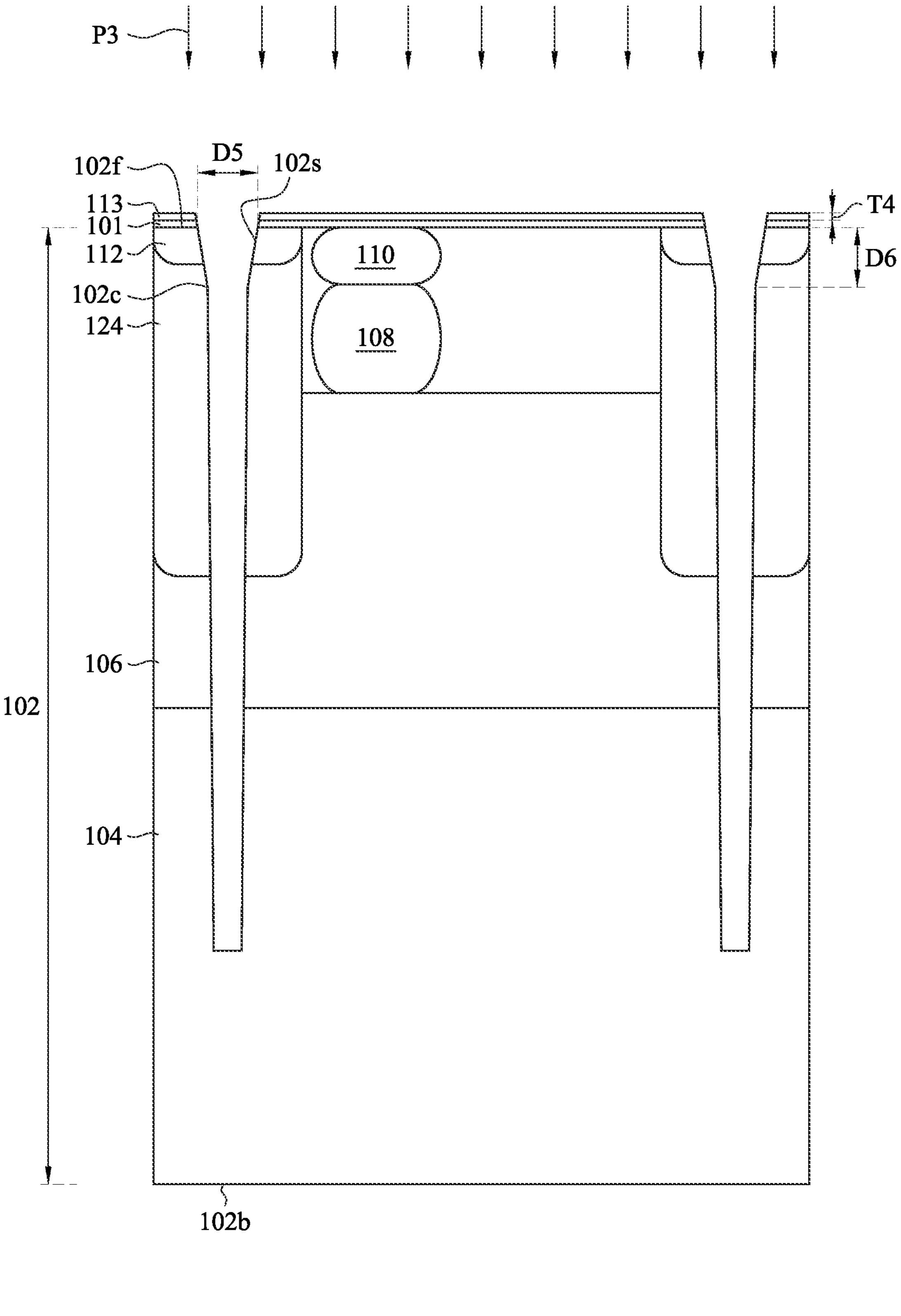

Reference is made to FIG. 7. An upper portion of the trench 102*t* in the substrate 102 can be laterally expanded through an etching process P3, such that the upper portion of the trench 102*t* has a sidewall 102*s* that tapers away from the front side 102*f* of the substrate 102 and form a corner 102*c* with a middle portion of the trench 102*t*. For example, the upper portion of the trench 102*t* has a lateral dimension D5 decreasing as a vertical distance from the front side 102*f* of the substrate 102 increases. Therefore, the upper portion of the trench 102*t* can be enlarged to have the lateral dimension D5 that is greater than the lateral dimension D2 of the trench 102*t* as shown in FIG. 5. In some embodiments, the etching process P3 would consume the mask layer 113, and thus after the etching process P3 is complete, the mask layer 113 may have a thickness T4 thinner than the thickness T3 of the mask layer 113 as shown in FIG. 6. By way of example and not limitation, the lateral dimension D5 can be in a range from about 100 to 200 nm, such as about 100, 110, 120, 130, 140, 150, 160, 170, 180, 190, or 200 nm. The upper portion of the trench 102*t* can have a vertical dimension D6 that is in a range from about 100 to 300 nm, such as 100, 120, 140, 160, 180, 200, 220, 240, 260, 280, or 300 nm. In some embodiments, the lateral dimension D5 can be less than the vertical dimension D6.

Figure 8:
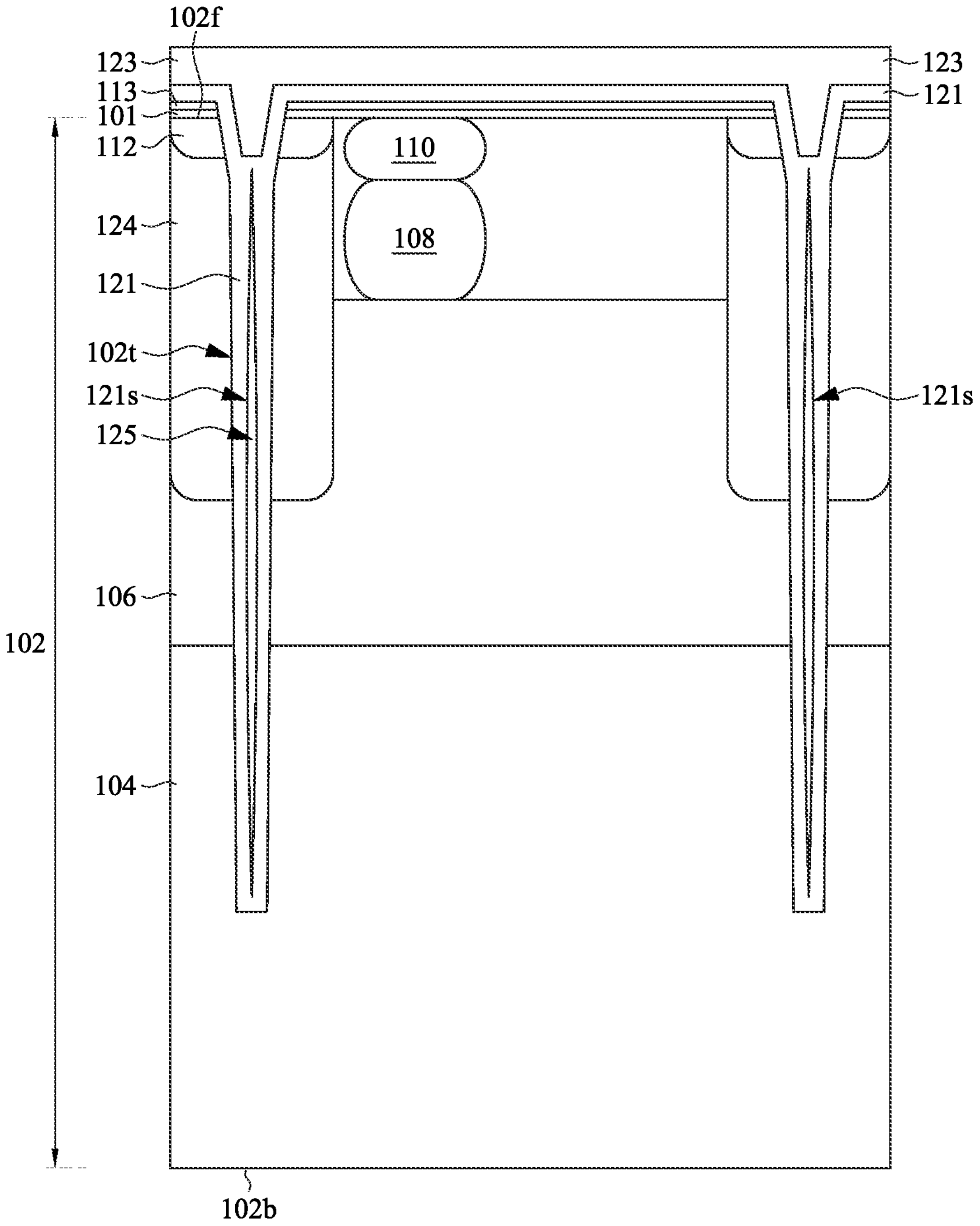

Reference is made to FIG. 8. A dielectric layer 121 can be deposited over the front side 102*f* of the substrate 102 and fill into the trench 102*t*. Subsequently, a dielectric layer 123 can be deposited over the dielectric layer 121. In some embodiments, the dielectric layer 123 can be made of a different material than the dielectric layer 121. The dielectric layer 121 can be formed to have a seam 121*s* therein within the trench 102*t*. In some embodiments, the seam 121*s* is situated below the upper portion of the trench 102*t*. In some embodiments, the seam 121*s* can be interchangeably referred to as an air gap. By way of example and not limitation, the dielectric layer 121 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like. The dielectric layer 123 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like. In some embodiments, the trench 102*t* can be filled only with the dielectric layer 121 but not with dielectric layer 123.

Figure 9:
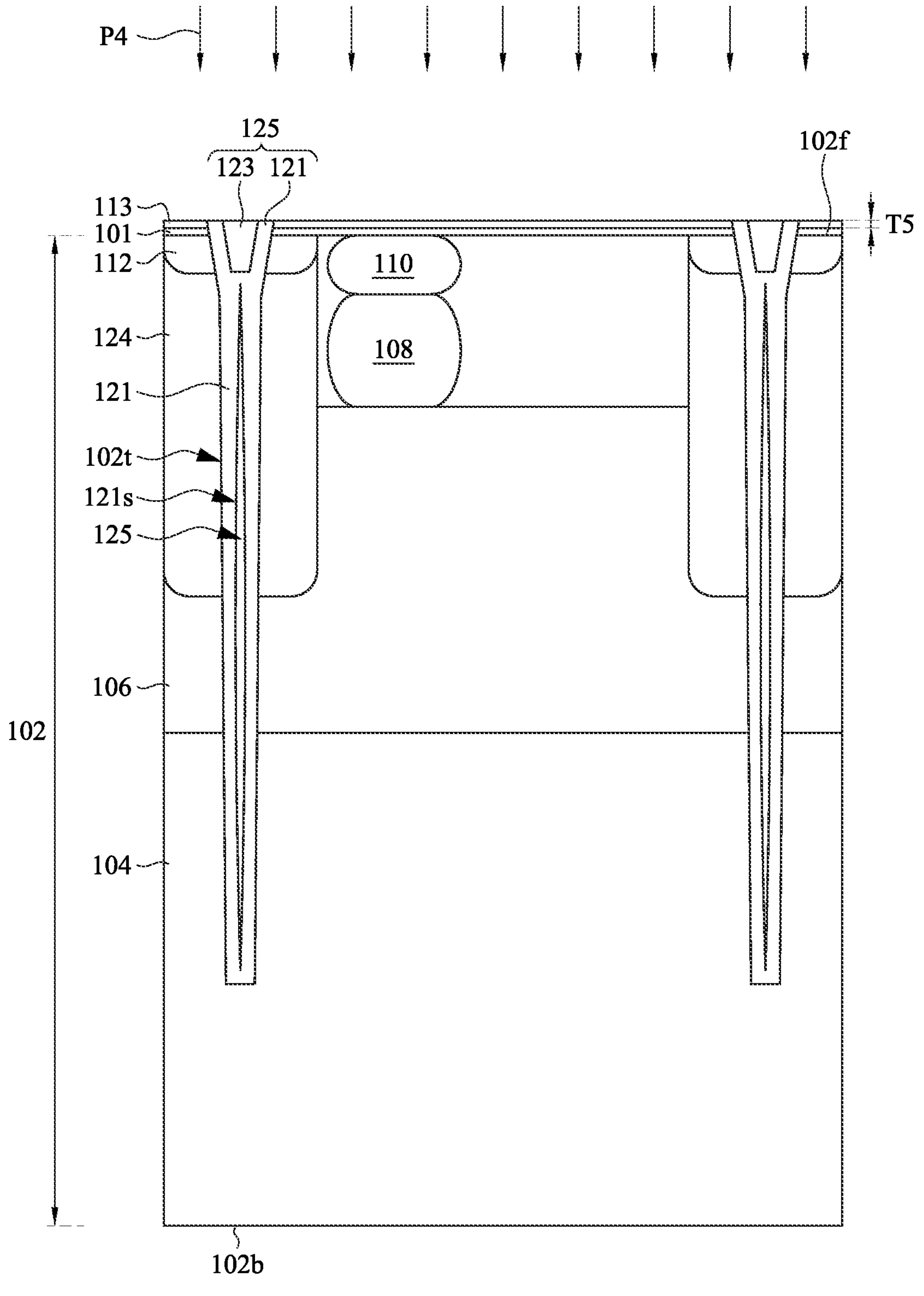

Reference is made to FIG. 9. A removal process P4, such as chemical mechanical polishing (CMP), or the like, can be performed on the dielectric layers 121 and 123 until the mask layer 113 is exposed. In some embodiments, the removal process P4 would consume the mask layer 113, and thus after the removal process P4 is complete, the mask layer 113 may have a thickness T5 thinner than the thickness T4 of the mask layer 113 as shown in FIG. 7. In some embodiments, remainders of the dielectric layers 121 and 123 as illustrated in FIG. 9 can be collectively referred to a multi-oxide structure, a multi-dielectric structure, a sacrificial dielectric, a sacrificial oxide, or a dielectric structure 125.

Figure 10A:
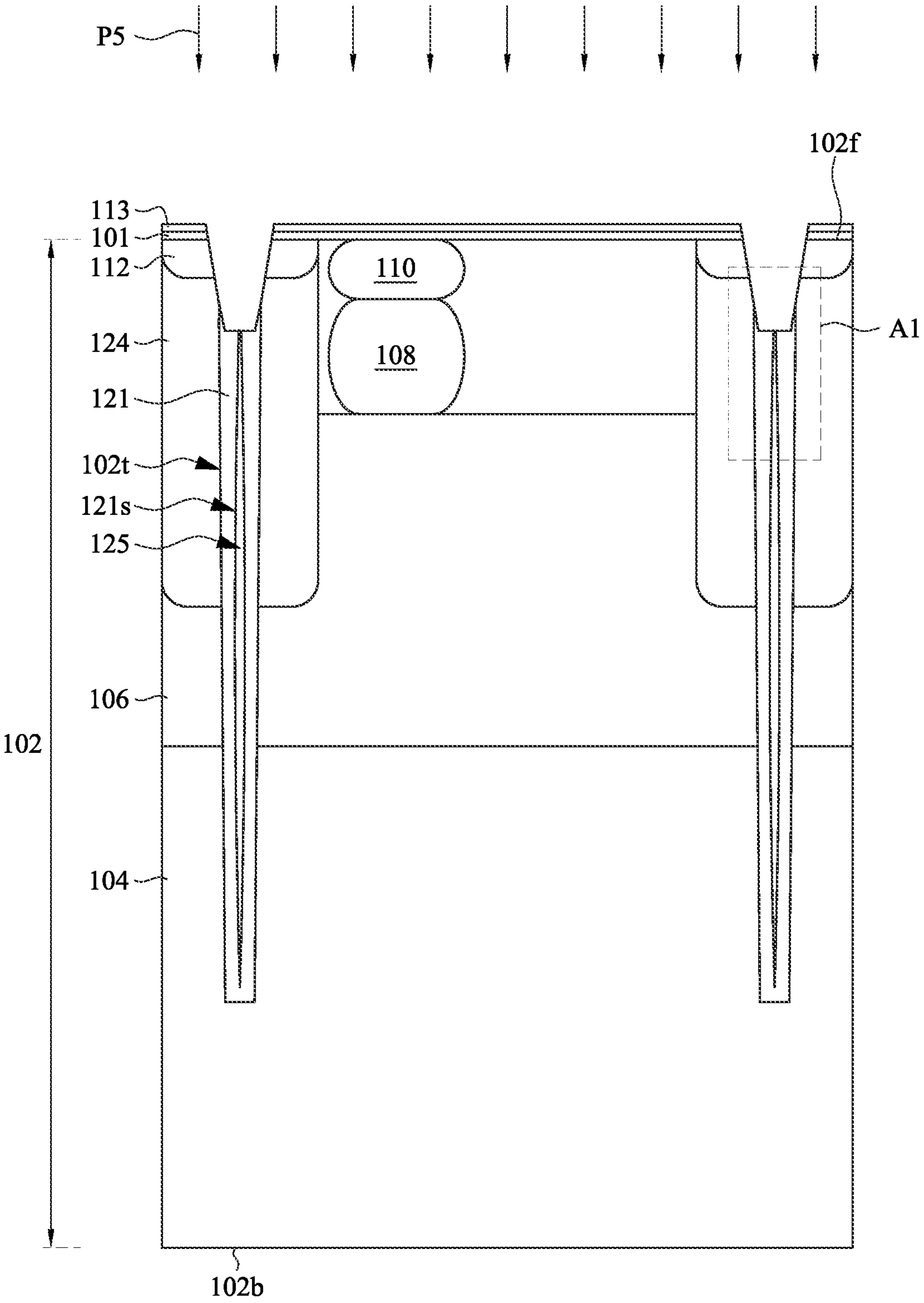
Figure 10B:
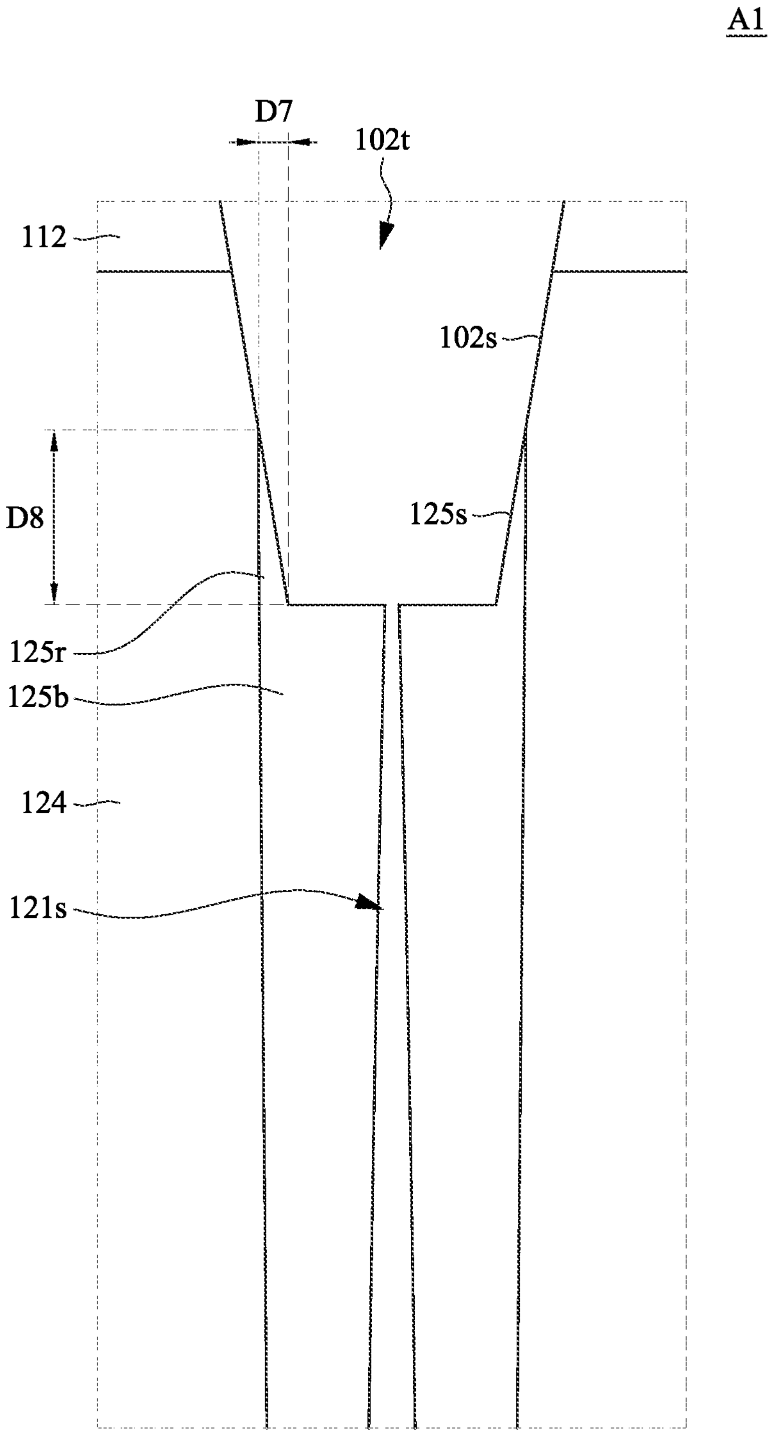
FIGS. 10B, 11B, 12B, 15B, 25B, and 28B are local enlarged views of regions A1, A2, A3, A4, A5, and A6 in FIGS. 10A, 11A, 12A, 15A, 25A, and 28A, respectively.

Reference is made to FIGS. 10A and 10B. An etching process P5 is performed on the dielectric structure 125 to recess the dielectric structure 125, such that the upper portion of the trench 102*t* can reappear and the seam 121*s* can be exposed from the dielectric layer 121. After the etching process P5 is complete, a dielectric remainder 125*r* (see FIG. 10B) can be formed on a top portion of the dielectric structure 125. In other words, the dielectric remainder 125*r* of the dielectric structure 125 can be formed on a bulk portion 125*b* (see FIG. 10B) of the dielectric structure 125. As shown in FIG. 10B, the top portion of the dielectric structure 125 has a slant surface 125*s* and a level surface 125*v* connected to the slant surface 125*s*, and the slant surface 125*s* can be coterminous with the sidewall 102*s* of the trench 102. In some embodiments, the dielectric remainder 125*r* can be interchangeably referred to a sharp corner, a top portion, an oxide remainder, or a thin oxide layer, or a protruding portion. By way of example and not limitation, the dielectric remainder 125*r* can have a vertical dimension D7 and a lateral dimension D8, and the lateral dimension D8 can be in a range from about 1 to 10 nm, such as about 1, 2, 3, 4, 5, 6, 7, 8, 9, or 10 nm.

Figure 29:
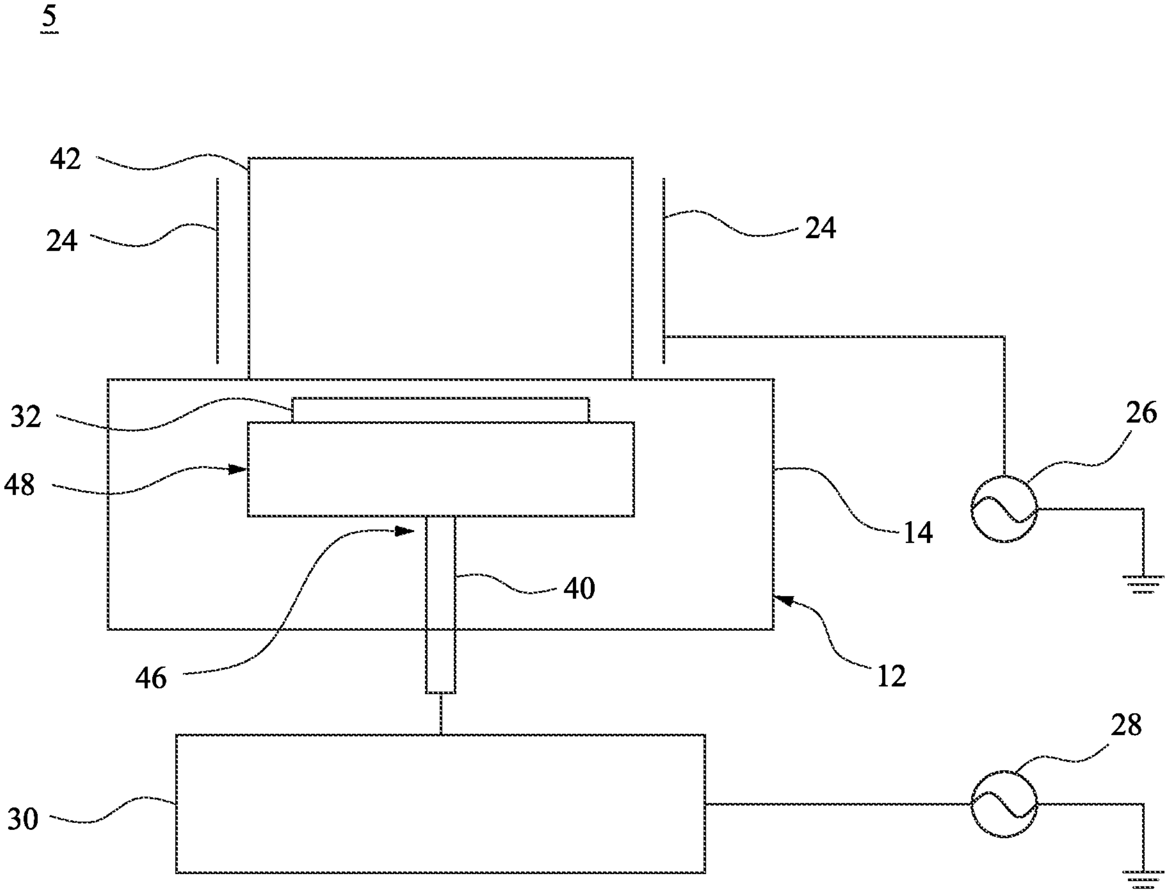
FIG. 29 is a cross-sectional view of a plasma processing apparatus in accordance with some embodiments of the present disclosure.

In some embodiments, the etching process P5 can be an anisotropic etching process. In some embodiments, the etching process P5 can be a dry etching process, such as a plasma etching process. The plasma etching process may be performed by a plasma processing apparatus 5, such as an inductively coupled plasma (ICP) apparatus, a capactitively coupled plasma (CCP) apparatus, or a micro wave apparatus. In greater detail, Referring now to FIG. 29, illustrated is a cross-sectional view of an exemplary plasma processing apparatus 5 in some embodiments of the present disclosure. In some embodiments, the plasma processing apparatus 5 may contain an inductively-coupled plasma as a plasma source and a RF power supply as a bias power source. As shown in FIG. 29, the plasma processing apparatus 5 includes a chamber base 12 having a typically grounded chamber wall 14. The chamber base 12 is closed by a removable lid or a lid 42 and contains a pedestal assembly 48 which can typically be raised and lowered on a shaft 40 by actuation of a pedestal lift assembly 46. An inductively-coupled plasma coil 24 surrounds the lid 42 and is connected to an RF source power supply 26. The pedestal assembly 48 is connected, through an RF match network 30 which matches impedances, to an RF power supply 28. During operation of the plasma processing apparatus 5, the pedestal assembly 48 supports the substrate 102 in the chamber base 12. A plasma-generating source gas, such as argon, is introduced into the plasma processing apparatus 5 by a gas supply (not shown). Volatile reaction products and unreacted plasma species are removed from the plasma processing apparatus 5 by a gas removal mechanism (not shown). Source power such as a high voltage signal, provided by the RF source power supply 26, is applied to the inductively-coupled plasma coil 24 to ignite and sustain the plasma in the plasma processing apparatus 5. Ignition of the plasma in the plasma processing apparatus 5 is accomplished primarily by electrostatic coupling of the inductively-coupled plasma coil 24 with the source gas, due to the large-magnitude voltage applied to the inductively-coupled plasma coil 24 and the resulting electric fields produced in the plasma processing apparatus 5. Once ignited, the plasma is sustained by electromagnetic induction effects associated with time-varying magnetic fields produced by the alternating currents applied to the inductively-coupled plasma coil 24. Through the RF power supply 28, the pedestal assembly 48 is typically electrically biased to provide to the substrate 102 ion energies that are independent of the RF voltage applied to the chamber 10 through the inductively-coupled plasma coil 24 and RF source power supply 26. This facilitates more precise control over the energies of the etchant ions that bombard the surface of the substrate 102 to remove the unexposed portion (see FIG. 3B) of the dielectric structure 125. A bias etching can be provided by the plasma source 26 with turning on the RF power source 28 during the bias etching step.

In some embodiments, the bias power of the etching process P5 may be performed at a frequency in a range from about 13.56 MHz to about 2.45 GHz. In some embodiments, the bias power of the etching process P5 may be in a range from about 100 W to about 2000 W, such as 100, 500, 1000, 1500, or 2000 W. In some embodiments, the plasma processing apparatus 5 may also be an electron cyclotron resonance (ECR) apparatus, but the present disclosure is not limited thereto. In some embodiments, the etching process P5 may use a gas mixture including, such as $C_4F_8$, with the bias. In some embodiments, the etching process P5 may be performed under a pressure in a range from about 3 to 100 mTorr, such as about 3, 10, 20, 30, 40, 50, 60, 70, 80, 90, or 100 mTorr.

Figure 11A:
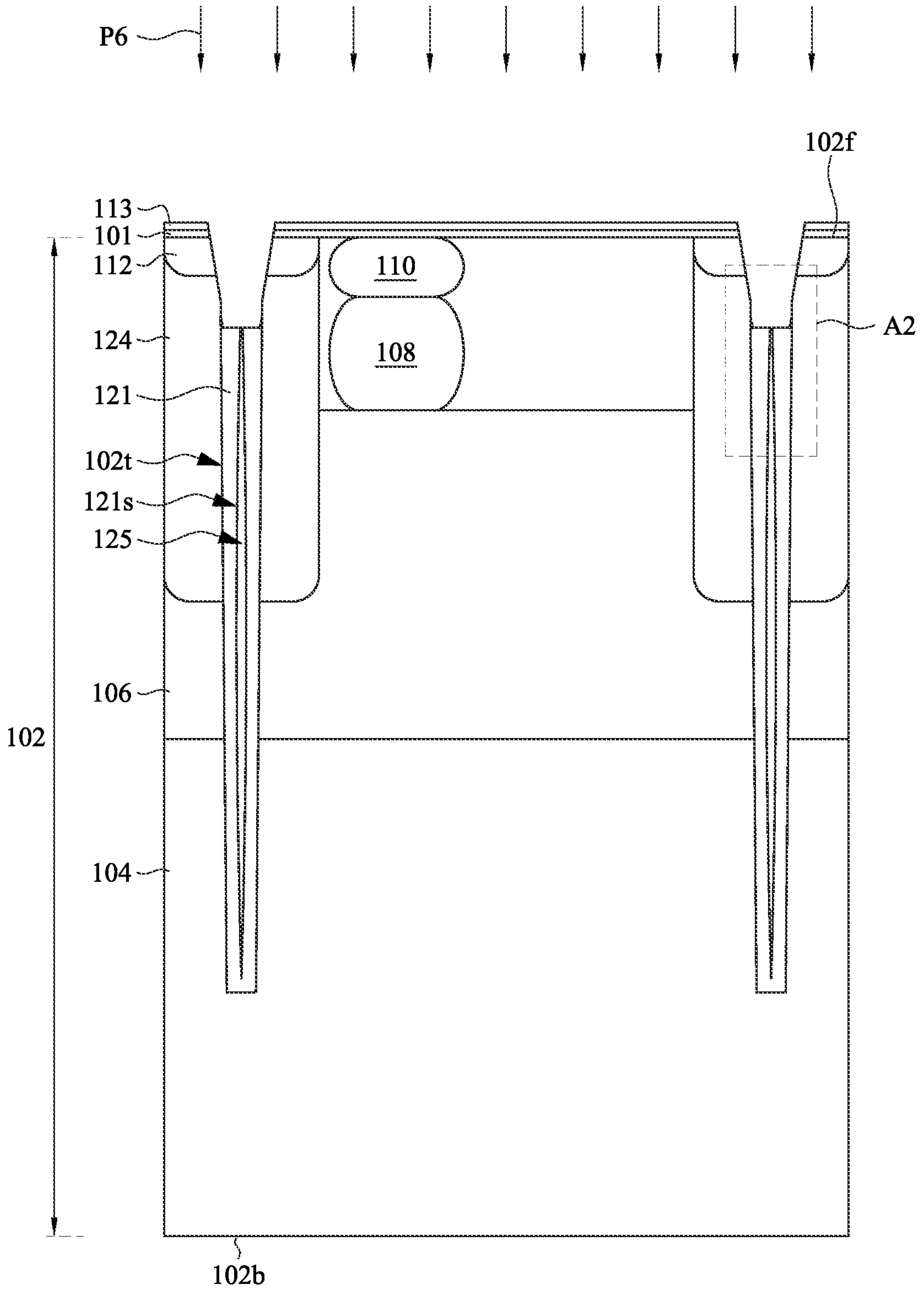
Figure 11B:
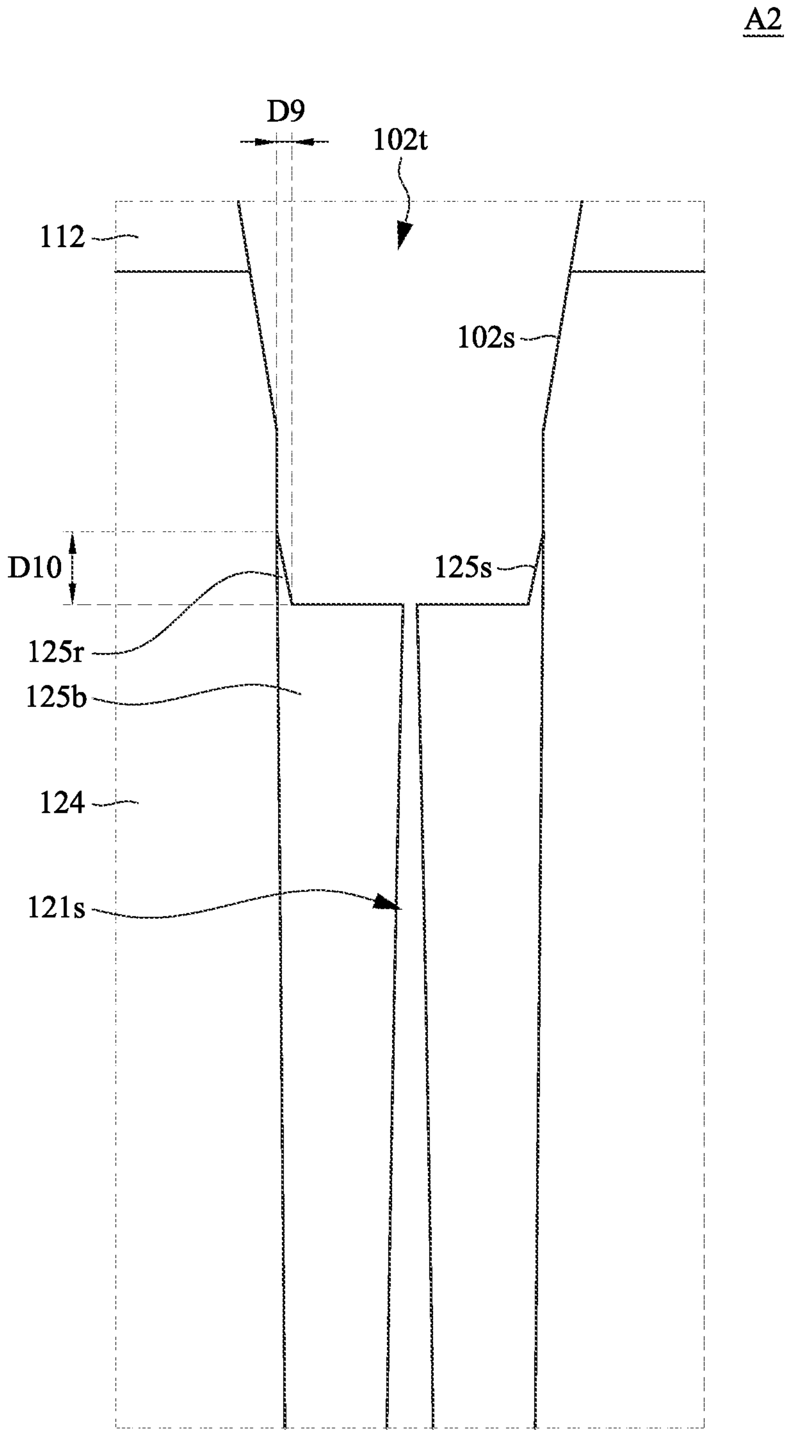

Reference is made to FIGS. 11A and 11B. An etching process P6 is performed on the dielectric structure 125 to scale down the dielectric remainder 125*r* of the dielectric structure 125. In some embodiments, the etching process P6 can be used to remove native oxide on the dielectric remainder 125*r*. In some embodiments, diluted HF, SiCoNi (including HF and $NH_3$), or the like, may be used as the etchant in the etching process P6. In some embodiments, the etching process P6 can be an anisotropic etching process. In some embodiments, the etching process P6 can be a dry etching process, such as a plasma etching process. After the etching process P6 is complete, the dielectric remainder 125*r* can have a vertical dimension D9 and a lateral dimension D10, the vertical dimension D9 can be less than the vertical dimension D7 of the dielectric remainder 125*r* as shown in FIG. 10B, and the lateral dimension D10 can be less than the vertical dimension D8 of the dielectric remainder 125*r* as shown in FIG. 10B. By way of example and not limitation, the lateral dimension D8 can be in a range from about 1 to 10 nm, such as about 1, 2, 3, 4, 5, 6, 7, 8, 9, or 10 nm.

In some embodiments, the etching process P6 can act as n pre-clean process to prepare the surface for the subsequent deposition of the sealing layer 127 (see FIGS. 12A-12C), ensuring high-quality layer formation. The etching process P6 can be a gentle or less aggressive etching process to prevent excessive material removal or damage to the underlying layers. In some embodiments, the quality of epitaxial growth heavily may rely on the condition of the surface onto which it is deposited, and the etching process P6 can ensure that the surface is prepared, leading to uniform and high-quality epitaxial growth of the sealing layer 127. In some embodiments, the etching process P6 can be a pre-clean process.

Figure 12A:
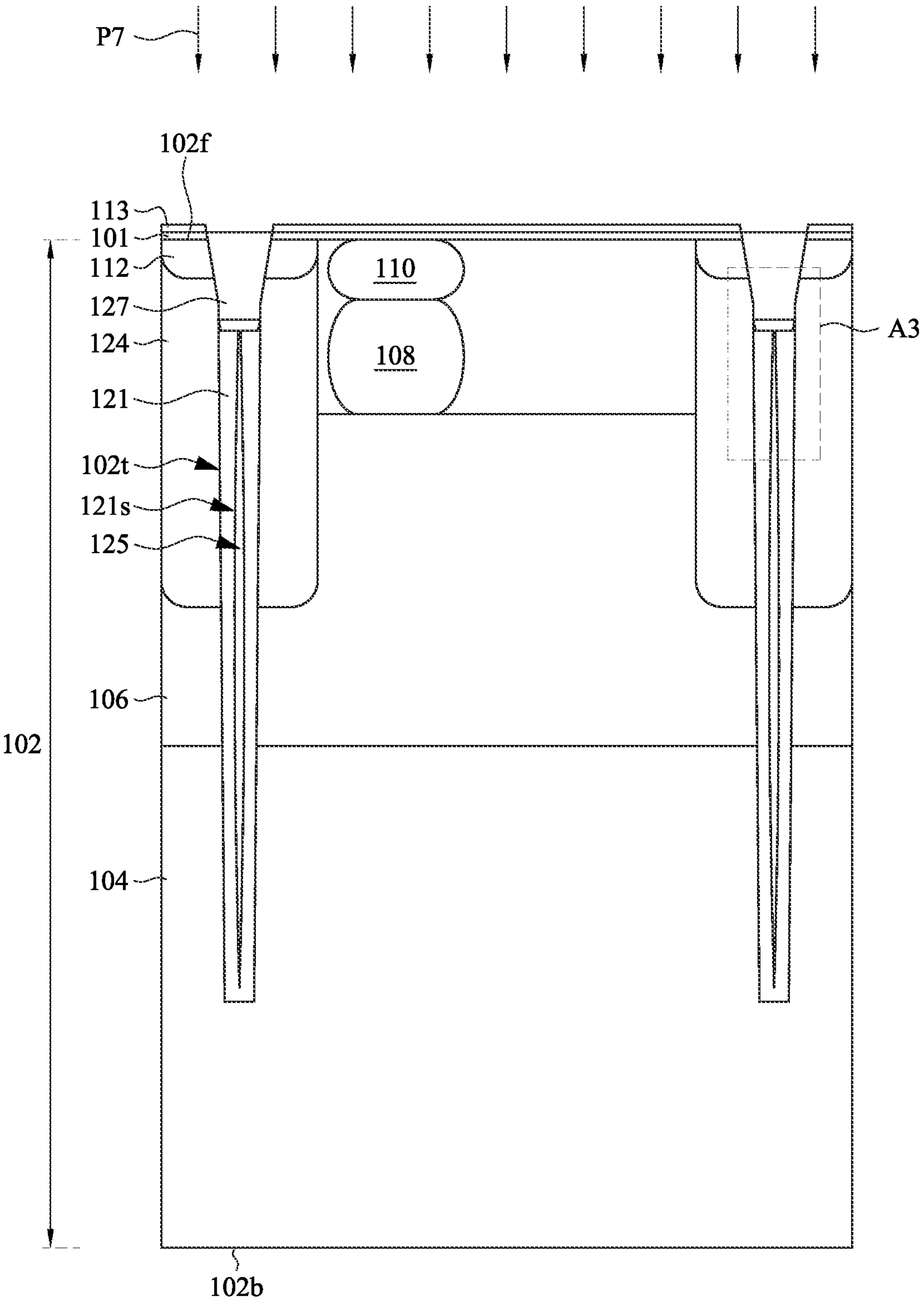
Figure 12B:
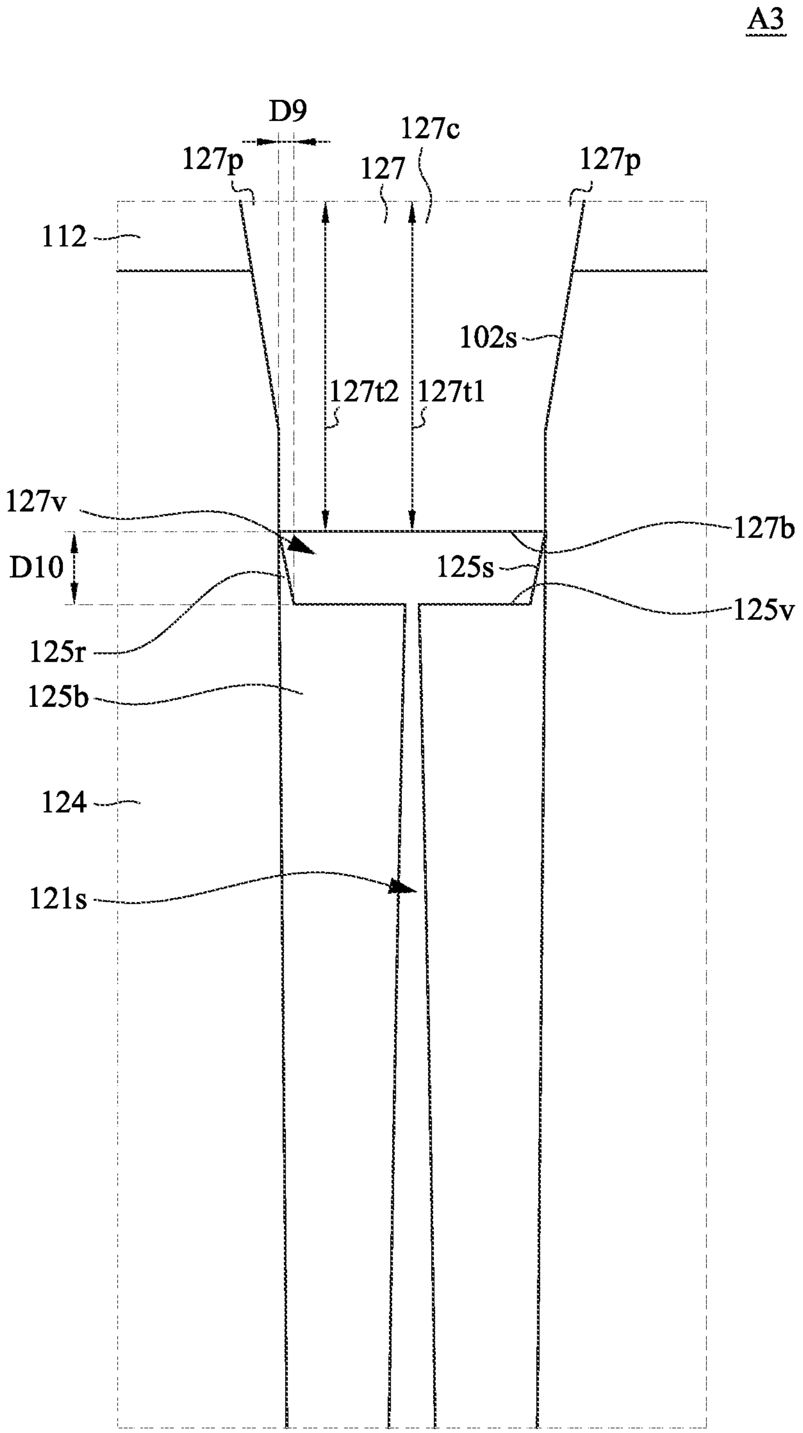
Figure 12C:
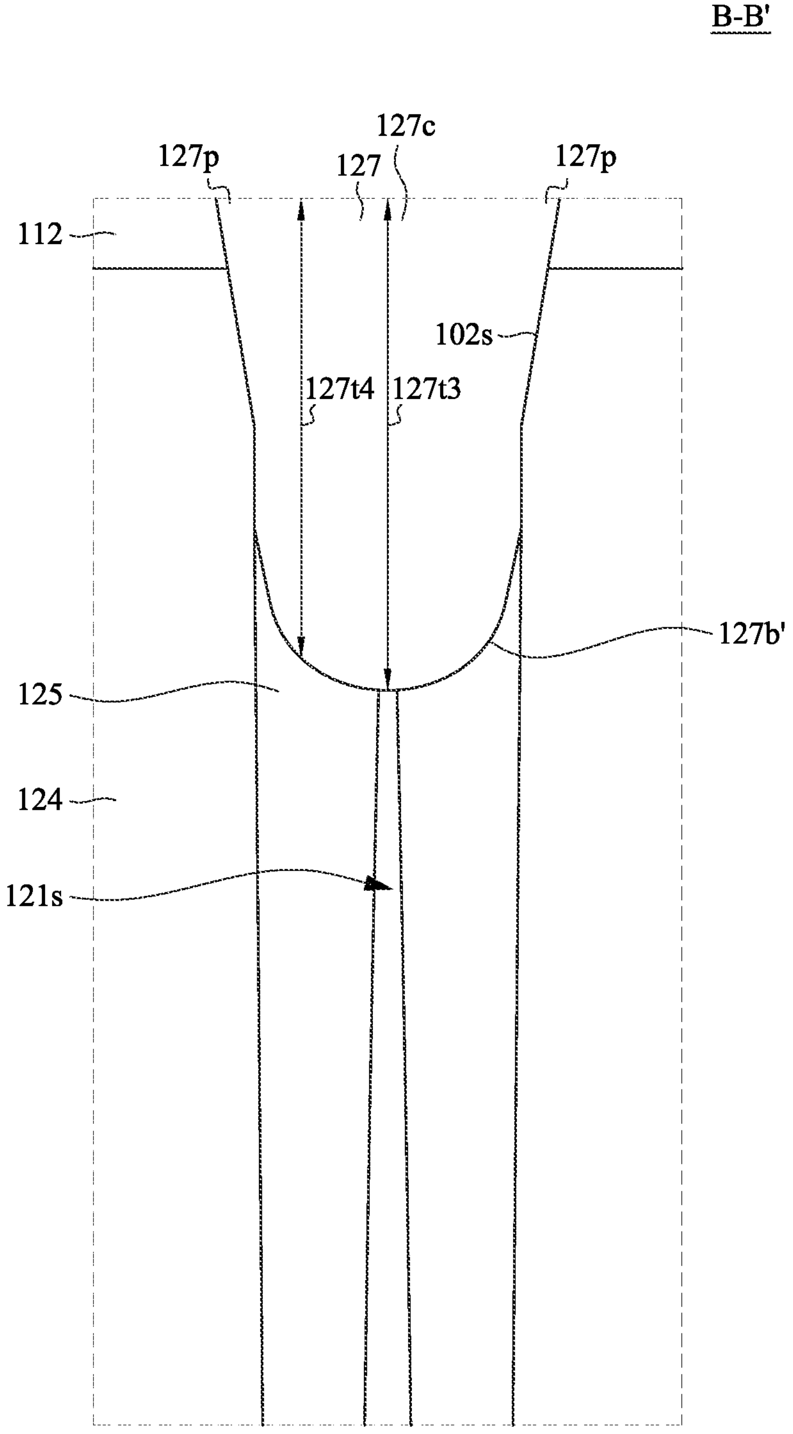
FIGS. 12C and 25C illustrate local enlarged cross-sectional views taken along line B-B' as shown in FIG. 1A and corresponding to FIGS. 12B and 25B in accordance with some embodiments of the present disclosure.

Reference is made to FIGS. 12A-12C. A deposition process P7 is performed on an exposed sidewall 102*s* of the substrate 102 in the trench 102*t* to form a sealing layer 127 over the dielectric remainder 125*r*. The sealing layer 127 can be used as an etch stop layer when etching the dielectric structure 125 from the back side 102*b* of the substrate 102 (see FIG. 23) to prevent the etchant from damaging a subsequent formed dielectric layer 137 (see FIG. 23) over the front side of the sealing layer 127. In some embodiments, the sealing layer 127 is to be crystallized (e.g., by using a thermal crystallization process), and thus the sealing layer 127 can be in a crystalline state to have a higher etching resistance. By way of example and not limitation, the sealing layer 127 can be made of monocrystalline silicon, which is a single, continuous crystal lattice. In some embodiments, the deposition process P7 to form the sealing layer 127 can be the selective epitaxial growth (SEG) process. In some embodiments, the deposition process P7 can be interchangeably referred to as two-dimensional epitaxial (EPI) growth.

As shown in FIGS. 12B and 12C, the dielectric remainder 125*r*, positioned within the trench 102*t*, has a small top surface area. This minimal area can result in a correspondingly small contact area between the dielectric remainder 125*r* and the subsequently formed sealing layer 127. The reduced contact area can allow more precise control over the profile of the sealing layer 127, ensuring the sealing layer's effectiveness as an etch stop layer and maintaining the structural integrity of the image sensor 100. The sealing layer 127 is formed on the exposed sidewalls 102*s* of the substrate 102. In this location, the influence of the dielectric remainder 125*r* on the growth direction of the sealing layer can be minimized, leading to a more uniform and controlled layer formation. Specifically, as shown in FIG. 12B, when viewed from the cross-sectional view taken along line A-A' (e.g., xy-cut) as shown in FIG. 1A, the sealing layer 127 can grow with a merged-plane, exhibiting a (100) crystallographic facet, resulting in the sealing layer 127 with a flat bottom surface 127*b*. In other words, from the top view as shown in FIG. 1A, the deep trench isolation 150 structure has a grid pattern that has a grid line, and from a cross-sectional view taken along a direction intersecting with a lengthwise direction of the grid line, the sealing layer 127 has a flat bottom surface 127*b*. In some embodiments, the cross-sectional view of FIG. 12B passes through the intersection position of the grid lines in the grid pattern as shown in FIG. 1A. The flat bottom surface 127*b* of the sealing layer 127 can enhance its ability to act as an effective barrier against etchants during the etching of the dielectric structure 125 from the back side 102*b* of the substrate 102 (see FIG. 23). In some embodiments, the sealing layer 127 can be spaced apart from the slant surface 125*s* of the dielectric remainder 125*r*, and a void 127*v* can be formed between the bottom surface 127*b* of the sealing layer 127 and a top surface of the dielectric structure 125. In some embodiments, the void 127*v* can be communicated with the seam 121*s* in the dielectric structure 125. In some embodiments, the sealing layer 127 may have a top surface level with a front-side surface of the pad layer 101 or a front-side surface of the substrate 102. The top surface of the sealing layer 127 can be in parallel with the bottom surface 127*b* of the sealing layer 127. Specifically, in FIG. 12B, when viewed from the cross-sectional view taken along line A-A' (e.g., xy-cut) as shown in FIG. 1A, the sealing layer 127 can have peripheral portions 127*p* and a central portion 127*c* between the peripheral portions 127*p*. A thickness 127*t*1 of the central portion 127*c* of the sealing layer 127 can be substantially the same as the thicknesses 127*t*2 of the peripheral portions 127*p*. In some embodiments, the sealing layer 127 may have a thickness in a range from about 20 to 100 nm, such as about 20, 30, 40, 50 60, 70, 80, 90, or 100 nm.

When the contact area between the dielectric remainder 125*r* and the sealing layer 127 is large, it can significantly influence the growth direction and morphology of the sealing layer 127. The large interface area can cause the sealing layer 127 to adopt a growth pattern that results in a merged-plane with a (111) or (311) crystallographic facet, leading to a triangular bottom surface on the sealing layer. A sealing layer with a triangular bottom surface presents challenges during the etching of the dielectric structure 125 from the back side 102*b* of the substrate (see FIG. 23). The pointed or angular nature of a triangular bottom surface makes the sealing layer more vulnerable to etchant penetration. During the etching process, the sealing layer 127 with a triangular bottom surface can be easily etched through, particularly at its thinner points. Once the etchant etch through the sealing layer, it can continue to etch into and damage the subsequent dielectric layer 137, which is formed over the front side of the sealing layer. Damage to the dielectric layer 137 and other components due to an ineffective sealing layer can lead to, such as electrical shorts, leakage, or reduced isolation between sensor elements. To avoid these issues, the growth direction and surface profile of the sealing layer 127 can be controlled by minimizing the contact area between the sealing layer 127 and the dielectric remainder 125*r*, ensuring the growth of a sealing layer with a flat bottom surface.

In some embodiments, as shown in FIG. 12C, when viewed from the cross-sectional view taken along line B-B' (e.g., x-cut) as shown in FIG. 1A, the back-side of the sealing layer 127 can grow to have a convex profile. In other words, from the cross-sectional view taken along the length-wise direction of the grid line, the sealing layer 127 has a convex bottom surface 127*b*'. In some embodiments, the cross-sectional view of FIG. 12C passes through between two intersection positions of the grid lines in the grid pattern as shown in FIG. 1A. In some embodiments, the cross-sectional view of FIG. 12C passes through the intersection position of the grid lines in the grid pattern. The sealing layer 127 can have an interface with the top surface of the dielectric layer 121. In other words, there is no void between the bottom surface 127*b*' of the sealing layer 127 and the top surface of the dielectric structure 125, and the dielectric structure 125 can have a concave top surface (or concave front-side surface) to be conformal to the bottom surface 127*b*' of the sealing layer 127. Specifically, in FIG. 12C, when viewed from the cross-sectional view taken along line B-B' (e.g., x-cut) as shown in FIG. 1A, a thickness 127*t*3 of the central portion 127*c* of the sealing layer 127 can be thicker than thicknesses 127*t*4 of the peripheral portions 127*p*. In some embodiments, a portion of the bottom surface 127*b*' of the sealing layer 127 can be exposed form the seam 121*s* in the dielectric structure 125. In some embodiments, the bottom surface 127*b*' of the sealing layer 127 can be covered by the dielectric structure 125.

The deposition process P7 for forming the sealing layer 127 can be performed in a repetitive cycle, ranging from about 5 to 30 cycles, such as about 5, 10, 12, 14, 16, 18, 20, 22, 24, 26, 28, or 30 cycles. Each cycle may include of two sub-steps. The first sub-step can be an epitaxial deposition of the sealing layer 127, and the second sub-step can be an annealing process, which follows the deposition. The epitaxial deposition may include an epitaxial layer of silicon or a similar material to form the sealing layer 127. The epitaxial deposition is performed selectively on the exposed sidewalls 102*s* of the substrate 102 in the trench 102*t*, establishing the initial crystalline structure and thickness of the sealing layer 127. Following the epitaxial deposition, an annealing process can be applied. The annealing process can include heating the substrate 102 to a high temperature, which in turn helps in relieving stress, repairing defects, improving crystalline quality within the deposited layer, and enhancing the uniformity and density of the sealing layer 127.

In some embodiments, repeating the epitaxial deposition and annealing process multiple times can allow for incremental build-up of the sealing layer, enhancing control over its thickness and uniformity, which in turn helps in gradually improving the crystalline quality of the layer with each cycle, reducing defects and irregularities. Improved epitaxial quality of the sealing layer 127 can ensure a stronger, more uniform layer that can effectively resist etchants and protect underlying layers during subsequent etching processes.

In some embodiments, the epitaxial deposition of epitaxial layer can be performed at a first temperature, and the annealing can be performed at a second temperature higher than the first temperature. In some embodiments, the first temperature can be in a range from about 600 to 1000° C., such as about 600, 650, 700, 750, 800, 850, 900, 950, or 1000° C. The second temperature can be in a range from about 700 to 1500° C., such as about 700, 800, 900, 1000, 1100, 1200, 1300, 1400, or 1500° C. In some embodiments, the annealing is performing with a mixture gas including $H_2$. Subsequently, the patterned mask layer 113 can be stripped away (see FIG. 13). In some embodiments, the patterned mask layer 113 may be removed by dry etching, wet etching, or a combination of dry and wet etching.

The sealing layer 127, made of monocrystalline silicon, can be deposited in a controlled manner over the substrate 102, specifically targeting the area around and above the dielectric layer 121. The sealing layer 127 can be impermeable and acts as a barrier, preventing the migration of materials into areas where they are not intended. In some embodiments, the seam 121*s* within the dielectric layer 121 can be an area where unwanted silicon deposition could occur. If silicon was to deposit in the seam 121*s*, it could compromise the electrical isolation and structural integrity of the deep trench isolation (DTI) structure 150 (see FIGS. 25A-25C), affecting the sensor's performance.

Figure 13:
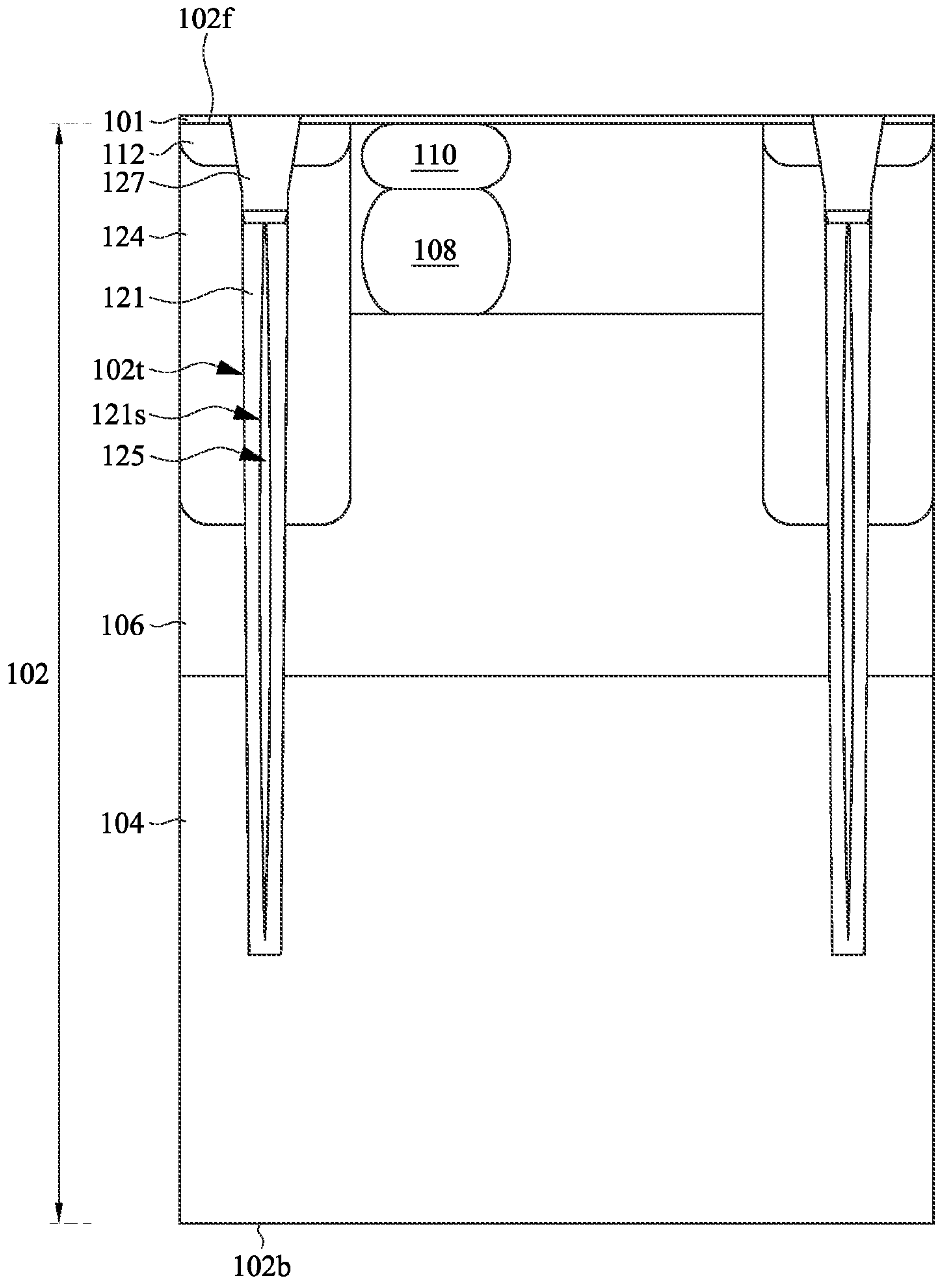
Figure 14:
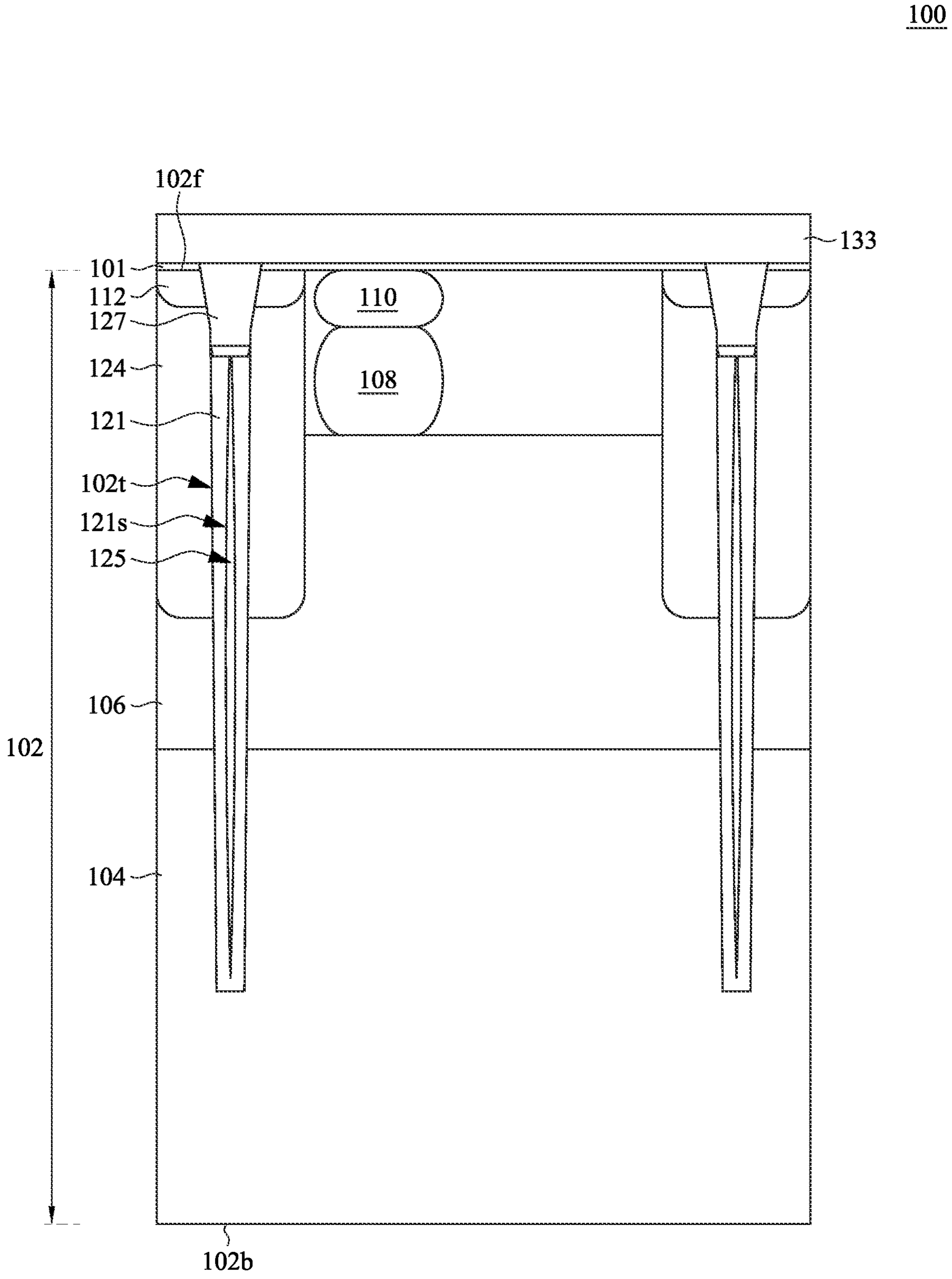

Reference is made to FIGS. 13 and 14. A mask layer 133 (see FIG. 13) is formed over the substrate 102. Subsequently, a silicon-based material layer 134 (see FIG. 14) is formed over the mask layer 133, and a photoresist layer 135 (see FIG. 14) is formed over the silicon-based material layer 134. The mask layer 133, the silicon-based material layer 134, and the photoresist layer 135 can be used to pattern the sealing layer 127 (see FIG. 14). In some embodiments, the mask layer 133 may be made of nitride, such as silicon nitride, the silicon-based material layer 134 may be made of SiON, and the photoresist layer 135 may be made of a $SiC_xH_yO_z$ material.

Figure 15A:
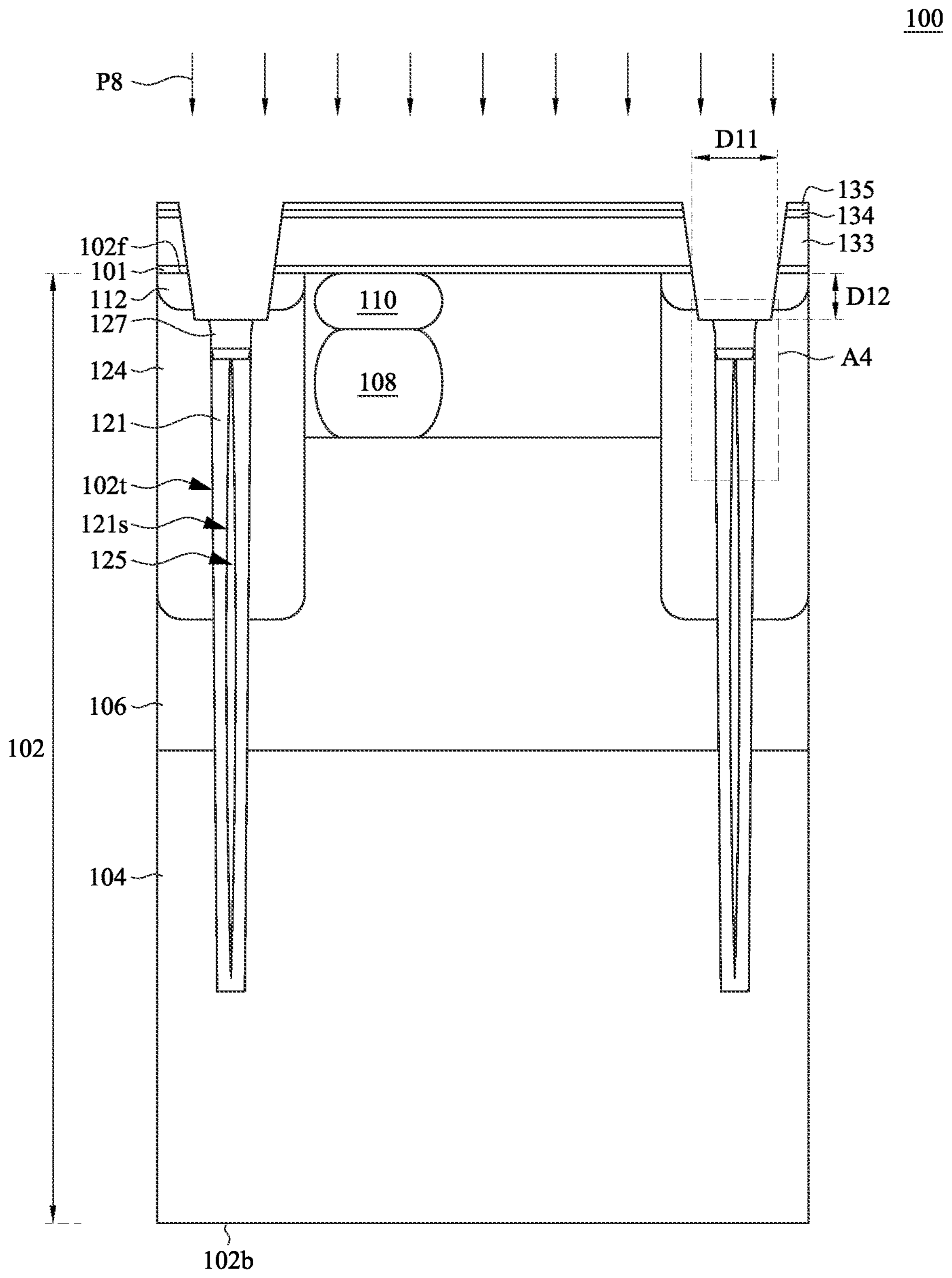
Figure 15B:
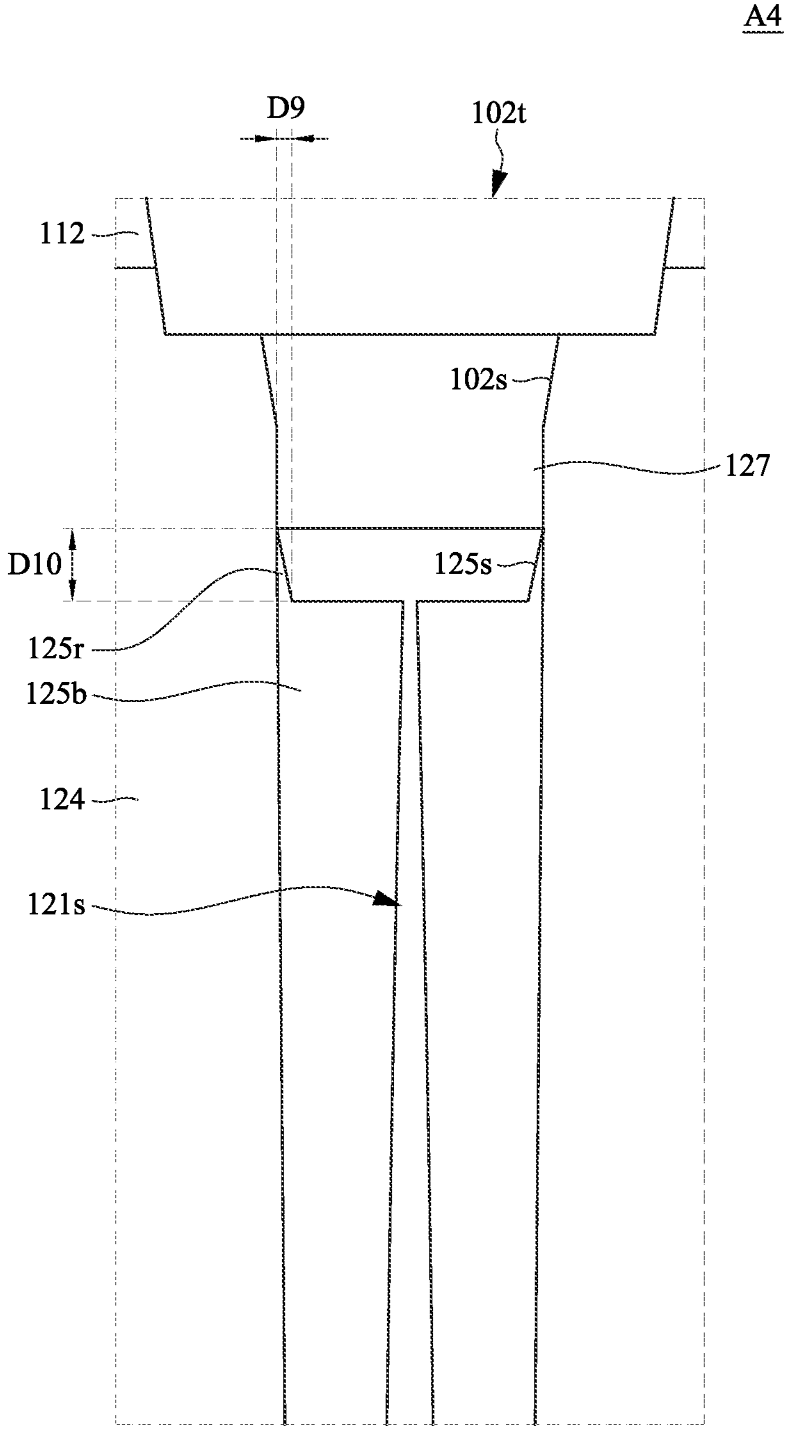

Reference is made to FIGS. 15A and 15B, an etching process P8 is performed on the substrate 102 and the sealing layer 127 through the mask layer 133, the silicon-based material layer 134, and the photoresist layer 135. Therefore, an upper portion of the sealing layer 127 can be removed, and at least a part of the upper portion of the trench 102*t* can reappear and be enlarged to have the lateral dimension D11. The lateral dimension D11 shown in FIG. 14 can be greater than the lateral dimension D5 shown in FIG. 5. In some embodiments, after the etching process P8 is complete, the upper portion of the trench 102*t* has a lateral dimension D11 decreasing as a vertical distance from the front side 102*f* of the substrate 102 increases. By way of example and not limitation, the lateral dimension D11 may be in a range from about 150 to 250 nm, such as 150, 160, 170, 180, 190, 200, 210, 220, 230, 240, or 250 nm. The upper portion of the trench 102*t* can have a vertical dimension D12 that is in a range from about 100 to 200 nm, such as 100, 110, 120, 130, 140, 150, 160, 170, 180, 190, or 200 nm. In some embodiments, the lateral dimension D11 can be greater than the vertical dimension D12. Subsequently, the silicon-based material layer 134 and the photoresist layer 135 can be stripped away (see FIG. 15A). In some embodiments, the silicon-based material layer 134 and the photoresist layer 135 may be removed by dry etching, wet etching, or a combination of dry and wet etching.

Figure 16:
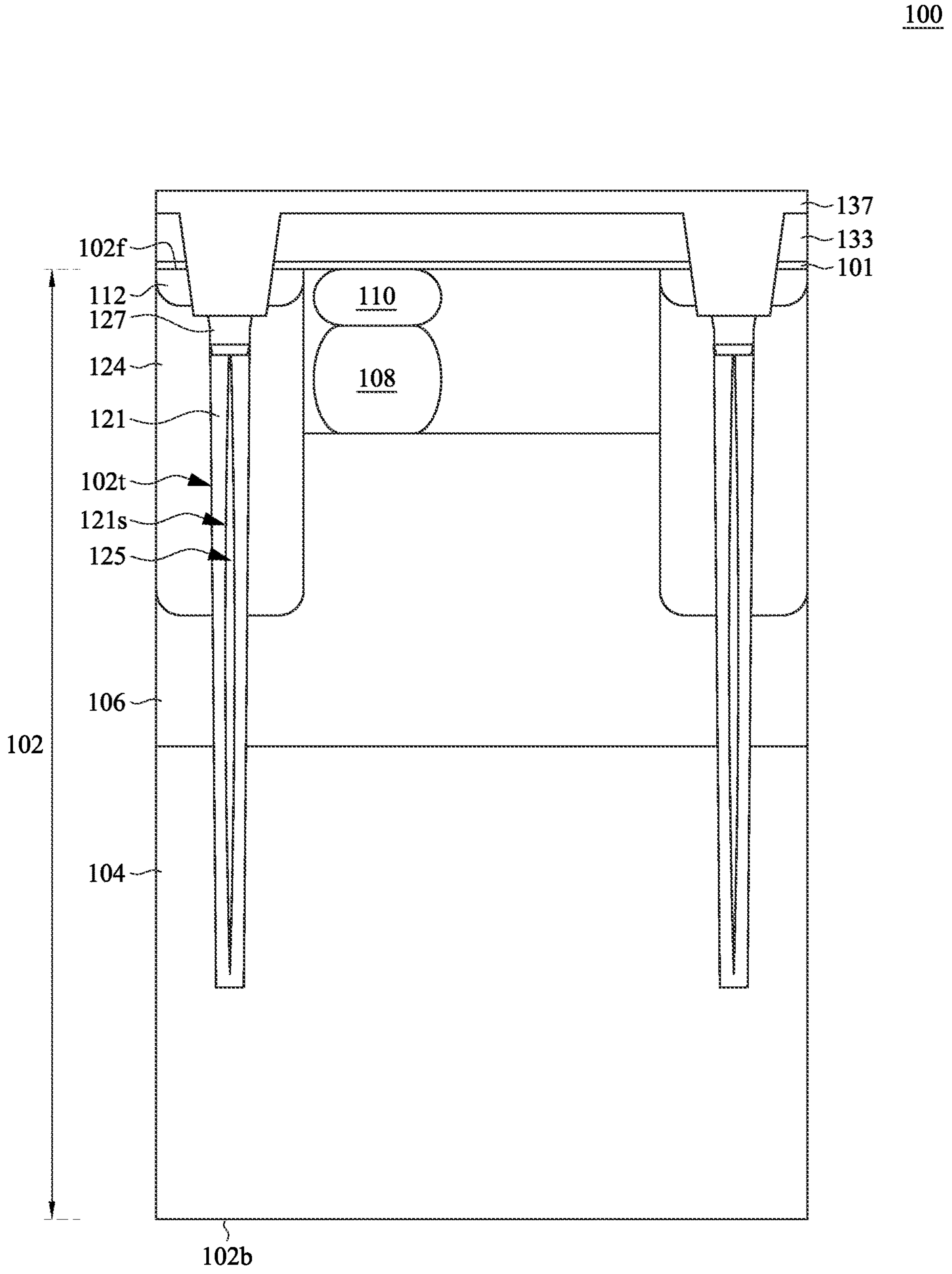

Reference is made to FIG. 16. A dielectric layer 137 can be deposited over the front side 102*f* of the substrate 102 and fill into the trench 102*t*. In some embodiments, the dielectric layer 137 can be interchangeably referred to as an oxide layer. By way of example and not limitation, the dielectric layer 137 may be made of a dielectric material such as silicon nitride (SiN), silicon oxide ($SiO_2$), silicon carbonitride (SiCN), silicon oxynitride (SiON), silicon oxy-carbonitride (SiOCN), or the like.

Figure 17:
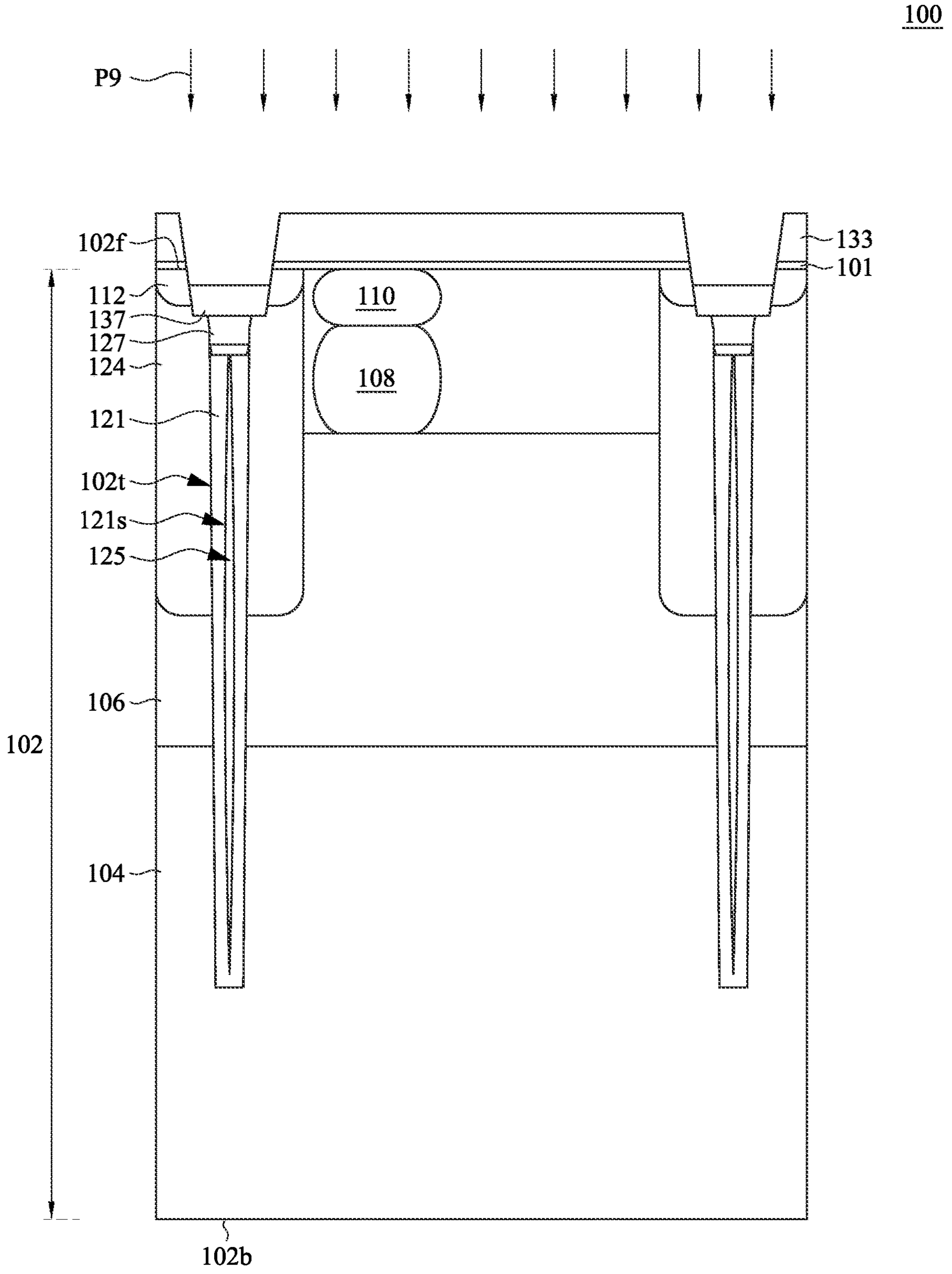

Reference is made to FIG. 17. An etching process P9 is performed on the dielectric layer 137 to recess the dielectric layer 137, such that the dielectric layer 137 can have a top surface lower than the front-side surface of the substrate 102. In some embodiments, after the etching process P9 is complete, the dielectric layer 137 can have a top surface in a position between a lower boundary of the node 112 and an upper boundary of the node 112. In some embodiments, the dielectric layer 137 can have a level back-side surface conformal to the front-side surface of the sealing layer 127. In some embodiments, the dielectric layer 137 can have a level top surface in parallel with the level bottom surface thereof. The etching process P9 can include dry etching, wet etching, reactive ion etching (RIE), and/or other suitable processes. In some embodiments, the etching process P9 may include a first planarization process, such as a chemical mechanical polishing (CMP) process, and a wet etching process, which follows the planarization process.

Figure 18:
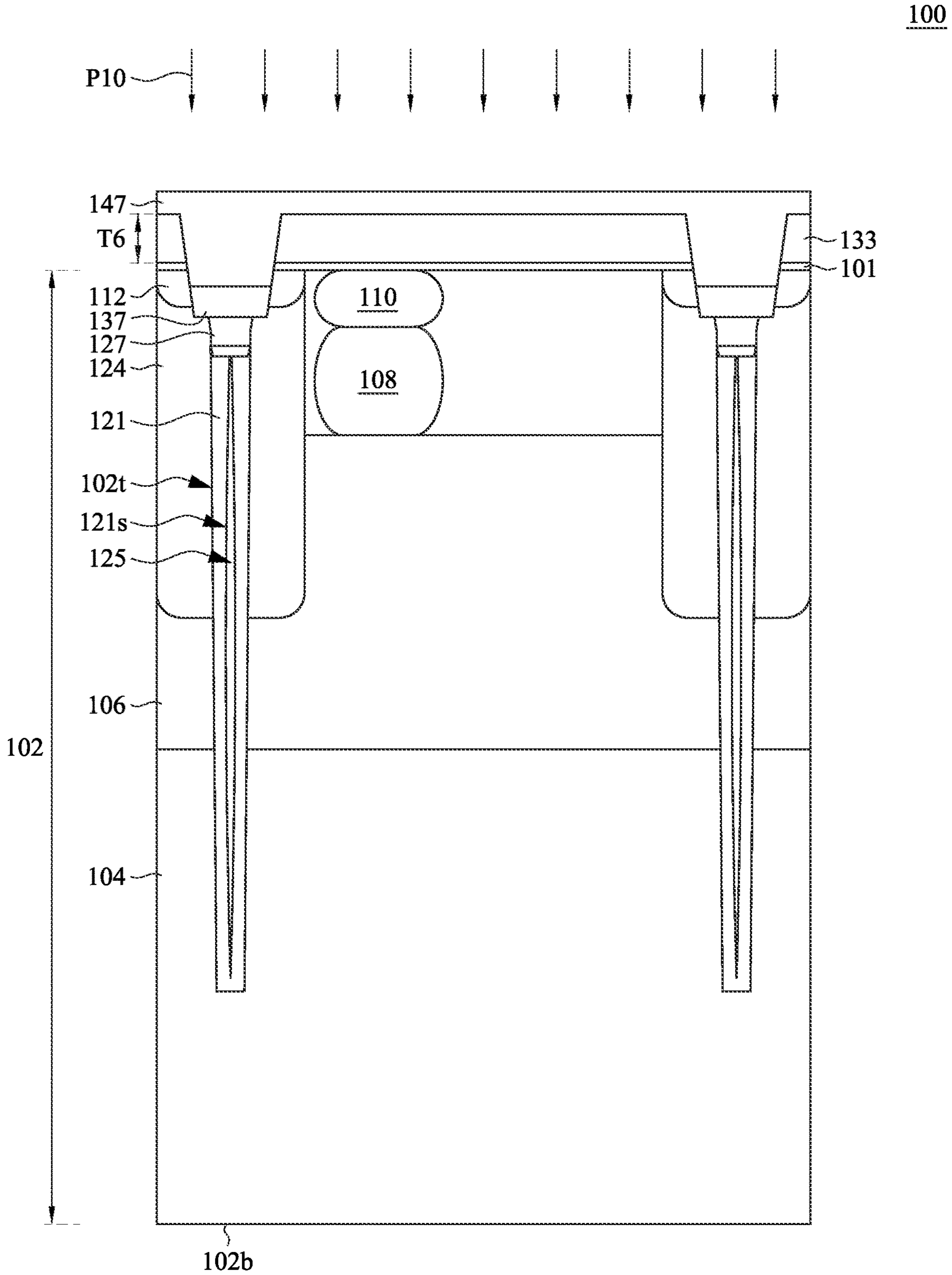

Reference is made to FIG. 18. A semiconductor layer 147 is formed over the substrate 102 and fills into a remainder of the trench 102*t* by a deposition process P10. In some embodiments, the semiconductor layer 147 can be made of a same material as the sealing layer 127. By way of example and not limitation, the semiconductor layer 147, made of polycrystalline silicon (poly-Si), contrasts with the sealing layer 127, which may be made of monocrystalline silicon. The semiconductor layer 147 of polycrystalline silicon can include of multiple small silicon crystals or grains. The deposition process P10 can be used to form the semiconductor layer 147 of polycrystalline silicon over the substrate 102, and thus the semiconductor layer 147 can be interchangeably referred to as a poly silicon layer. In some embodiments, the deposition process P10 for forming the semiconductor layer 147 is different than the deposition process P7 for forming the sealing layer 127. The deposition process P10 can be performed using techniques like chemical vapor deposition (CVD) process or physical vapor deposition (PVD) process.

During the deposition process P10, silicon atoms are delivered to the substrate surface, where they nucleate and grow, and the silicon atoms form multiple crystalline grains, resulting in a polycrystalline structure. The polycrystalline silicon layer fills the remainder of the trench 102*t*, conforming to the shape of the trench 102*t*. As the semiconductor layer 147 is deposited, it can adhere to the exposed surfaces within the trench 102*t*, including the top of the dielectric layer 137 and the sidewalls 102*s* of the trench 102*t*. The semiconductor layer 147 of polycrystalline silicon can have ability to conformally coat irregular surfaces (e.g., the inside of the trench 102*t*), and its electrical properties, which can be suitable for sensor applications. In some embodiments, the use of semiconductor layer 147 of polycrystalline silicon over sealing layer 127 can be driven by factors like cost-effectiveness, process compatibility, and desired electrical characteristics in the image sensor 100.

Figure 19:
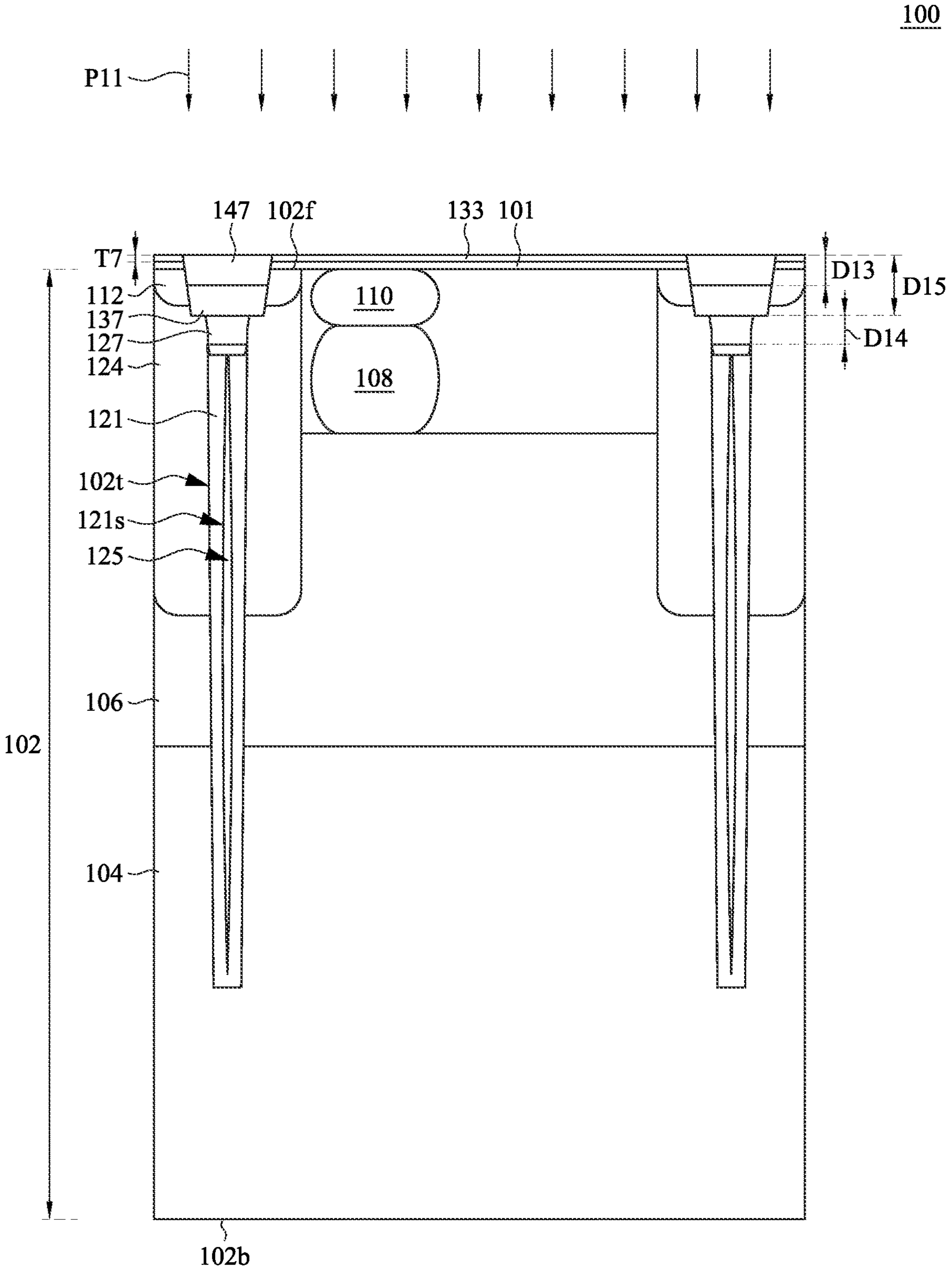
Figure 20:
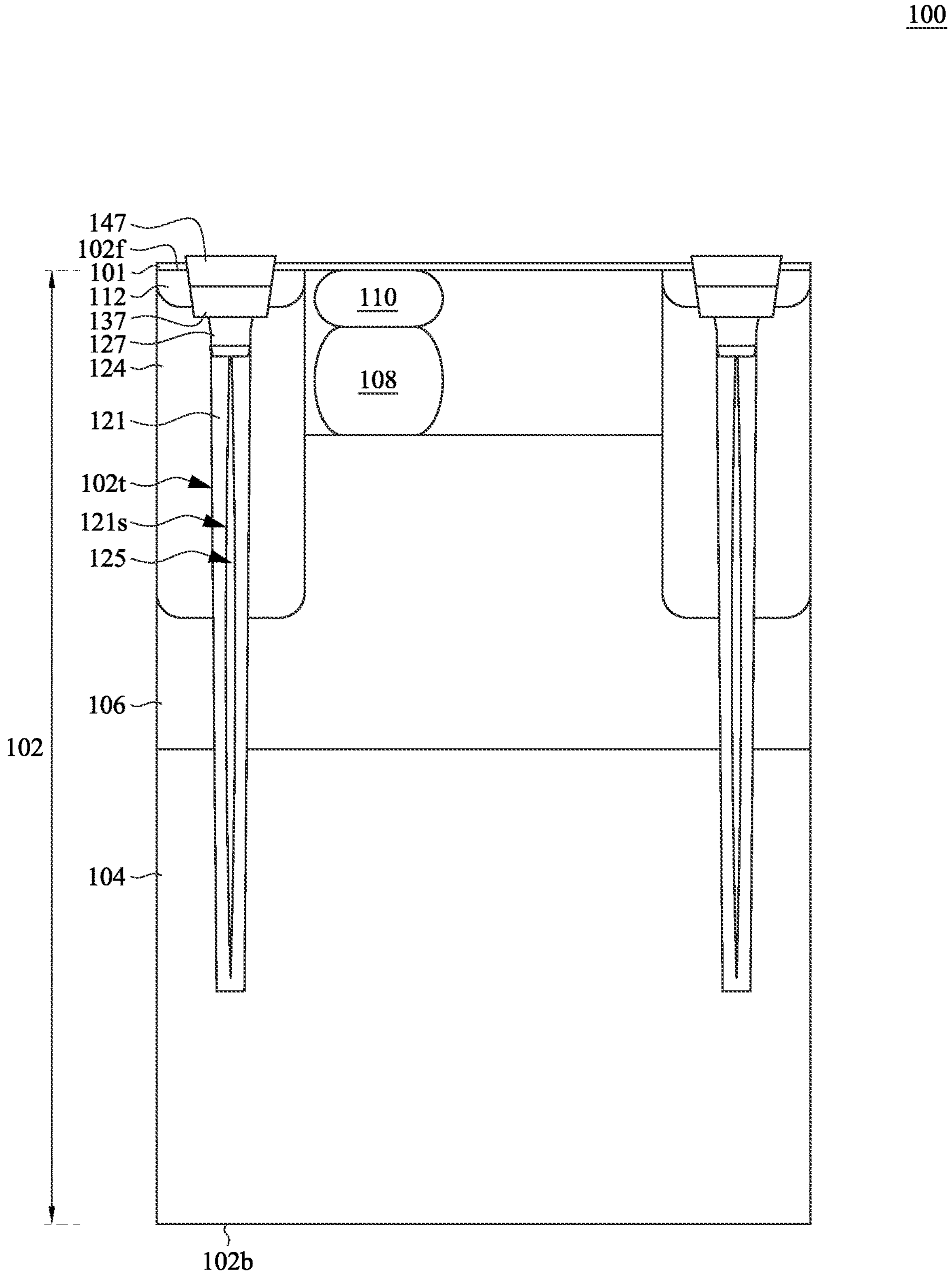

Reference is made to FIG. 19. An etching process P11 is performed on the semiconductor layer 147 to etch back the semiconductor layer 147. As shown in FIG. 19, the semiconductor layer 147 is located within the node 112 and can serve as an electrode of the node 112. The semiconductor layer 147 can be used in the charge-to-voltage conversion process that occurs at the node 112. Specifically, the electrons collected by the photodiode can be transferred to the node 112, where they are converted into a voltage signal by the semiconductor layer 147.

As shown in FIG. 19, the dielectric layer 137 is sandwiched between the sealing layer 127 and the semiconductor layer 147. The dielectric layer 137 can acts as an insulator, preventing electrical crosstalk and leakage between the semiconductor layer 147 and the sealing layer 127. The dielectric properties of the dielectric layer 137 is for maintaining the integrity of the electrical signals within the node 112 and for ensuring that the charge transfer process can be efficient and free from interference.

The etching process P9 can include dry etching, wet etching, reactive ion etching (RIE), and/or other suitable processes. In some embodiments, the etching process P11 can be a planarization process (e.g., a CMP process, or a grinding process) that is performed to remove portions of the semiconductor layer 147 overlying the mask layer 133 and thin down the semiconductor layer 147. In some embodiments, the etching process P11 may also remove portions of or all the mask layer 133, such that after the etching process P11, the mask layer 133 may have a thickness T7 thinner than a thickness T6 of the mask layer 133 shown in FIG. 18. In some embodiments, the semiconductor layer 147 can have the top surface in a position level with the top surface of the mask layer 133 and higher than the front-side surface of the pad layer 101 and the front-side surface of the substrate 102.

In some embodiments, the semiconductor layer 147 may have a vertical dimension (or thickness) D13 greater than a vertical dimension (or thickness) D14 of the sealing layer 127. By way of example and not limitation, the vertical dimension D13 of the semiconductor layer 147 can be in a range from about 150 to 400 nm, such as about 150, 200, 250, 300, 350, or 400 nm. The vertical dimension D14 of the sealing layer 127 can be in a range from about 20 to 100 nm, such as 20, 30, 40, 50, 60, 70, 80, 90, or 100 nm. In some embodiments, a combination of the thicknesses of the dielectric layer 137 and the semiconductor layer 147 can have a vertical dimension D15. The vertical dimension D15 can be greater than the vertical dimension D14 of the sealing layer 127. By way of example and not limitation, the vertical dimension D15 can be in a range from about 100 to 400 nm, such as about 100, 150, 200, 250, 300, 350, or 400 nm. As shown in FIG. 19, the sealing layer 127 can be formed with a footprint that is disposed within a footprint of the dielectric layer 137 and/or a footprint of the semiconductor layer 147. Subsequently, the mask layer 133 can be stripped away (see FIG. 20). In some embodiments, the mask layer 133 may be removed by dry etching, wet etching, or a combination of dry and wet etching.

Figure 21:
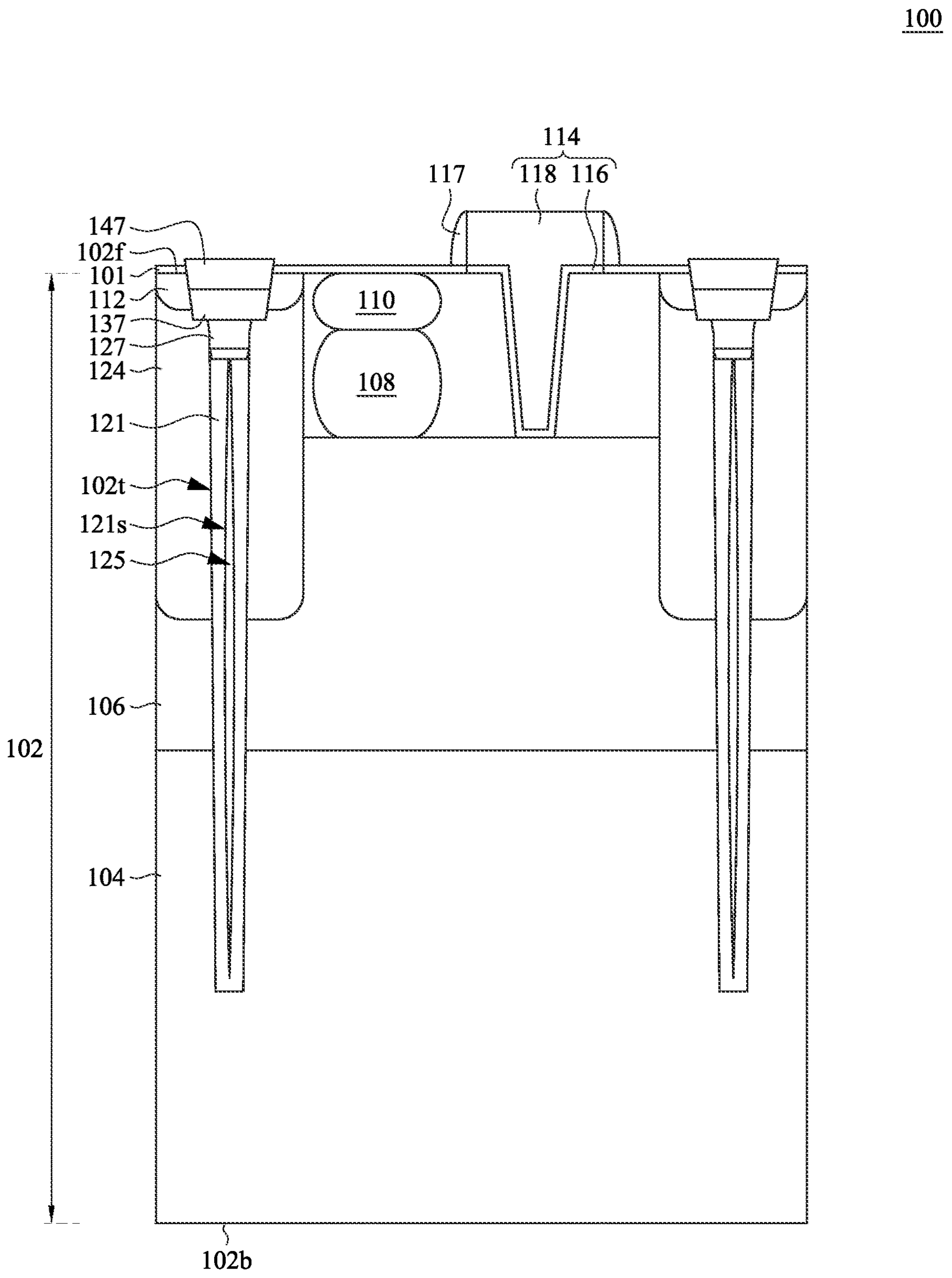

Reference is made to FIG. 21. A transfer gate 114 can be formed over/on the front side 102*f* of the substrate 102. The plurality of transfer gates are formed overlying, at least partially, the plurality of pixel regions 103 (see FIG. 1A), respectively. In some embodiments, each of the plurality of transfer gates 104 can be formed between two portions of the doped well 124. Each of the plurality of transfer gates 114 are formed with a gate dielectric structure 116 and a gate electrode structure 118. A spacer 117 can be formed on opposite sidewalls of the gate electrode structure 118 or laterally surround the gate electrode structure 118.

In some embodiments, a process for forming the plurality of transfer gates 114 can include forming a first patterned masking layer (not shown) (e.g., negative/positive photoresist, a hardmask, etc.) over the front side 102*f* of the substrate 102. With the first patterned masking layer in place over the front side 102*f* of the substrate 102, an etching process is then performed on the substrate 102. The etching process removes unmasked portions of the substrate 102, thereby forming a plurality of vertical gate trenches in the substrate 102. The etching process may be or comprise, for example, a wet etching process, a dry etching process, a RIE process, some other etching process, or a combination of the foregoing. Subsequently, in some embodiments, the patterned masking layer is then stripped away.

Thereafter, a gate dielectric layer (not shown) can be formed over/on the front side 102*f* of the substrate 102 and lining the plurality of vertical gate trenches. In some embodiments, the gate dielectric layer can be or include, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. A gate electrode layer (not shown) can be then formed on the gate dielectric layer and in the plurality of vertical gate trenches. In some embodiments, the gate electrode layer can be or include, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

Thereafter, a second patterned masking layer (not shown) (e.g., negative/positive photoresist, a hardmask, etc.) is formed over the gate electrode layer. With the second patterned masking layer in place, an etching process is performed on the gate electrode layer and the gate dielectric layer. The etching process removes unmasked portions of the gate electrode layer, thereby forming the gate electrode structures (see, e.g., the gate electrode structure 118 described herein). The etching process also removes unmasked portions of the gate dielectric layer, thereby forming the gate dielectric structures (see, e.g., the gate dielectric structure 116 described herein). In some embodiments, the etching process may be or comprise, for example, a wet etching process, a dry etching process, a RIE process, some other etching process, or a combination of the foregoing. Subsequently, in some embodiments, the second patterned masking layer is stripped away. In some embodiments, the spacer 117 may be or include, for example, a high-k dielectric material (e.g., HfO, TaO, HfSiO, HfTaO, AlO, ZrO, etc.), an oxide (e.g., $SiO_2$), a nitride (e.g., SiN), an oxy-nitride (e.g., SiON), a carbide (e.g., silicon carbide (SiC)), some other dielectric material, or a combination of the foregoing.

Figure 22:
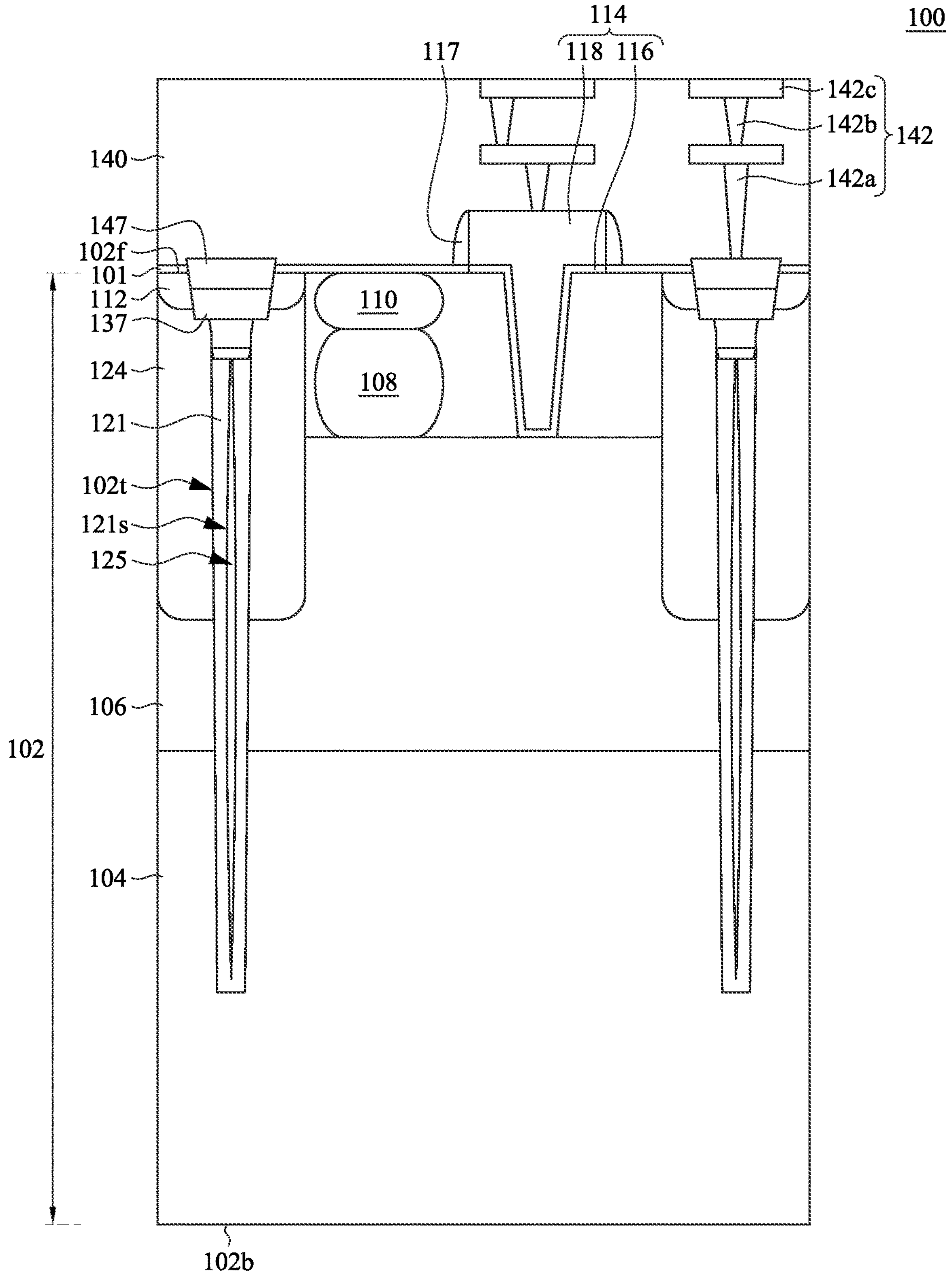

Reference is made to FIG. 22. An ILD structure 140 is formed over the front side 102*f* of the substrate 102 and over the plurality of transfer gates 114. An interconnect structure 142 is formed in the ILD structure 140 and over the front side 102*f* of the substrate 102. In some embodiments, the interconnect structure 142 can include a plurality of conductive contacts 142*a*, a plurality of conductive vias 142*b*, and a plurality of conductive wires 142*c*.

In some embodiments, a process for forming the ILD structure 140 and the interconnect structure 142 comprises forming a first ILD layer over the front side 102*f* of the substrate 102. Thereafter, contact openings are formed in the first ILD layer. A conductive material (e.g., tungsten (W), cupper (Cu), aluminum (Al)) is then formed on the first ILD layer and in the contact openings. Thereafter, a planarization process (e.g., chemical-mechanical planarization (CMP)) is performed on the conductive material to form the plurality of conductive contacts 142*a* in the first ILD layer. A second ILD layer is then formed over the first ILD layer and the plurality of conductive contacts 142*a*. A plurality of trenches are then formed in the second ILD layer. A conductive material (e.g., copper (Cu)) is formed on the second ILD layer and in the trenches. Thereafter, a planarization process (e.g., CMP) is performed into the conductive material to form a first group of conductive wires of the plurality of conductive wires 142*c* (e.g., the conductive wires of a first layer of conductive wires (e.g., metal layer 1)).

Thereafter, the plurality of conductive vias 142*b* and the remaining conductive wires of the plurality of conductive wires 142*c* of the interconnect structure 142 may be formed by repeating a damascene process (e.g., a single damascene process or a dual damascene process) until a predefined number of conductive vias and conductive wires are formed in the ILD structure 140. The damascene process may be performed by depositing a subsequent ILD layer over the second ILD layer and the first group of conductive wires of the plurality of conductive wires 142*c*, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming a second group of conductive wires of the plurality of conductive wires 142*c* (e.g., the conductive wires of a second layer of conductive wires (e.g., metal layer 2)) and/or the conductive vias of the plurality of conductive vias 142*b* that extend vertically between the first group and the second group of conductive wires. This damascene process is repeated until each of the plurality of conductive vias 142*b* and each of the plurality of conductive wires 142*c* of the interconnect structure 142 are formed in the ILD structure 140. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 23:
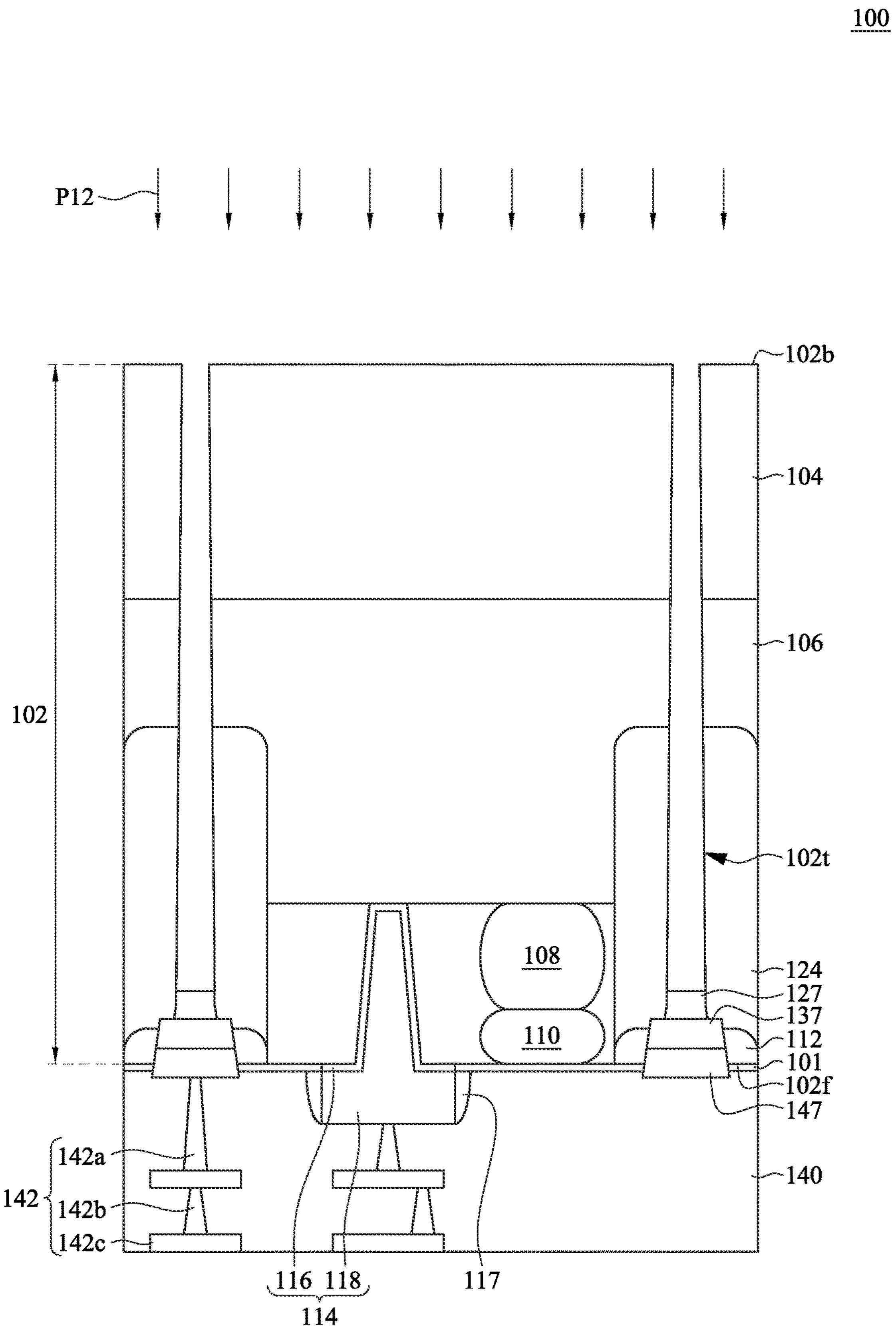

Reference is made to FIG. 23. The structure of FIG. 22 is "flipped" upside down. Subsequently, the substrate 102 can be thinned down through at least one removal process, for example, CMP, HNA, and/or TMAH etching from the back side 102*b* of the substrate 102, and thus the dielectric layer 121 can be exposed from the back side 102*b* of the substrate 102. In some embodiments, after the substrate 102 is thinned down, the substrate may have a thickness in a range from about 1000 to 5000 nm, such as about 1000, 1500, 2000, 2670, 2500, 3000, 3500, 4000, 4500, or 5000 nm. Subsequently, the dielectric layer 121 is removed from the back side 102*b* of the substrate 102 through a removal process P12. During the removal process P12, the sealing layer 127 may be used as etch stop layers when the dielectric layer 121 is etched. In some embodiments, the removal process P12 may include, for example, a wet etching process, a dry etching process, a reactive ion etching (RIE) process, some other etching process, or a combination of the foregoing. The removal process P12 can selectively etch the dielectric layer 121 at a faster rate than the substrate 102 and the sealing layer 127. By way of example but not limiting the present disclosure, the removal process P12 may be performed using dilute hydrofluoric (dHF) acid.

Figure 24:
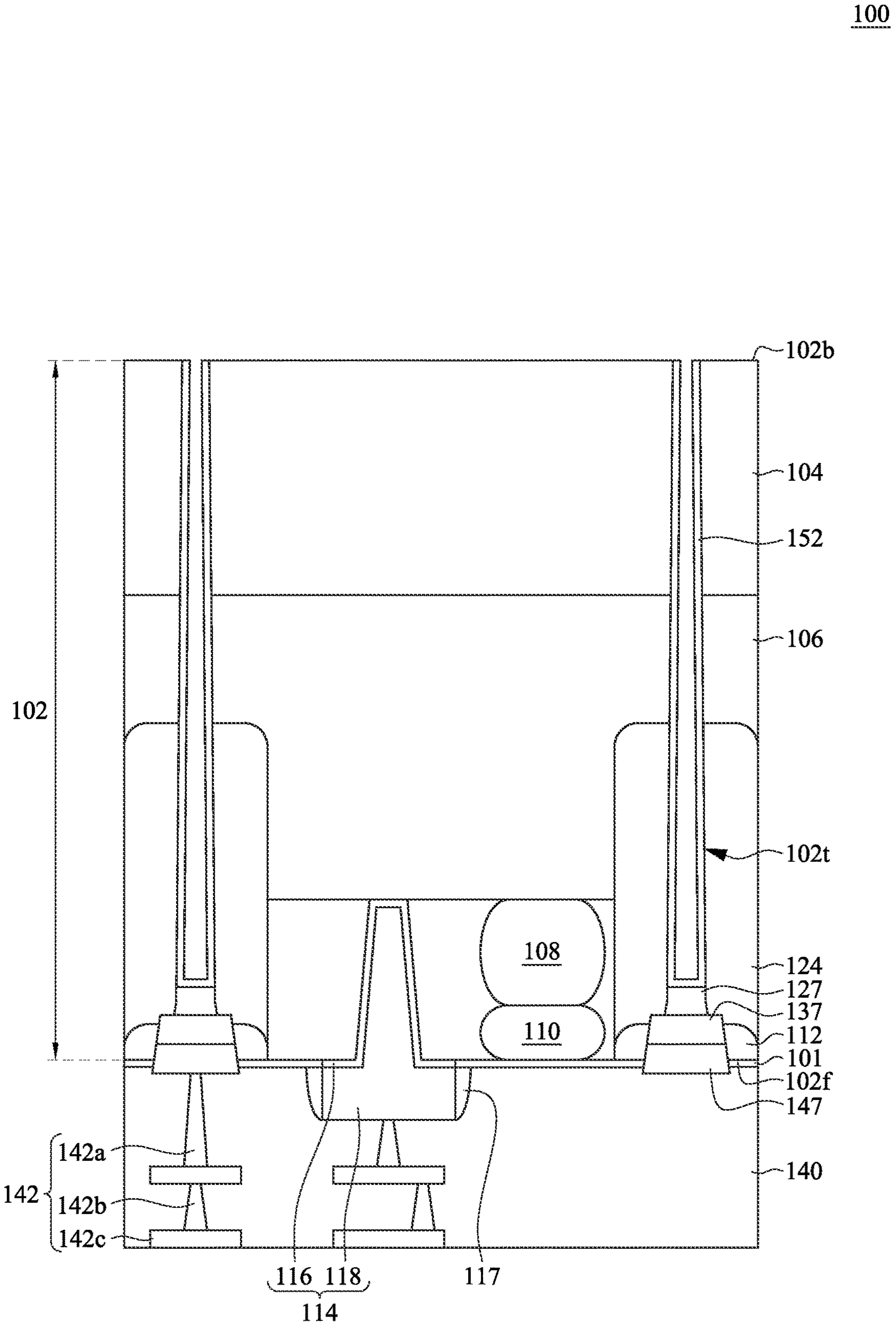

Reference is made to FIG. 24. A dielectric liner 152 is formed lining surfaces of the trench 102*t* (e.g., sidewalls of the trench 102*t*, lower surfaces of the trench 102*t*, etc.) from the back side 102*b* of the substrate 102. In some embodiments, the dielectric liner 152 is formed contacting (e.g., directly contacting) the first doped region 104, the second doped region 106, the node 112, and the doped well 124. In some embodiments, the dielectric liner 152 can be omitted. In some embodiments, a process for forming the dielectric liner 152 can include depositing a dielectric liner layer (not shown) over the back side 102*b* of the substrate 102 and along the surfaces of the trench 102*t*. The dielectric liner layer may be or include, for example, a high-k dielectric material (e.g., HfO, TaO, HfSiO, HfTaO, AlO, ZrO, etc.), an oxide (e.g., $SiO_2$), a nitride (e.g., SiN), an oxy-nitride (e.g., SiON), a carbide (e.g., silicon carbide (SiC)), some other dielectric material, or a combination of the foregoing. The dielectric liner layer may be deposited by, for example, CVD, PVD, ALD, some other deposition process, or a combination of the foregoing. Thereafter, an upper portion of the dielectric liner layer over the back side 102*b* of the substrate 102 can be removed, thereby leaving remaining portions in place as the dielectric liner 152. In some embodiments, the upper portion of the dielectric liner layer may be removed by, for example, a planarization process (e.g., chemical-mechanical planarization (CMP)), an etching process (e.g., wet etching, dry etching, etc.), some other removal process, or the like.

Figure 25A:
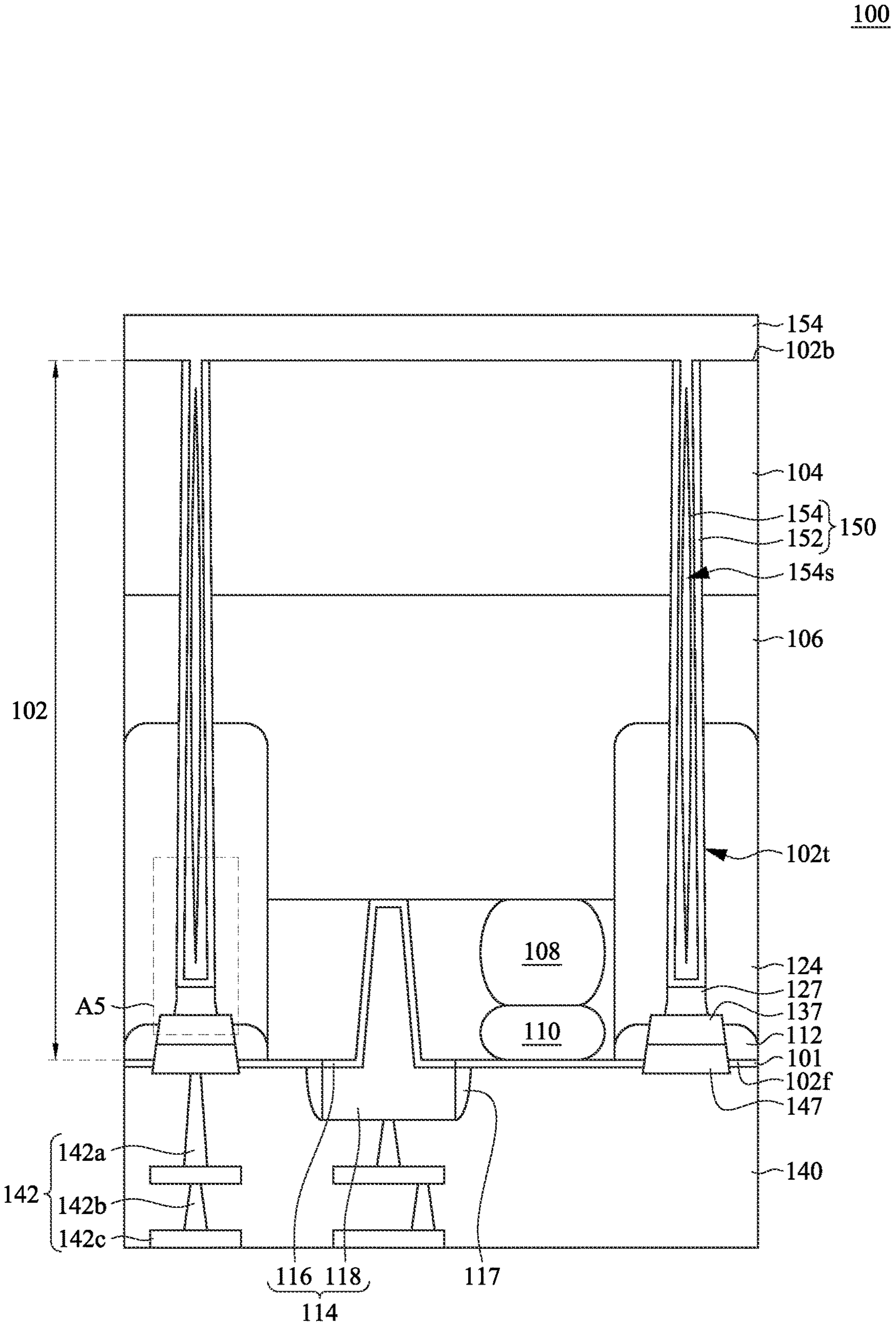
Figure 25B:
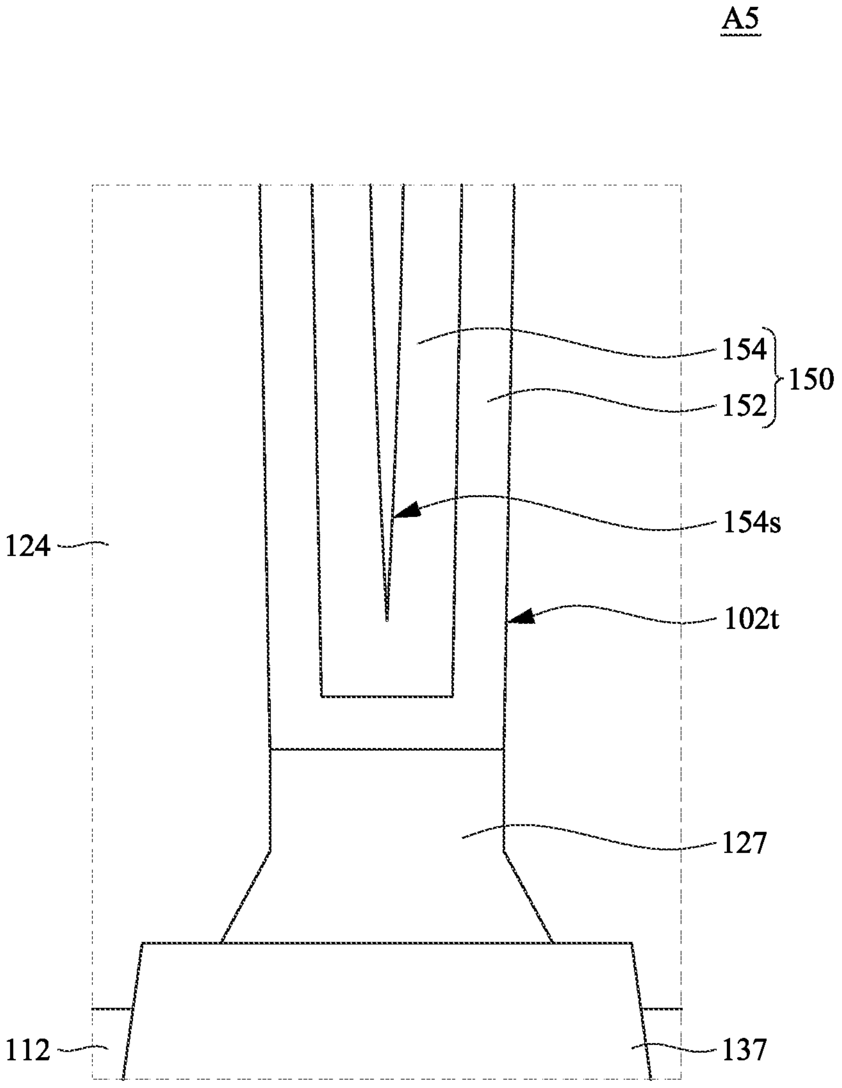
Figure 25C:
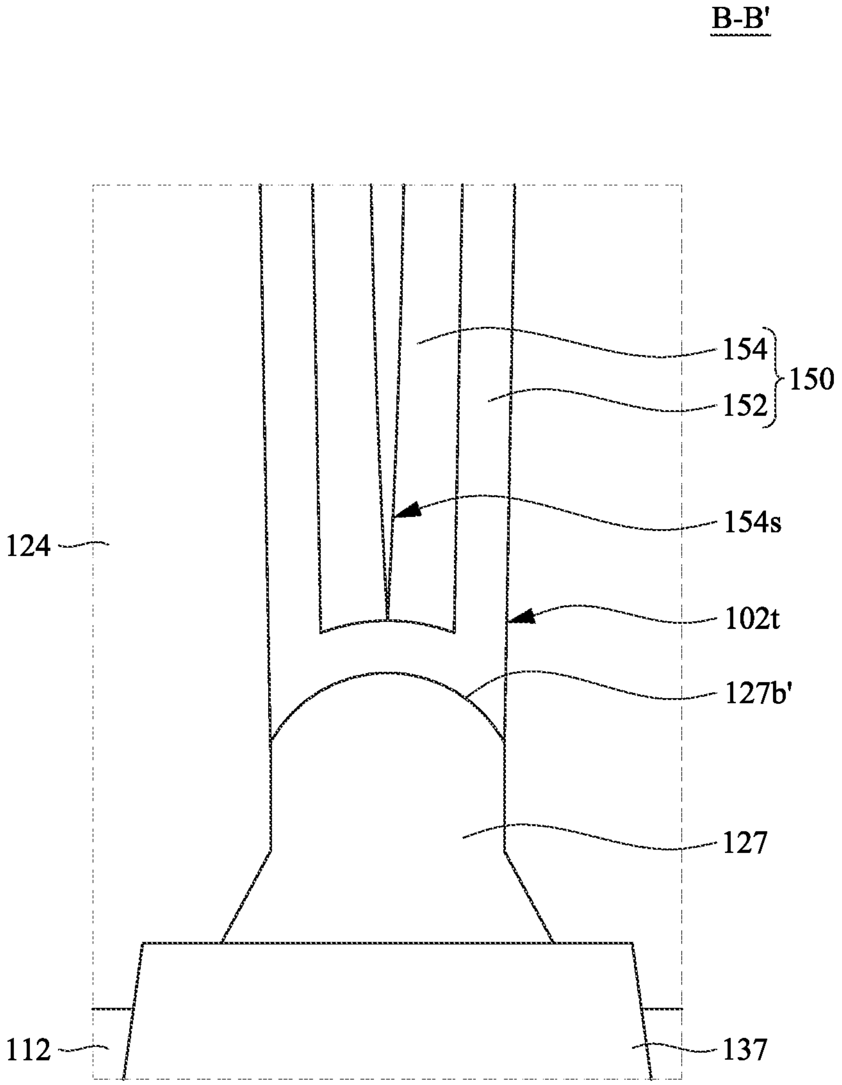

Reference is made to FIGS. 25A-25C. A dielectric filler 154 is deposited over the back side 102*b* of the substrate 102 and fills into the trench 102*t*. The dielectric filler 154 can be used to provide electrical insulation and/or structural integrity to the image sensor 100. In some embodiments, forming the dielectric filler 154 over the dielectric liner 152 can complete formation of a deep trench isolation (DTI) structure 150 in the trench 102*t*. In other words, the dielectric liner 152 and the dielectric filler 154 in the trench 102*t* can be collectively referred to the deep trench isolation structure 150 that may inherit the profile of the trench 102*t*. In some embodiments, the dielectric filler 154 over the back side 102*b* of the substrate 102 may have a thickness in a range from about 50 to 300 nm, such as about 50, 100, 143, 150, 200, 250, or 300 nm.

In the cross-sectional view, the deep trench isolation structure 150 can be characterized by the positioning of the node 112 directly above the deep trench isolation structure 150. The deep trench isolation structure 150 can be a deeply etched trench in the substrate 102, which is filled with dielectric materials to isolate the components of the sensor from each other, thereby reducing electronic noise and crosstalk between pixels. When viewed from the top, the deep trench isolation structure 150 can reveal that the node 112 is located at the intersection (or cross-road) of the isolation grid 156 (see FIG. 26).

In some embodiments, the deep trench isolation structure 150 can be interchangeably referred to a floating diffusion trench isolation (FDTI), and thus the image sensor 100 can be interchangeably referred to a FDTI-CMOS image sensor (FDTI-CIS). The deep trench isolation structure 150 is formed with a footprint that is disposed within the footprint of the doped well 124, which in turn reduces the size of the pixel region 103. As shown in FIGS. 25B and 25C, the sealing layer 127 is positioned between the node 112 and the deep trench isolation structure 150. The sealing layer 127 can act as a barrier or an etch stop layer during the manufacturing process to protect the underlying structures during subsequent etching and processing steps (see FIG. 23). In some embodiments, a planarization process (e.g., CMP) can be performed on the dielectric filler 154 to planarize a back-side surface of the dielectric filler 154. In further embodiments, the planarization process (and/or some other removal process) can be performed on the dielectric filler 154 to remove a portion of the dielectric filler 154 over the back side 102*b* of the substrate 102.

As shown in FIGS. 25A-25C, the deep trench isolation structure 150 can vertical sidewalls, which indicate the sidewalls of the deep trench isolation structure 150 formed in the substrate 102 can be perpendicular to the front-side surface of the substrate 102 and/or the back-side surface of the substrate 102. This vertical alignment can be used to create well-defined, isolated regions for each pixel in the sensor array. As shown in FIG. 25B, when viewed from the cross-sectional view taken along line A-A' (e.g., xy-cut) as shown in FIG. 1A, the deep trench isolation structure 150 can have a flat front-side surface perpendicular to the sidewalls thereof, and thus the deep trench isolation structure 150 can have a square front-side profile. This square profile shown in FIG. 25B is in direct contact with and conformal to the sealing layer 127. As shown in FIG. 25C, when viewed from the cross-sectional view taken along line B-B' (e.g., x-cut) as shown in FIG. 1A, the deep trench isolation structure 150 can have a concave front-side surface, and thus a front-side of the deep trench isolation structure 150 can have a concave front-side profile. This concave profile shown in FIG. 25C is in direct contact with and conformal to the sealing layer 127. In some embodiments, the sidewall of the deep trench isolation structure 150 is coterminous to the sidewall of the sealing layer 127.

The dielectric filler 154 can be formed to have a seam 154*s* therein within the trench 102*t*. In some embodiments, the seam 154*s* can be interchangeably referred to as an air gap. In some embodiments, the seam 154*s* may have a first distance to the front side 102*f* of the substrate 102, and the first distance can be in a range from about 60 to 100 nm, such as about 60, 65, 70, 75, 80, 85, 90, 95, or 100 nm. In some embodiments, the seam 154*s* may have a second distance to the back side 102*b* of the substrate 102, and the second distance can be in a range from about 20 to 50 nm, such as about 20, 25, 28, 30, 35, 40, 45, or 50 nm.

By way of example and not limitation, the dielectric filler 154 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like. The dielectric layer 123 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like. In some embodiments, the trench 102*t* can be filled only with dielectric filler 154 but not with the dielectric liner 152. In some embodiments, the dielectric filler 154 can be interchangeably referred to a dielectric layer or an isolation layer. In some embodiments, the dielectric filler 154 can be deposited using a plasma enhanced atomic layer deposition (PEALD) process. The plasma enhanced atomic layer deposition process can use plasma to enhance chemical reactions at the surface to form the dielectric filler 154. By using the plasma enhanced atomic layer for deposition, the dielectric filler 154 can adhere well to the underlying structures, maintains uniform thickness across the substrate 102. The use of plasma in the ALD process can also enhance the quality of the dielectric layer by improving its density and uniformity.

The deep trench isolation structure 150 extends partially through the substrate 102 (e.g., not fully through the substrate 102) from the back side 102*b* of the substrate 102, thereby extending vertically through doped well 124, the second doped region 106, and the first doped region 104. In such embodiments, the deep trench isolation structure 150 can expose portions of the first doped region 104 and portions of the second doped region 106. In some embodiments, the deep trench isolation structure 150 may have angled sidewalls. In other embodiments, the sidewalls of the deep trench isolation structure 150 may be substantially straight (e.g., vertical).

The deep trench isolation structure 150 is formed extending laterally through the substrate 102, such that the deep trench isolation structure 150 laterally surrounds the plurality of pixel regions 103. The deep trench isolation structure 150 is formed with a footprint that is disposed within the footprint of the doped well 124. In some embodiments, the second doped region 106 continuously extends laterally between opposite inner sidewalls of the deep trench isolation structure 150. In some embodiments, the second doped region 106 continuously extends laterally between the opposite inner sides of the doped well 124 and continuously extends laterally between the opposite inner sidewalls of the deep trench isolation structure 150. In some embodiments, the first doped region 104 continuously extends laterally between the opposite inner sidewalls of the deep trench isolation structure 150. In some embodiments, a layout of the trench 102*t* has a grid-like shape. As such, the footprint of the deep trench isolation structure 150 has the grid-like shape. In such embodiments, the grid-like shaped footprint of the deep trench isolation structure 150 is disposed within a grid-like shaped footprint of the doped well 124.

Figure 26:
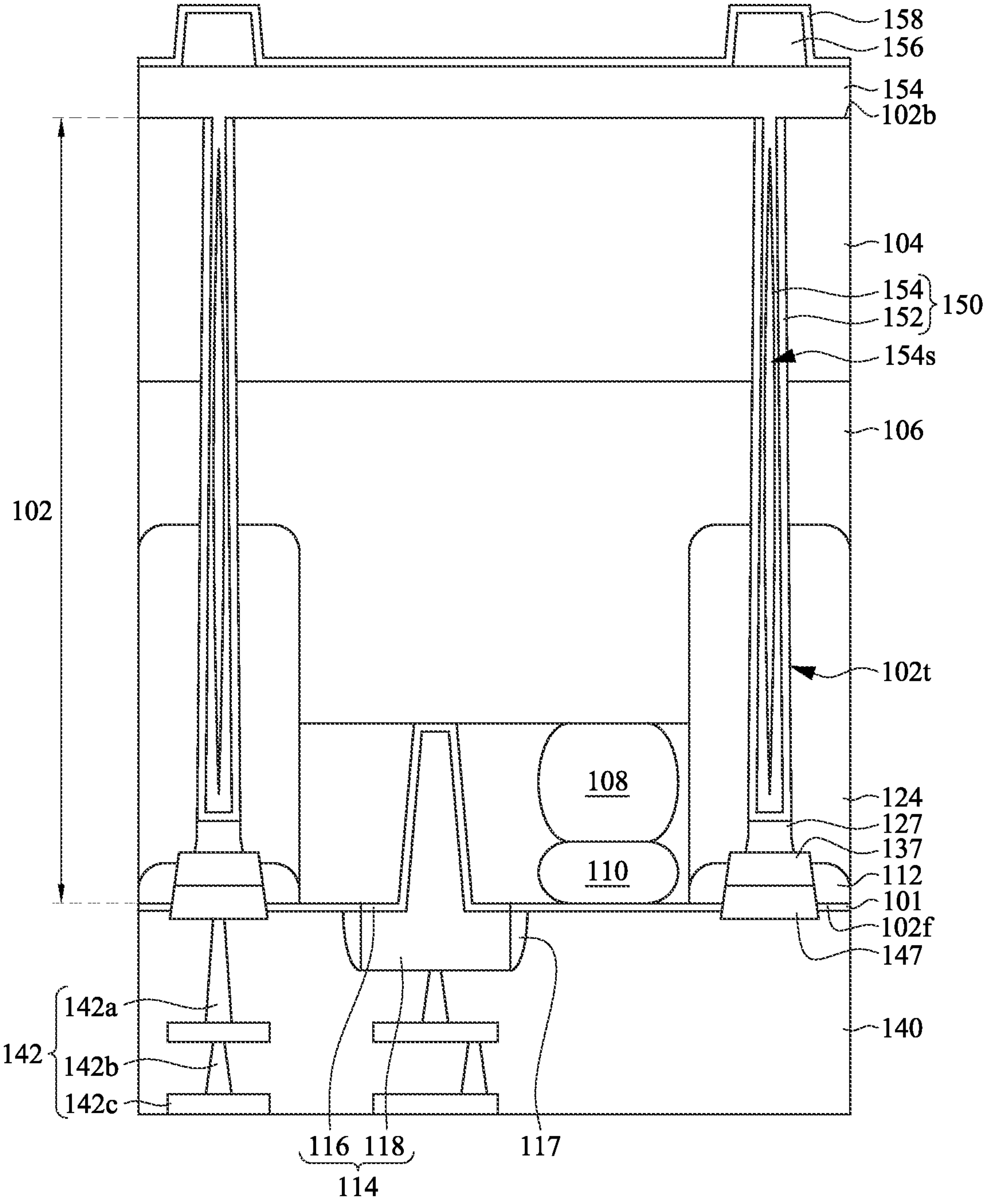

Reference is made to FIG. 26. An isolation grid 156 is formed over a back-side surface of the dielectric filler 154 over the substrate 102. In other embodiments, the isolation grid 156 may be formed along the back side 102*b* of the substrate 102. In further embodiments, the isolation grid 156 can be formed overlying the deep trench isolation structure 150. In some embodiments, a process for forming the isolation grid 156 may include forming a patterned masking layer (not shown), which has a trench disposed therein, over the back-side surface of the dielectric filler 154. Thereafter, an isolation material is deposited on the patterned masking layer and in the trench. The isolation material may be or include, for example, a metal (e.g., tungsten (W), aluminum (Al), cobalt (Co), copper (Cu), silver (Ag), gold (Au), some other metal, or a combination of the foregoing), an oxide (e.g., $SiO_2$), a nitride (e.g., SiN), a carbide (e.g., SiC), a high-k dielectric material (e.g., HfO, TaO, etc.), a low-k dielectric material, some other isolation material, or a combination of the foregoing. Thereafter, a planarization process is performed (e.g., CMP, etch back process, etc.) on the isolation material to remove an upper portion of the isolation material, thereby leaving lower portions of the isolation material in the trench as the isolation grid 156. Subsequently, in some embodiments, the patterned masking layer can be stripped away.

A dielectric layer 158 is formed over the over the back-side surface of the dielectric filler 154 and over the isolation grid 156. In other embodiments, the dielectric layer 158 may be formed along the back side 102*b* of the substrate 102 and over the isolation grid 156. The dielectric layer 158 may be deposited to form by, for example, CVD, PVD, ALD, sputtering, some other deposition process, or a combination of the foregoing.

Figure 27:
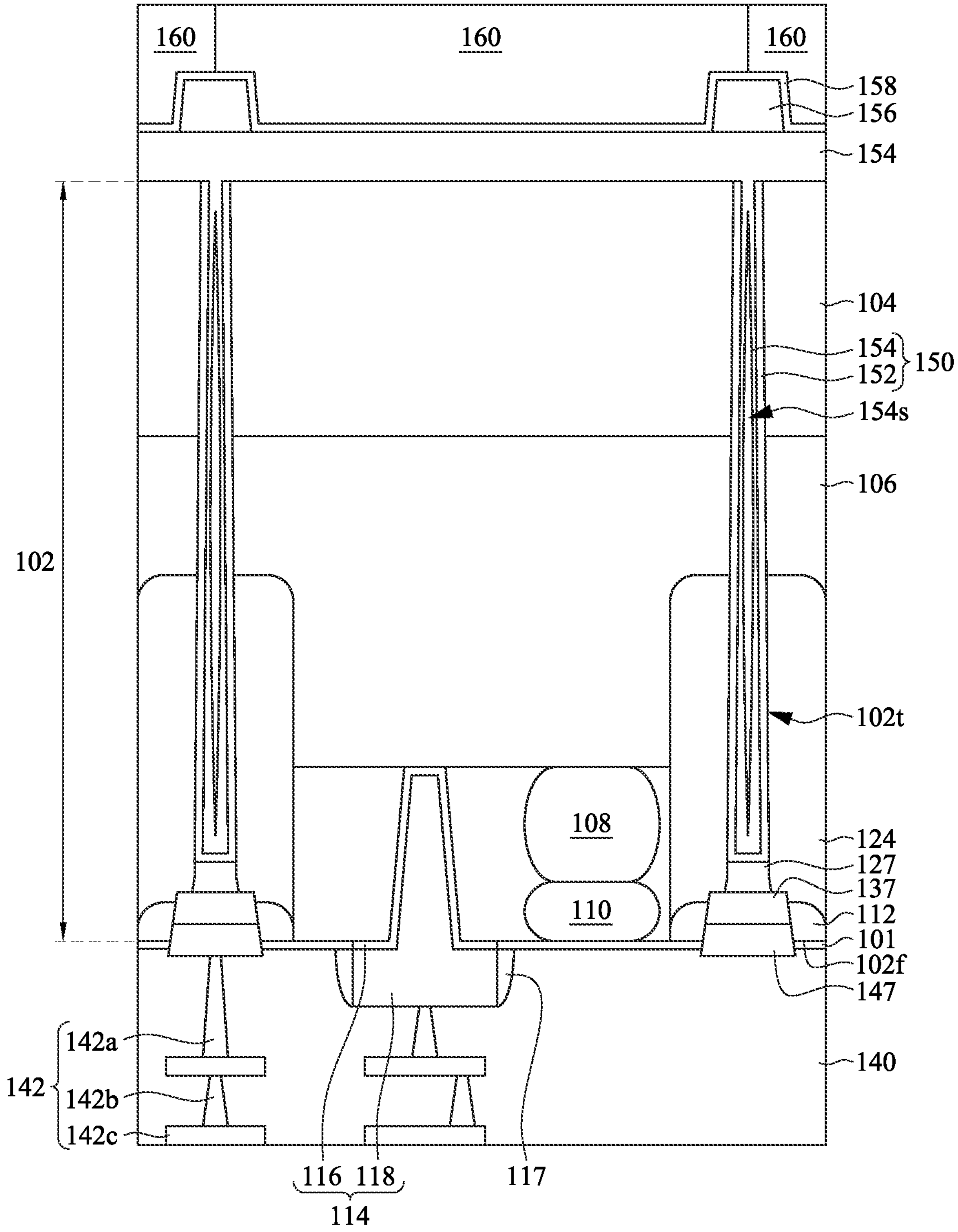

Reference is made to FIG. 27. A plurality of electromagnetic radiation (EMR) filters 160 are formed on/over the dielectric layer 158 and within the isolation grid 156. In some embodiments, a process for forming the plurality of EMR filters 160 can include depositing (e.g., via CVD, PVD, ALD, sputtering, a spin-on process, etc.) one or more light filtering materials onto the dielectric layer 158 and within the isolation grid 156. The one or more light filtering materials are materials that allow for the transmission of radiation (e.g., light) having a specific wavelength range, while blocking light of wavelengths outside of the specified range. Subsequently, in some embodiments, a planarization process (e.g., CMP) may be performed on the plurality of EMR filters 160 to planarize the upper surface of the plurality of EMR filters.

Figure 28A:
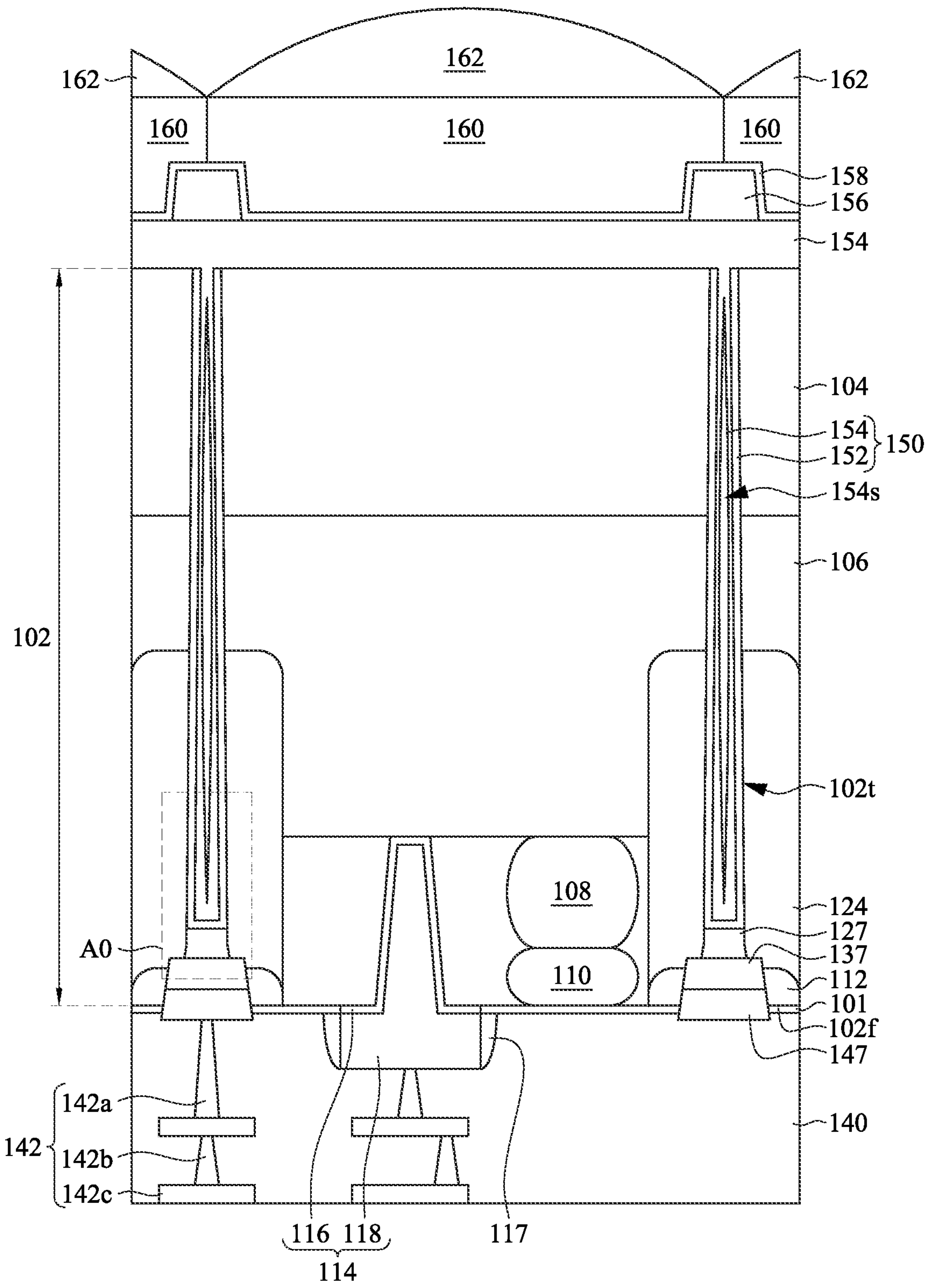
Figure 28B:
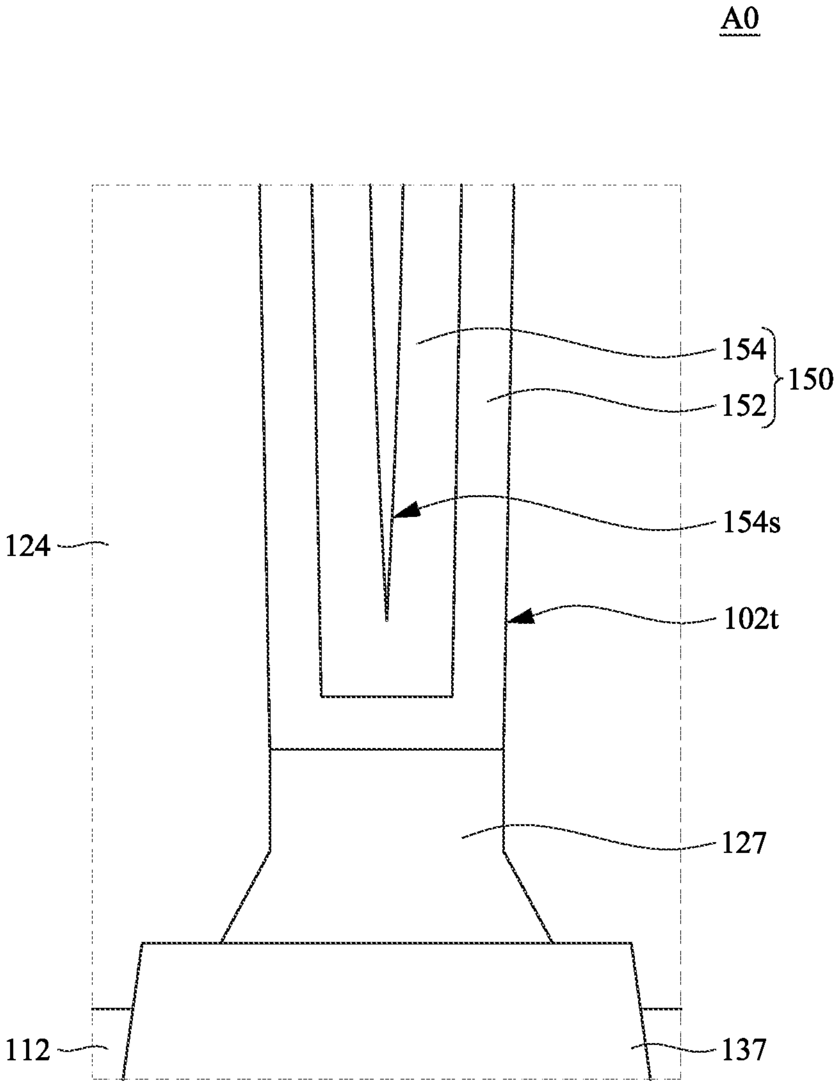

Reference is made to FIGS. 28A and 28B. A plurality of micro-lenses 162 are formed on/over the plurality of EMR filters 160. In some embodiments, the plurality of micro-lenses 162 may be formed by depositing a micro-lens material on the plurality of EMR filters 160 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The plurality of micro-lenses are then formed by selectively etching the micro-lens material according to the micro-lens template. In some embodiments, after the plurality of micro-lenses 162 are formed, formation of a plurality of pixel sensor units 107 (see FIG. 1D) is complete. In further embodiments, after the plurality of micro-lenses 162 are formed, formation of the image sensor 100 can be complete. In some embodiments, the image sensor 100 can be interchangeably referred to as a back-side illumination configuration.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a FDTI-CIS using selective silicon epitaxial growth (SEG) for the sealing layer to prevent polysilicon deposition in the oxide seam of FDTI structure. The SEG can be utilized for control of the sealing layer's profile over the FDTI structure, ensuring accurate layer formation. The sealing layer can be in a crystalline state to have a higher etching resistance to prevent the etchant from damaging the dielectric layer over the sealing layer. In addition, before forming the sealing layer over the oxide of the FDTI structure, a dry etch process (e.g., capacitively coupled plasma) can create a thin oxide layer on the FDTI sidewall. Subsequently, a weak pre-clean process (e.g., SiCoNi) followed by cyclic deposition and annealing can be incorporated to scale down the thin oxide layer. Therefore, the sealing layer can form a flat Si-EPI merged-plane over the thin oxide layer, which in turn allowing for yielding a high-quality sealing layer, and thus the performance of the image sensor can be enhanced.

In some embodiments, a method includes forming a doped region in a semiconductor substrate, wherein the doped region is of a first conductivity type; forming a doped well vertically extending from a front side of the semiconductor substrate into the doped region, wherein the doped well is of a second conductivity type opposite to the first conductivity type; forming a transfer gate over the front side of the semiconductor substrate and laterally between a first portion of the doped well and a second portion of the doped well; forming a trench vertically extending form the front side of the semiconductor substrate through the doped well toward a back side of the semiconductor substrate; depositing an dielectric material over the front side of the semiconductor substrate and in the trench; recessing the dielectric material, such that the recessed dielectric material has a top surface lower than the front side of the semiconductor substrate; performing a selective epitaxial growth process to form a sealing layer in the trench and over the recessed dielectric material from the front side of the semiconductor substrate; forming an electrode in the trench and over the sealing layer from the front side of the semiconductor substrate. In some embodiments, the step of recessing the dielectric material comprises: performing a planarization process to remove the dielectric material located outside the trench; after performing the planarization process, performing a dry etching process to recess the dielectric material. In some embodiments, the dry etching process comprises an etchant including $C_4F_8$. In some embodiments, the dry etching process is performed such that the recessed dielectric material has a sharp protrusion on a top thereof. In some embodiments, the method further incudes after performing the dry etching process, performing a pre-clean process on the recessed dielectric material to scale down the sharp protrusion. In some embodiments, the pre-clean process comprises an etchant including HF and $NH_3$. In some embodiments, the selective epitaxial growth process comprises a repetitive cycle, and the each cycle comprises an epitaxial deposition step and an annealing step following the epitaxial deposition step. In some embodiments, the method further incudes forming a floating diffusion node in the first portion of the doped well, wherein the electrode is formed in the floating diffusion node. In some embodiments, the method further incudes after forming the electrode, removing the dielectric material in the trench from the back side of the semiconductor substrate to expose the sealing layer; after removing the dielectric material, forming a high-k dielectric liner lining a sidewall of the trench from the back side of the semiconductor substrate; after forming the high-k dielectric liner, forming a dielectric filler in the trench from the back side of the semiconductor substrate to form a deep trench isolation structure. In some embodiments, the method further incudes forming a plurality of micro-lenses over the back side of the semiconductor substrate.

In some embodiments, a method includes forming a doped well vertically extending from a front side of a substrate into the substrate and surrounding a pixel region of an image sensor; forming a trench vertically extending form the front side of the substrate through the doped well toward a back side of the substrate; forming a dielectric structure in the trench from the front side of the substrate; performing a selective epitaxial growth process to form a epitaxial silicon layer in the trench and over a front side of the dielectric structure, wherein the selective epitaxial growth process comprises a repetitive cycle, and the each cycle comprises an epitaxial deposition step and an annealing step following the epitaxial deposition step; forming a dielectric layer in the trench and over a front side of the epitaxial silicon layer; forming a polysilicon layer in the trench and over a front side of the dielectric layer; replacing the dielectric structure with a deep trench isolation structure from the back side of the substrate. In some embodiments, the epitaxial deposition step in the selective epitaxial growth process is performed at a temperature in a range from about 600 to 900° C. In some embodiments, forming the dielectric structure includes depositing an dielectric material over the front side of the semiconductor substrate and in the trench; recessing the dielectric material, such that the recessed dielectric material has a top surface lower than the front side of the semiconductor substrate. In some embodiments, from a top view, the deep trench isolation structure has a grid pattern that has a grid line, and from a cross-sectional view taken along a direction intersecting with a lengthwise direction of the grid line, the epitaxial silicon layer has a flat back-side surface. In some embodiments, from a top view, the deep trench isolation structure has a grid pattern that has a grid line, and from a cross-sectional view taken along a lengthwise direction of the grid line, the epitaxial silicon layer has a convex back-side surface. In some embodiments, the step of replacing the dielectric structure with the deep trench isolation structure comprises: thinning down the substrate to expose the dielectric structure from the back side of the substrate; removing the dielectric structure in the trench from the back side of the substrate; forming the deep trench isolation structure in the trench.

In some embodiments, an image sensor includes a first conductivity type doped region, a second conductivity type doped well, a deep trench isolation structure, an epitaxial sealing layer, and a polysilicon layer. The first conductivity type doped region is in a pixel region of a substrate. The second conductivity type doped well vertically extending from a front side of the substrate into the first conductivity type doped region, wherein from a top view, the second conductivity type doped well laterally surrounds the pixel region. The deep trench isolation structure is in the substrate and laterally surrounds the pixel region, wherein a footprint of the deep trench isolation structure is within a footprint of the second conductivity type doped well. The epitaxial sealing layer is over a front side of the deep trench isolation structure and in the second conductivity type doped well. The polysilicon layer is over a front side of the epitaxial sealing layer and embedded in the second conductivity type doped well. In some embodiments, the epitaxial sealing layer has a flat back side surface. In some embodiments, the epitaxial sealing layer has a thickness in a range from about 20 to 100 nm. In some embodiments, the deep trench isolation structure has a flat front side surface. In some embodiments, the deep trench isolation structure has a vertical sidewall wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a doped region in a semiconductor substrate, wherein the doped region is of a first conductivity type;

forming a doped well vertically extending from a front side of the semiconductor substrate into the doped region, wherein the doped well is of a second conductivity type opposite to the first conductivity type;

forming a transfer gate over the front side of the semiconductor substrate and laterally between a first portion of the doped well and a second portion of the doped well;

forming a trench vertically extending form the front side of the semiconductor substrate through the doped well toward a back side of the semiconductor substrate;

depositing an dielectric material over the front side of the semiconductor substrate and in the trench;

recessing the dielectric material, such that the recessed dielectric material has a top surface lower than the front side of the semiconductor substrate;

performing a selective epitaxial growth process to form a sealing layer in the trench and over the recessed dielectric material from the front side of the semiconductor substrate; and forming an electrode in the trench and over the sealing layer from the front side of the semiconductor substrate.

2. The method of claim 1, wherein the step of recessing the dielectric material comprises:

performing a planarization process to remove the dielectric material located outside the trench; and after performing the planarization process, performing a dry etching process to recess the dielectric material.

3. The method of claim 2, wherein the dry etching process comprises an etchant including $C_4F_8$.

4. The method of claim 2, wherein the dry etching process is performed such that the recessed dielectric material has a sharp protrusion on a top thereof.

5. The method of claim 2, further comprising:

after performing the dry etching process, performing a pre-clean process on the recessed dielectric material to scale down the sharp protrusion.

6. The method of claim 5, wherein the pre-clean process comprises an etchant including HF and $NH_3$.

7. The method of claim 1, wherein the selective epitaxial growth process comprises a repetitive cycle, and the each cycle comprises an epitaxial deposition step and an annealing step following the epitaxial deposition step.

8. The method of claim 1, further comprising:

forming a floating diffusion node in the first portion of the doped well, wherein the electrode is formed in the floating diffusion node.

9. The method of claim 1, further comprising:

after forming the electrode, removing the dielectric material in the trench from the back side of the semiconductor substrate to expose the sealing layer;

after removing the dielectric material, forming a high-k dielectric liner lining a sidewall of the trench from the back side of the semiconductor substrate; and after forming the high-k dielectric liner, forming a dielectric filler in the trench from the back side of the semiconductor substrate to form a deep trench isolation structure.

10. The method of claim 1, further comprising:

forming a plurality of micro-lenses over the back side of the semiconductor substrate.

11. A method, comprising:

forming a doped well vertically extending from a front side of a substrate into the substrate and surrounding a pixel region of an image sensor;

forming a trench vertically extending form the front side of the substrate through the doped well toward a back side of the substrate;

forming a dielectric structure in the trench from the front side of the substrate;

performing a selective epitaxial growth process to form a epitaxial silicon layer in the trench and over a front side of the dielectric structure, wherein the selective epitaxial growth process comprises a repetitive cycle, and the each cycle comprises an epitaxial deposition step and an annealing step following the epitaxial deposition step;

forming a dielectric layer in the trench and over a front side of the epitaxial silicon layer;

forming a polysilicon layer in the trench and over a front side of the dielectric layer; and replacing the dielectric structure with a deep trench isolation structure from the back side of the substrate.

12. The method of claim 11, wherein the epitaxial deposition step in the selective epitaxial growth process is performed at a temperature in a range from about 600 to 900° C.

13. The method of claim 11, wherein forming the dielectric structure comprises:

depositing an dielectric material over the front side of the semiconductor substrate and in the trench; and recessing the dielectric material, such that the recessed dielectric material has a top surface lower than the front side of the semiconductor substrate.

14. The method of claim 11, wherein from a top view, the deep trench isolation structure has a grid pattern that has a grid line, and from a cross-sectional view taken along a direction intersecting with a lengthwise direction of the grid line, the epitaxial silicon layer has a flat back-side surface.

15. The method of claim 11, wherein from a top view, the deep trench isolation structure has a grid pattern that has a grid line, and from a cross-sectional view taken along a lengthwise direction of the grid line, the epitaxial silicon layer has a convex back-side surface.

16. The method of claim 11, wherein the step of replacing the dielectric structure with the deep trench isolation structure comprises:

thinning down the substrate to expose the dielectric structure from the back side of the substrate;

removing the dielectric structure in the trench from the back side of the substrate; and forming the deep trench isolation structure in the trench.

17. An image sensor, comprising:

a first conductivity type doped region in a pixel region of a substrate;

a second conductivity type doped well vertically extending from a front side of the substrate into the first conductivity type doped region, wherein from a top view, the second conductivity type doped well laterally surrounds the pixel region;

a deep trench isolation structure in the substrate and laterally surrounding the pixel region, wherein a footprint of the deep trench isolation structure is within a footprint of the second conductivity type doped well;

an epitaxial sealing layer over a front side of the deep trench isolation structure and in the second conductivity type doped well; and a polysilicon layer over a front side of the epitaxial sealing layer and embedded in the second conductivity type doped well.

18. The image sensor of claim 17, wherein the epitaxial sealing layer has a flat back side surface.

19. The image sensor of claim 17, wherein the deep trench isolation structure has a flat front side surface.

20. The image sensor of claim 17, wherein the deep trench isolation structure has a vertical sidewall wall.

* * * * *